(12) United States Patent
Kanei et al.

(10) Patent No.: US 11,502,264 B2
(45) Date of Patent: Nov. 15, 2022

(54) PHOTOELECTRIC CONVERSION ELEMENT AND PHOTOELECTRIC CONVERSION MODULE

(71) Applicant: Ricoh Company, Ltd., Tokyo (JP)

(72) Inventors: Naomichi Kanei, Shizuoka (JP); Nozomu Tamoto, Shizuoka (JP); Yuuji Tanaka, Shizuoka (JP); Tamotsu Horiuchi, Kyoto (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/184,695

(22) Filed: Feb. 25, 2021

(65) Prior Publication Data
US 2021/0280809 A1 Sep. 9, 2021

(30) Foreign Application Priority Data

Feb. 27, 2020 (JP) .............................. JP2020-031671
Oct. 27, 2020 (JP) .............................. JP2020-179311

(51) Int. Cl.
*H01L 51/42* (2006.01)
*H01L 51/44* (2006.01)

(52) U.S. Cl.
CPC ........ *H01L 51/4273* (2013.01); *H01L 51/442* (2013.01)

(58) Field of Classification Search
CPC ..... H01L 27/301; H01L 31/05; H01L 31/042; H01L 51/4273; H01G 9/2081
See application file for complete search history.

(56) References Cited

U.S. PATENT DOCUMENTS

| 10,727,001 | B2 | 7/2020 | Kanei et al. |
| 2017/0162810 | A1* | 6/2017 | Aoki ................... H01L 51/442 |
| 2017/0243698 | A1 | 8/2017 | Kanei et al. |
| 2019/0305168 | A1* | 10/2019 | Honda ................. H01L 31/06 |
| 2020/0066458 | A1* | 2/2020 | Matsuyama ......... H01G 9/2027 |

(Continued)

FOREIGN PATENT DOCUMENTS

| EP | 3 599 642 A1 | 1/2020 |
| JP | 2018-098223 | 6/2018 |

(Continued)

OTHER PUBLICATIONS

Extended European Search Report dated Jun. 28, 2021 in European Patent Application No. 21159275.3, 8 pages.

*Primary Examiner* — Devina Pillay
(74) *Attorney, Agent, or Firm* — Xsensus LLP

(57) ABSTRACT

A photoelectric conversion element including: a first electrode; a hole blocking layer; a photoelectric conversion layer; a second electrode; a third electrode; a photoelectric conversion part in which the first electrode, the hole blocking layer, the photoelectric conversion layer, and the second electrode are stacked; an electrode contact part in which the second electrode is in contact with the third electrode; and a division part dividing the photoelectric conversion part and the electrode contact part, wherein an area (S1) where the second electrode is in contact with the third electrode in the electrode contact part and an area (S2) of the photoelectric conversion part satisfy expression (1) below: $1.0 \times 10^{-5} \leq 100 \times (S1/S2)$ . . . expression (1).

11 Claims, 18 Drawing Sheets

(56) References Cited

U.S. PATENT DOCUMENTS

| | | | |
|---|---|---|---|
| 2020/0273630 A1 | 8/2020 | Tanaka et al. | |
| 2020/0303133 A1 | 9/2020 | Kanei et al. | |
| 2021/0265517 A1* | 8/2021 | Lifka | ...................... H01L 31/18 |

FOREIGN PATENT DOCUMENTS

| | | | |
|---|---|---|---|
| JP | 2018-098226 | 6/2018 | |
| JP | 2019-176136 | 10/2019 | |
| JP | 2020-102602 | 7/2020 | |
| WO | WO-2018105431 A1 * | 6/2018 | ........... H01G 9/2027 |

* cited by examiner

PHOTOELECTRIC CONVERSION ELEMENT AND PHOTOELECTRIC CONVERSION MODULE

CROSS-REFERENCE TO RELATED APPLICATIONS

The present application claims priority under 35 U.S.C. § 119 to Japanese Patent Application No. 2020-031671 filed Feb. 27, 2020 and Japanese Patent Application No. 2020-179311 filed Oct. 27, 2020. The contents of which are incorporated herein by reference in their entirety.

BACKGROUND OF THE INVENTION

Field of the Invention

The present disclosure relates to a photoelectric conversion element and a photoelectric conversion module.

Description of the Related Art

In recent years, driving power required in an electronic circuit has become very small, and it has become possible to drive various electronic components such as sensors even with a weak power ($\mu W$ order). Moreover, when a sensor is used, it has been expected to be applied to environmental power generation elements as a self-supporting power supply that can generate electricity and can consume the electricity on the spot. Among them, solar cells, which are a kind of photoelectric conversion element, have attracted much interest as an element that can generate electricity anywhere even with a weak light so long as there is light.

In order to provide a photoelectric conversion element that does not decrease photoelectric conversion characteristics and can extract an output having a low electric resistance, for example, the following photoelectric conversion element has been proposed. Specifically, the photoelectric conversion element includes: a first substrate; a first transparent electrode disposed on the first substrate; a hole blocking layer disposed on the first transparent electrode; an electron-transporting layer that is disposed on the hole blocking layer and includes an electron-transporting semiconductor including a photosensitization compound adsorbed on a surface thereof; a hole-transporting layer that is coupled to the electron-transporting layer and includes a hole-transporting material; and a second electrode disposed on the hole-transporting layer, wherein an output extraction terminal part configured to extract power is formed outside the photoelectric conversion element, and the output extraction terminal part is formed of a plurality of micropores penetrating the hole blocking layer (see, for example, Japanese Unexamined Patent Application Publication No. 2018-98226).

In order to provide a photoelectric conversion element that has a good photoelectric conversion property even under light of a low illuminance and is excellent in stability over time, the following photoelectric conversion element has been proposed. Specifically, the photoelectric conversion element includes: a first electrode; an electron-transporting layer including a photosensitization compound; a hole-transporting layer; and a second electrode, wherein the hole-transporting layer includes a p-type semiconductor material and a basic compound, an ionization potential of the hole-transporting layer exceeds an ionization potential of the p-type semiconductor material, and is less than 1.07 times as low as the ionization potential of the p-type semiconductor material, an ionization potential of the photosensitization compound exceeds the ionization potential of the hole-transporting layer, and an acid dissociation constant (pKa) of the basic compound is 6 or more but 10 or less (see, for example, Japanese Unexamined Patent Application Publication No. 2019-176136).

SUMMARY OF THE INVENTION

According to one aspect of the present disclosure, a photoelectric conversion element includes: a first electrode; a hole blocking layer; a photoelectric conversion layer; a second electrode; a third electrode; a photoelectric conversion part in which the first electrode, the hole blocking layer, the photoelectric conversion layer, and the second electrode are stacked; an electrode contact part in which the second electrode is in contact with the third electrode; and a division part dividing the photoelectric conversion part and the electrode contact part. An area (S1) where the second electrode is in contact with the third electrode in the electrode contact part and an area (S2) of the photoelectric conversion part satisfy expression (1) below: $1.0 \times 10^{-5}$ 100× (S1/S2) ... expression (1).

Figure 1A:
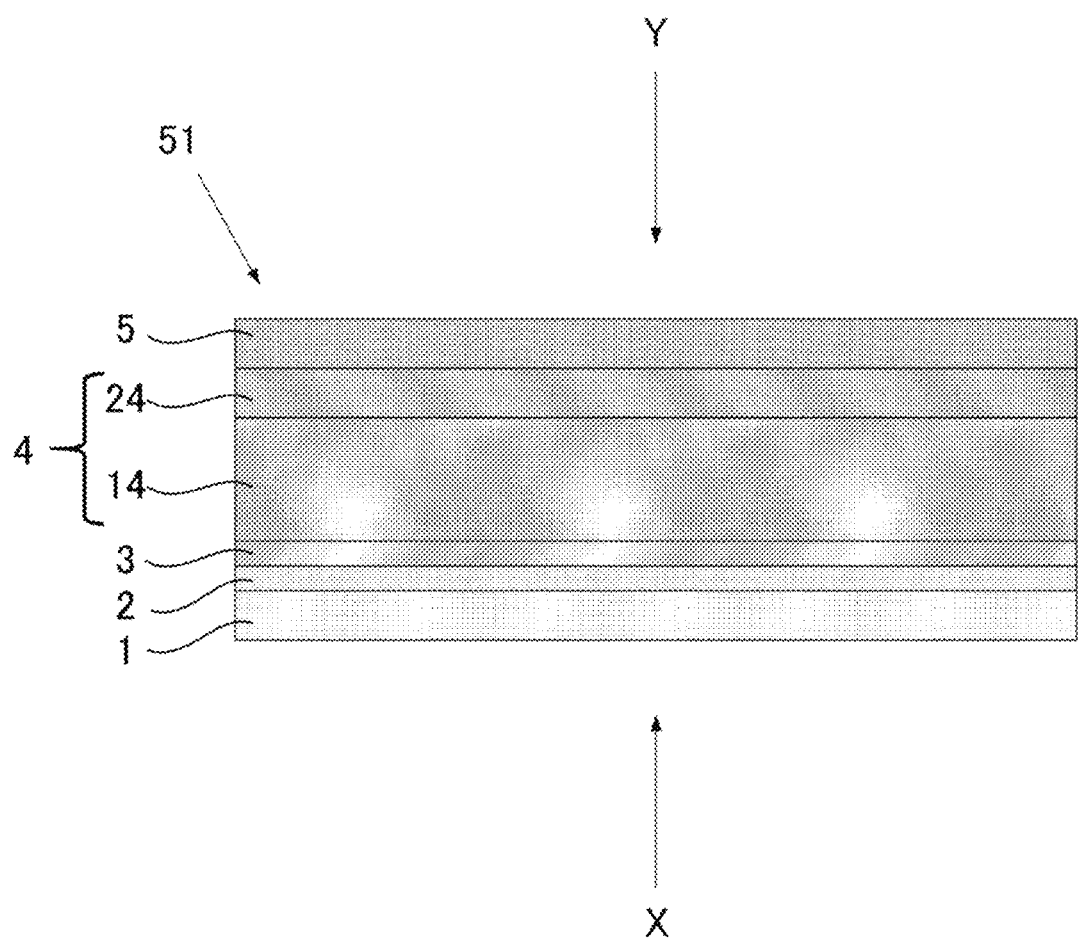
FIG. 1A is a view for explaining one example of a photoelectric conversion element (part 1)

DETAILED DESCRIPTION OF THE INVENTION (Photoelectric Conversion Element)

A photoelectric conversion element of the present disclosure includes at least a first electrode, a hole blocking layer, a photoelectric conversion layer, a second electrode, and a third electrode, and further includes other members such as a substrate if necessary.

An object of the present disclosure is to provide a photoelectric conversion element having an excellent linearity of an output from a low illuminance to a high illuminance.

According to the present disclosure, it is possible to provide a photoelectric conversion element having an excellent linearity of an output from a low illuminance to a high illuminance.

The photoelectric conversion element includes a photoelectric conversion part, an electrode contact part, and a division part.

The photoelectric conversion part is formed by stacking the first electrode, the hole blocking layer, the photoelectric conversion layer, and the second electrode.

In the electrode contact part, the second electrode is in contact with the third electrode.

The division part divides the photoelectric conversion part and the electrode contact part. The division part prevents leakage and short circuit of electric current generated in the photoelectric conversion part, in the electrode contact part.

The photoelectric conversion part is a place where photoelectric conversion effectively works.

The electrode contact part is, for example, a place where electric energy generated in the photoelectric conversion part is taken out outside an element or a place where electric current is taken in inside to the element. Therefore, where the photoelectric conversion element is a solar cell, the third electrode can be an electrode for taking out electric current and the electrode contact part can be a part for taking out the electric current.

In the entire surface of the electrode contact part, the second electrode and the third electrode need not to be in contact with each other.

In the photoelectric conversion element, an area (S1) where the second electrode and the third electrode are in contact with each other in the electrode contact part and an area (S2) of the photoelectric conversion part satisfy the following expression.

$$1.0\times10^{-5}\leq 100\times(S1/S2) \qquad \text{expression (1).}$$

As a result, it is possible to obtain a photoelectric conversion element that has linearity of an output from a low illuminance to a high illuminance. More preferably, the following expression (1-1) is satisfied.

$$1.0 \times 10^{-4} \leq 100 \times (S1/S2)$$ expression (1-1).

When the 100×(S1/S2) is less than $1.0 \times 10^{-5}$, linearity of an output from a low illuminance to a high illuminance is decreased. Particularly, extraction electric current is decreased due to an increase in series resistance Rs. This is significantly found at a high illuminance side.

Here, the low illuminance refers to 200 lux, and the high illuminance refers to 20,000 lux.

When the area (S1) is much larger than the area (S2), an output per a unit area relative to an external shape of the photoelectric conversion element is decreased. In this respect, the area (S1) and the area (S2) preferably satisfy the following expression (1-2).

$$1.0 \times 10^{-5} \leq 100 \times (S1/S2) \leq 10.0$$ expression (1-2)

The following expression (1-3) is more preferably satisfied, and the following expression (1-4) is still more preferably satisfied.

$$1.0 \times 10^{-5} \leq 100 \times (S1/S2) \leq 3.0$$ expression (1-3)

$$1.0 \times 10^{-5} \leq 100 \times (S1/S2) \leq 1.0$$ expression (1-4)

Preferably, in the photoelectric conversion element, the photoelectric conversion layer extends in the electrode contact part via the division part, and the second electrode penetrates the photoelectric conversion layer extending in the electrode contact part to be in contact with the third electrode in the electrode contact part because leakage current and a short circuit risk can be decreased. When electrodes are in contact with each other in an unexpected place, short circuit occurs. Therefore, the electrodes are preferably provided via a semiconductor layer or an insulating layer in a place other than the necessary place to prevent electrical short circuit. In addition, it is useful to physically lengthen a distance between the electrodes in order to decrease a probability that the electrodes are in contact with each other when stress (e.g., pushing and bending) is applied to the photoelectric conversion element.

The photoelectric conversion layer includes, for example, an electron-transporting layer and a hole-transporting layer.

A width from an edge of a side of the photoelectric conversion part through an edge of a side of the electrode contact part in the division part is preferably 100 times or more as large as an average thickness of the electron-transporting layer. As a result, a function of the division part that electric current generated in the photoelectric conversion part is prevented from being leaked in the electrode contact part can be further enhanced. The upper limit is not particularly limited and may be appropriately selected depending on the intended purpose. When the division part is larger, an output per a unit area relative to an external shape of the photoelectric conversion element is decreased. In this respect, a width from an edge of a side of the photoelectric conversion part through an edge of a side of the electrode contact part in the division part is preferably 1,000 times or less as large as an average thickness of the electron-transporting layer, more preferably 500 times or less as large as an average thickness of the electron-transporting layer, still more preferably 300 times or less as large as an average thickness of the electron-transporting layer.

Hereinafter, the embodiments of the photoelectric conversion elements will be described with reference to drawings.

One example of a photoelectric conversion element will be described with reference to FIG. 1A to FIG. 1E.

FIG. 1A is a cross-sectional view of a photoelectric conversion element. The cross-sectional view is a cross-sectional view of a photoelectric conversion part 51 of the photoelectric conversion element. Therefore, FIG. 1A illustrates neither an electrode contact part nor a division part.

The photoelectric conversion part 51 of the photoelectric conversion element includes a substrate 1, a first electrode 2, a hole blocking layer 3, a photoelectric conversion layer 4, and a second electrode 5 in this order.

The photoelectric conversion layer 4 includes an electron-transporting layer 14 and a hole-transporting layer 24.

Figure 1B:
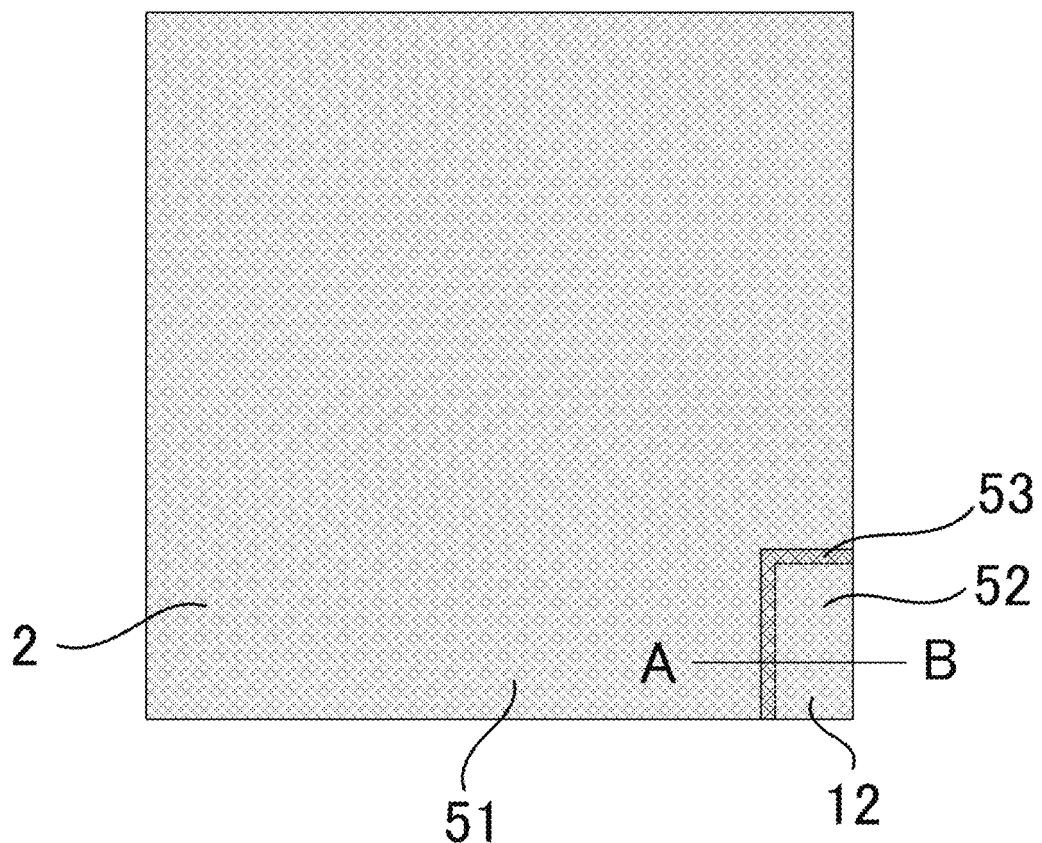
FIG. 1B is a view for explaining one example of a photoelectric conversion element (part 2)

FIG. 1B is a view of the entire photoelectric conversion element of FIG. 1A as seen from the X direction. Here, in FIG. 1B, the substrate 1 is omitted in order to easily explain a photoelectric conversion part, an electrode contact part, and a division part. As presented in FIG. 1B, the photoelectric conversion element includes the photoelectric conversion part 51 that occupies a large area, an electrode contact part 52 formed at an edge part of the photoelectric conversion element, and a division part 53 that divides the photoelectric conversion part 51 and the electrode contact part 52. In the photoelectric conversion part 51, the first electrode 2 is provided. In the electrode contact part 52, a third electrode 12 is provided. The first electrode 2 and the third electrode 12 are provided in the same plane surface. The division part 53 is provided so that the first electrode 2 and the third electrode 12 are not in contact with each other.

Figure 1C:
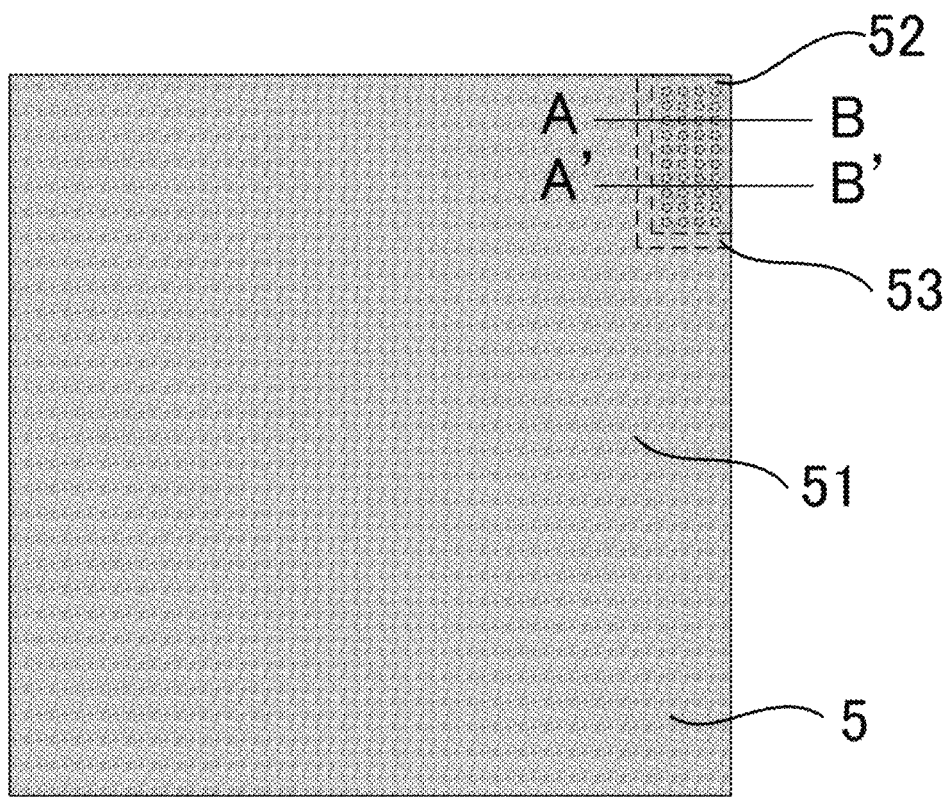
FIG. 1C is a view for explaining one example of a photoelectric conversion element (part 3)

FIG. 1C is a view in which the photoelectric conversion element of FIG. 1B is flipped over in the vertical direction. The photoelectric conversion element includes the second electrode 5 that extends over the photoelectric conversion part 51, the division part 53, and the electrode contact part 52. In the division part 53, the second electrode 5 is recessed inside. In the electrode contact part 52, in a part where the second electrode 5 is in contact with the third electrode 12, the second electrode 5 is recessed inside.

Figure 1D:
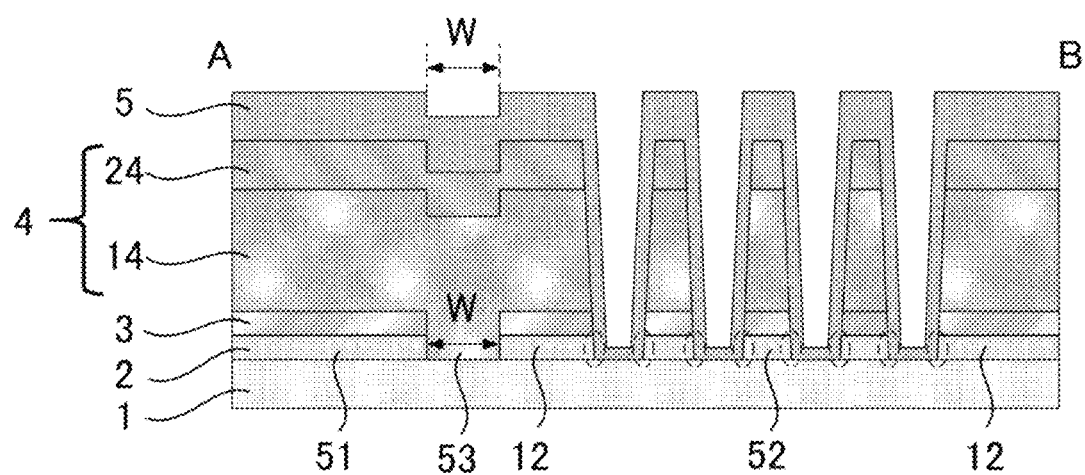
FIG. 1D is a view for explaining one example of a photoelectric conversion element (part 4)

FIG. 1D presents a cross section taken along the A-B line of FIG. 1B and FIG. 1C.

In the electrode contact part 52, the second electrode 5 is in contact with the third electrode 12.

The photoelectric conversion layer 4 extends in the electrode contact part 52 through the division part 53. In the electrode contact part 52, the second electrode 5 penetrates the photoelectric conversion layer 4 extending in the electrode contact part 52, to be in contact with the third electrode 12.

The A-B line is a line that passes across through holes.

One example of a total thickness of the first electrode 2 or the third electrode 12, the hole blocking layer 3, the photoelectric conversion layer 4, and the second electrode 5 is from 1 μm through 3 μm. Meanwhile, one example of a diameter of the through hole is from 5 μm through 85 μm.

In FIG. 1D, the second electrode 5 of the electrode contact part 52 is in contact with the substrate 1 via a plurality of through holes. A total area (S11) of the through holes, which are formed in order to contact the second electrode 5 with the third electrode 12 and to penetrate the photoelectric conversion layer in the electrode contact part 52, is not particularly limited and may be appropriately selected depending on the intended purpose. However, the following expression (2) is preferably satisfied in order to achieve linearity of an output from a low illuminance to a high illuminance, and an output per a unit area relative to an external shape of the photoelectric conversion element. The following expression (2-1) is more preferably satisfied, and the following expression (2-2) is still more preferably satisfied.

$$1.0\times10^{-3} \leq 100\times(S11/S2) \leq 10.0 \quad \text{expression (2)}$$

$$1.0\times10^{-3} \leq 100\times(S11/S2) \leq 5.0 \quad \text{expression (2-1)}$$

$$1.0\times10^{-3} \leq 100\times(S11/S2) \leq 3.0 \quad \text{expression (2-2)}$$

A width (W) from an edge of a side of the photoelectric conversion part 51 through an edge of a side of the electrode contact part 52 in the division part 53 is, for example, 100 times or more as large as an average thickness of the electron-transporting layer 14.

Here, an area (S1) where the second electrode 5 is in contact with the third electrode 12 in the electrode contact part 52 is a total contact area of portions where the second electrode 5 and the third electrode 12 are directly in contact with each other, and the area (S1) is a total contact area of the contact portions enclosed with an ellipse of a dashed line in FIG. 1D. The contact area can be determined through a calculation from, for example, a thickness of the third electrode 12 and a diameter of the through hole.

Note that, the area (S1) does not include a contact portion that does not contribute to transfer of electric current from the outside to the inside or from the inside to the outside. For example, in an embodiment of the electrode contact part 52 of FIG. 3 that will be described hereinafter, in rhombus portions surrounded by individual through holes in a through hole 13 obtained by integrating a plurality of through holes, the second electrode 5 and the third electrode 12 may be in contact with each other. However, such a place does not contribute to transfer of electric current from the outside to the inside or from the inside to the outside. Therefore, even when the second electrode 5 and the third electrode 12 are in contact with each other in the rhombus portion, its contact area is not included in the area (S1).

Figure 1E:
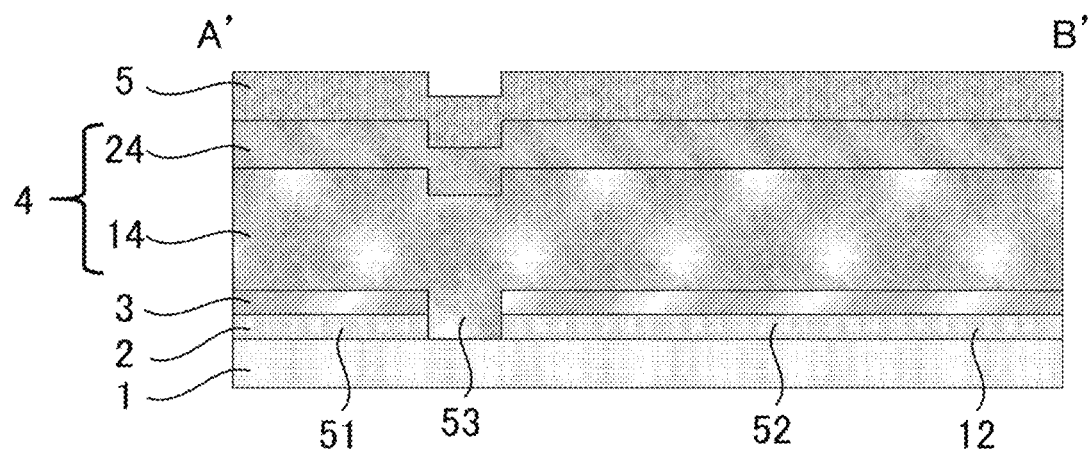
FIG. 1E is a view for explaining one example of a photoelectric conversion element (part 5)

FIG. 1E presents a cross section taken along the A'-B' line of FIG. 1C. The A'-B' line is a line that does not pass across through holes.

It can be confirmed that the photoelectric conversion layer 4 of the photoelectric conversion part 51 extends via the division part 53 in portions other than the through holes in the electrode contact part 52.

In FIG. 1D, the second electrode 5 of the electrode contact part 52 is in contact with the substrate 1 via the through hole. However, the second electrode 5 of the electrode contact part 52 is in contact with the third electrode 12, but may not be in contact with the substrate 1 as presented in FIG. 2.

Figure 2:
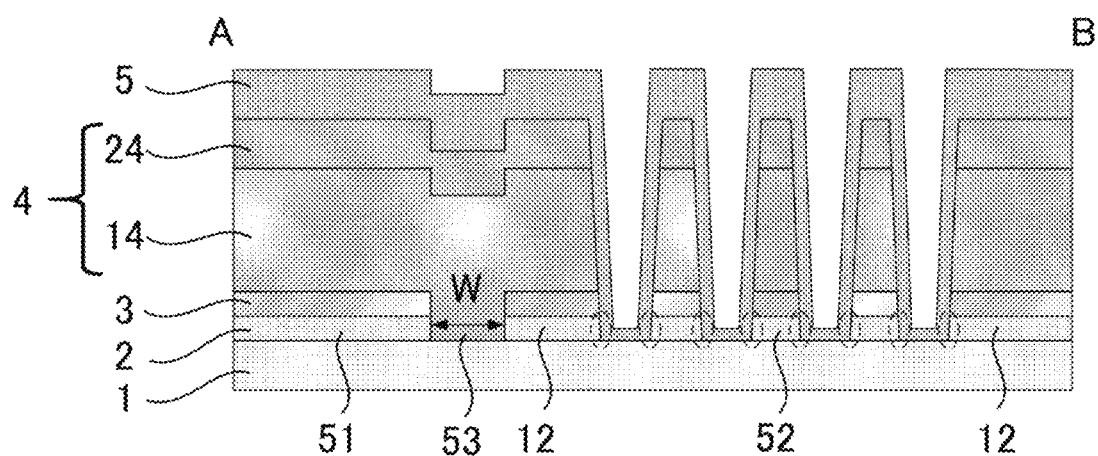
FIG. 2 is a view for explaining another example of a photoelectric conversion element.

Here, an area (S1) where the second electrode 5 is in contact with the third electrode 12 in the electrode contact part 52 is a total contact area of portions where the second electrode 5 and the third electrode 12 are directly in contact with each other, and the area (S1) is a total contact area of the contact portions enclosed with an ellipse of a dashed line in FIG. 2. The contact area can be determined through a calculation from, for example, a diameter of the through hole.

Regarding an area (S2) of the photoelectric conversion part, for example, an area of the second electrode 5 in the photoelectric conversion part 51 can be regarded as the area (S2).

Figure 3:
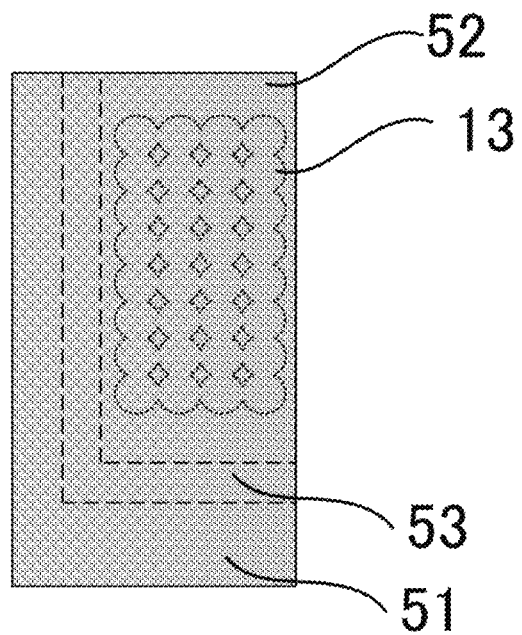
FIG. 3 is a view of one example of through holes in an electrode contact part.

In FIG. 1D, the second electrode 5 of the electrode contact part 52 is in contact with the third electrode 12 via a plurality of independent through holes. However, the through hole that penetrates the hole blocking layer 3 and the photoelectric conversion layer 4 in the electrode contact part 52 does not need to be the plurality of independent through holes, and may be, for example, the through hole 13 obtained by integrating a plurality of through holes as presented in FIG. 3. FIG. 3 is an enlarged view of one example of the electrode contact part 52 obtained when the photoelectric conversion element is seen from a side of the second electrode 5. The second electrode 5 enters the through hole 13 obtained by integrating a plurality of through holes, and a recess contouring the through hole 13 is formed.

A shape of the through hole 13 is not particularly limited and may be appropriately selected from, for example, a cubic shape, a cylindrical shape, a quadrangular pyramid, and a mortar shape. The shape of the through hole 13 preferably has a mortar shape. When the shape of the through hole 13 has a mortar shape, a film of the second electrode having a stable film thickness can be produced along with an inclined plane.

Figure 4:
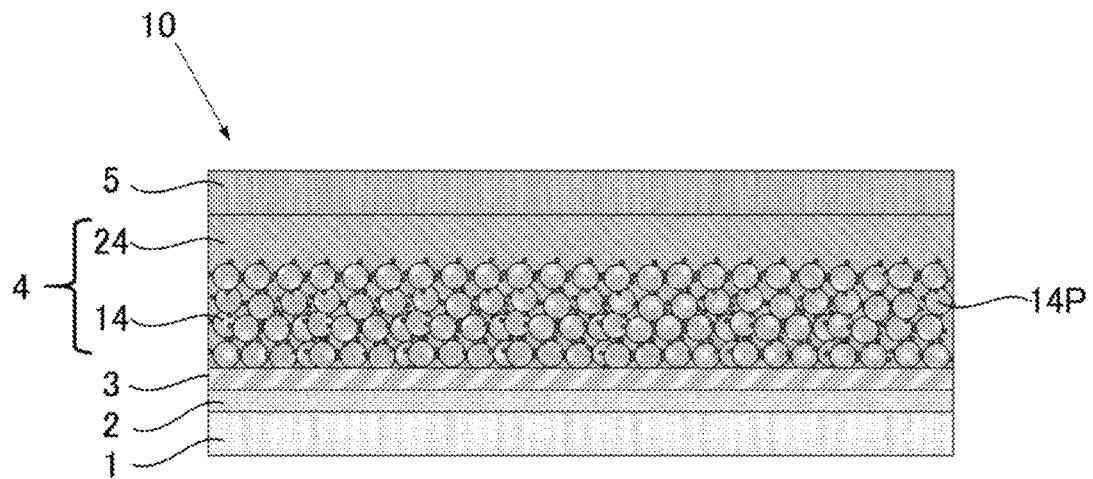
FIG. 4 is a cross-sectional view of another example of a photoelectric conversion element.

FIG. 4 is a cross-sectional view of another example of a photoelectric conversion element.

A photoelectric conversion element 10 of FIG. 4 is an example where the electron-transporting layer 14 is formed of an electron-transporting semiconductor particle 14P including a photosensitization compound adsorbed on its surface in the photoelectric conversion element 10 of FIG. 1A. In this case, the hole-transporting material constituting the hole-transporting layer 24 exists between electron-transporting semiconductor particles 14P in the electron transporting layer 14.

<Substrate>

A shape, structure, and size of the substrate are not particularly limited and may be appropriately selected depending on the intended purpose.

A material of the substrate is preferably a material having transparency and an insulation property. Examples of the material include substrates such as glass, plastic plates, plastic films, plastic membranes, ceramics, and inorganic transparent crystal substances. Among them, a material having heat resistance against a firing temperature is preferable when the firing step is performed to form the electron-transporting layer. Moreover, the substrate is preferably a substrate having flexibility.

An average thickness of the substrate is not particularly limited and may be appropriately selected depending on the intended purpose. The average thickness of the substrate is, for example, 50 μm or more but 5 mm or less.

<First Electrode>

A shape and size of the first electrode are not particularly limited and may be appropriately selected depending on the intended purpose.

A structure of the first electrode is not particularly limited and may be appropriately selected depending on the intended purpose. The structure of the first electrode may be a single layer structure or may be a structure where a plurality of materials are stacked.

A material of the first electrode is not particularly limited and may be appropriately selected depending on the intended purpose, so long as it has conductivity. Examples of the material include transparent conductive metal oxides, carbon, and metals.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminum-doped zinc oxide (referred to as "AZO" hereinafter), indium-zinc oxide, and niobium-titanium oxide.

Examples of the carbon include carbon black, carbon nanotube, graphene, and fullerene.

Examples of the metal include gold, silver, aluminum, nickel, indium, tantalum, and titanium.

These may be used alone or in combination. Among them, a transparent conductive metal oxide having high transparency is preferable, and ITO, FTO, ATO, and NTO are more preferable.

An average thickness of the first electrode is not particularly limited and may be appropriately selected depending on the intended purpose. The average thickness of the first electrode is preferably 5 nm or more but 100 μm or less, more preferably 50 nm or more but 10 μm or less. When a material of the first electrode is carbon or a metal, the average thickness of the first electrode is preferably an enough average thickness to obtain translucency.

The first electrode can be formed by known methods such as the sputtering method, the vapor deposition method, and the spraying method.

The first electrode is preferably formed on the substrate. An integrated commercially available product where the first electrode is formed on the substrate in advance can be used.

Examples of the integrated commercially available product include FTO-coated glass, ITO-coated glass, zinc oxide, aluminum-coated glass, FTO-coated transparent plastic films, and ITO-coated transparent plastic films. Examples of other integrated commercially available products include: a glass substrate provided with a transparent electrode where tin oxide or indium oxide is doped with a cation or an anion having a different atomic value; and a glass substrate provided with a metal electrode having such a structure that allows light in the form of a mesh or stripes to pass.

These may be used alone, or two or more products may be used in combination as a mixed product or a laminate. Moreover, a metal lead wire may be used in combination in order to decrease an electric resistance value.

In order to produce a photoelectric conversion module that will be described hereinafter, an electrode of an integrated commercially available product may be appropriately processed to produce a substrate on which a plurality of first electrodes are formed.

A material of the metal lead wire is, for example, aluminum, copper, silver, gold, platinum, and nickel.

The metal lead wire can be used in combination by forming it on the substrate through, for example, vapor deposition, sputtering, or pressure bonding, and disposing a layer of ITO or FTO thereon or disposing it on ITO or FTO.

<Hole Blocking Layer>

In order to prevent a decrease in electric power, which is caused when an electrolyte contacts an electrode to recombine holes in the electrolyte and electrons on the surface of the electrode (i.e., reverse electron transfer), the hole blocking layer is provided. An effect of the hole blocking layer is particularly significant in a solid-dye-sensitization-type solar cell. The reason for this is attributed to the fact that the solid-dye-sensitization-type solar cell containing, for example, an organic hole-transporting material has a rapider rate of recombination (reverse electron transfer) of holes in the hole-transporting material and electrons on the surface of the electrode compared to a wet-dye-sensitization-type solar cell containing, for example, an electrolytic solution.

The hole blocking layer is disposed on, for example, the first electrode.

A material of the hole blocking layer is not particularly limited and may be appropriately selected depending on the intended purpose, so long as the material is a material that is transparent to visible light and is an electron-transporting material. Examples of the material include: simple substance semiconductors such as silicon and germanium; compound semiconductors such as chalcogenides of metal; and compounds having a perovskite structure.

Examples of the chalcogenide of metal include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium. Other examples of the compound semiconductor include: phosphides of zinc, gallium, indium, and cadmium; gallium arsenide; copper-indium-selenide; and copper-indium-sulfide.

Examples of the compound having a perovskite structure include strontium titanate, calcium titanate, sodium titanate, barium titanate, and potassium niobate.

Among them, oxide semiconductor is preferable, titanium oxide, niobium oxide, magnesium oxide, aluminum oxide, zinc oxide, tungsten oxide, and tin oxide are more preferable, and titanium oxide is still more preferable.

These may be used alone or in combination. These may be a single layer or a laminated layer. A crystal type of these semiconductors is not particularly limited and may be appropriately selected depending on the intended purpose. The crystal type may be a single crystal, polycrystalline, or amorphous.

A film formation method of the hole-blocking layer is not particularly limited and may be appropriately selected depending on the intended purpose. Examples of the method include: the wet film formation such as a sol-gel method and a hydrolysis method using titanium tetrachloride; and the dry film formation such as a sputtering method. Among them, the sputtering method is preferable. When the film formation method of the hole-blocking layer is the sputtering method, the film density can be sufficiently high and electric current loss can be prevented.

An average thickness of the hole blocking layer is not particularly limited and may be appropriately selected depending on the intended purpose. In terms of a transmittance and prevention of reverse electron transfer, the average thickness of the hole blocking layer is preferably 5 nm or more but 1,000 nm or less, more preferably 500 nm or more but 700 nm or less in the case of the wet film formation, more preferably 5 nm or more but 30 nm or less in the dry film formation.

<Photoelectric Conversion Layer>

The photoelectric conversion layer includes an electron-transporting layer and a hole-transporting layer, and further includes other members if necessary.

<<Electron-Transporting Layer>>

The electron-transporting layer includes an electron-transporting semiconductor.

The electron-transporting layer preferably includes an electron-transporting semiconductor including a photosensitization compound adsorbed on a surface thereof.

The electron-transporting layer is formed for the purpose of transporting electrons generated in the photosensitization compound to the first electrode or the hole blocking layer. Therefore, the electron-transporting layer is preferably disposed adjacent to the first electrode or the hole blocking layer.

The electron-transporting layer may be a single layer or a multilayer.

As the electron-transporting semiconductor, an electron-transporting semiconductor particle is preferably used.

In the case of a multilayer, a dispersion liquid of semiconductor particles different in particle diameters may be coated to form a multilayer, or different kinds of semiconductors or coating layers having formulation different in a resin and an additive may be coated to form a multilayer.

Note that, when a film thickness obtained after one coating is insufficient, the multilayer coating is an effective means.

Generally, as an average thickness of the electron-transporting layer increases, an amount of the born photosensitization material per a unit projected area also increases. Therefore, a light trapping rate increases, but a diffusion length of injected electrons also increases, which results in a large loss due to recombination of electric charges. Therefore, the average thickness of the electron-transporting layer is preferably 50 nm or more but 100 μM or less, more preferably 100 nm or more but 50 μm or less, still more preferably 120 nm or more but 10 μm or less.

The electron-transporting semiconductor is not particularly limited and may be appropriately selected depending on the intended purpose. Examples of the electron-transporting semiconductor include: simple substance semiconductors such as silicon and germanium; compound semiconductors such as chalcogenides of metal; and compounds having a perovskite structure. These may be used alone or in combination.

Examples of the chalcogenides of metal include: oxides of, for example, titanium, tin, zinc, iron, tungsten, zirconium, hafnium, strontium, indium, cerium, yttrium, lanthanum, vanadium, niobium, and tantalum; sulfides of, for example, cadmium, zinc, lead, silver, antimony, and bismuth; selenides of, for example, cadmium and lead; and tellurium compounds of, for example, cadmium.

Examples of the other compound semiconductors include: phosphides of zinc, gallium, indium, and cadmium; gallium arsenide; copper-indium-selenide, and copper-indium-sulfide.

Examples of the compound having a perovskite structure include strontium titanate, calcium titanate, sodium titanate, barium titanate, and potassium niobate.

Among the electron-transporting semiconductors, oxide semiconductors are preferable, and titanium oxide, zinc oxide, tin oxide, and niobium oxide are more preferable.

A crystal type of the electron-transporting semiconductor is not particularly limited and may be appropriately selected depending on the intended purpose. The crystal type may be a single crystal, polycrystalline, or amorphous.

A size of the semiconductor particle is not particularly limited and may be appropriately selected depending on the intended purpose. An average particle diameter of primary particles is preferably 1 nm or more but 100 nm or less, more preferably 5 nm or more but 50 nm or less.

Moreover, an effect of diffusing incident light obtained by mixing or laminating a semiconductor particle having a larger average particle diameter may improve efficiency. In this case, an average particle diameter of the semiconductor particle is preferably 50 nm or more but 500 nm or less.

A production method of the electron-transporting layer is not particularly limited and may be appropriately selected depending on the intended purpose. Examples of the production method include a method such as sputtering where a thin film is formed in vacuum, and a wet film formation method. Among them, in terms of production cost, it is preferable to use a wet film formation method, and it is particularly preferable to use a method where paste obtained by dispersing particles or sol of a semiconductor is prepared, and then the paste is coated onto the first electrode or onto the hole blocking layer.

When the wet film formation method is used, a coating method is not particularly limited and may be appropriately selected depending on the intended purpose. Examples of the coating method include the dipping method, the spraying method, the wire-bar coating method, the spin coating method, the roller coating method, the blade coating method, and the gravure coating method. Examples of a wet printing method include relief printing, offset printing, gravure printing, intaglio printing, rubber plate printing, and screen printing.

When the dispersion liquid of the semiconductor particle is prepared by using mechanical pulverization or a mill, at least a semiconductor particle alone or a mixture of a semiconductor particle and a resin is dispersed in water or an organic solvent to prepare the dispersion liquid.

The resin is not particularly limited and may be appropriately selected depending on the intended purpose. Examples of the resin include polymers or copolymers of vinyl compounds (e.g., styrene, vinyl acetate, acrylic acid ester, and methacrylic acid ester), silicone resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyarylate resins, polyamide resins, and polyimide resins. These may be used alone or in combination.

Examples of the solvent include water, alcohol solvents, ketone solvents, ester solvents, ether solvents, amide solvents, halogenated hydrocarbon solvents, and hydrocarbon solvents.

Examples of the alcohol solvent include methanol, ethanol, isopropyl alcohol, and α-terpineol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

To the dispersion liquid of the semiconductor particle or the paste of the semiconductor particle obtained by, for example, the sol-gel method, acid, a surfactant, or a chelating agent may be added in order to prevent re-aggregation of the particles.

Examples of the acid include hydrochloric acid, nitric acid, and acetic acid.

Examples of the surfactant include polyoxyethylene octylphenyl ether.

Examples of the chelating agent include acetyl acetone, 2-aminoethanol, and ethylene diamine.

Moreover, addition of a thickener is also an effective means for the purpose of improving film formation ability.

Examples of the thickener include polyethylene glycol, polyvinyl alcohol, and ethyl cellulose.

In order to electronically contact particles with each other after the coating to improve strength of a film and adhesiveness to a substrate, the semiconductor particle is preferably subjected to firing, irradiation of microwave, irradiation of electron rays, and irradiation of laser light. These treatments may be performed alone or in combination.

When the firing is performed, the firing temperature is not particularly limited and may be appropriately selected depending on the intended purpose. When the firing temperature is increased too much, a resistance of the substrate may be increased or melting may occur. Therefore, the firing temperature is preferably 30° C. or more but 700° C. or less, more preferably 100° C. or more but 600° C. or less. The firing time is not particularly limited and may be appropriately selected depending on the intended purpose, but is preferably 10 minutes or more but 10 hours or less.

The microwave may be emitted from a side at which the electron-transporting layer is formed, or may be emitted from the back side. The irradiation time of the microwave is not particularly limited and may be appropriately selected depending on the intended purpose. The microwave is preferably emitted for one hour or shorter.

After firing, for example, chemical plating using an aqueous solution of titanium tetrachloride or a mixed solution with an organic solvent, or electrochemical plating using an aqueous solution of titanium trichloride may be performed in order to increase a surface area of the semiconductor particle or enhance an electron injection efficiency to the semiconductor particle from the photosensitization compound.

A laminated film, which is obtained by, for example, firing the semiconductor particle having a diameter of several tens of nanometers, can form a porous state. Such a nanoporous structure has an extremely high surface area, and the surface area can be represented by using a roughness factor.

The roughness factor is a numerical value representing an actual area of the inner sides of pores relative to an area of the semiconductor particles coated onto the substrate. Therefore, the roughness factor is preferably larger. However, in terms of a relationship with a thickness of the electron-transporting layer, the roughness factor is preferably 20 or more.

<<Photosensitization Compound>>

In the present disclosure, the photosensitization compound is preferably adsorbed on the surface of the electron-transporting semiconductor of the electron-transporting layer in order to further improve the conversion efficiency.

The photosensitization compound is not particularly limited and may be appropriately selected depending on the intended purpose so long as the photosensitization compound is a compound photoexcited by excitation light to be used. Examples of the photosensitization compound include: metal complex compounds described in, for example, Japanese Translation of PCT International Application Publication No. 7-500630, Japanese Unexamined Patent Application Publication No. 10-233238, Japanese Unexamined Patent Application Publication No. 2000-26487, Japanese Unexamined Patent Application Publication No. 2000-323191, and Japanese Unexamined Patent Application Publication No. 2001-59062; coumarine compounds described in, for example, Japanese Unexamined Patent Application Publication No. 10-93118, Japanese Unexamined Patent Application Publication No. 2002-164089, Japanese Unexamined Patent Application Publication No. 2004-95450, and J. Phys. Chem. C, 7224, Vol. 111 (2007); polyene compounds described in, for example, Japanese Unexamined Patent Application Publication No. 2004-95450 and Chem. Commun., 4887 (2007); indoline compounds described in, for example, Japanese Unexamined Patent Application Publication No. 2003-264010, Japanese Unexamined Patent Application Publication No. 2004-63274, Japanese Unexamined Patent Application Publication No. 2004-115636, Japanese Unexamined Patent Application Publication No. 2004-200068, Japanese Unexamined Patent Application Publication No. 2004-235052, and J. Am. Chem. Soc., 12218, Vol. 126 (2004), Chem. Commun., 3036 (2003), Angew. Chem. Int. Ed., 1923, Vol. 47 (2008); thiophene compounds described in, for example, J. Am. Chem. Soc., 16701, Vol. 128 (2006) and J. Am. Chem. Soc., 14256, Vol. 128 (2006); cyanine dyes described in, for example, Japanese Unexamined Patent Application Publication No. 11-86916, Japanese Unexamined Patent Application Publication No. 11-214730, Japanese Unexamined Patent Application Publication No. 2000-106224, Japanese Unexamined Patent Application Publication No. 2001-76773, and Japanese Unexamined Patent Application Publication No. 2003-7359; merocyanine dyes described in, for example, Japanese Unexamined Patent Application Publication No. 11-214731, Japanese Unexamined Patent Application Publication No. 11-238905, Japanese Unexamined Patent Application Publication No. 2001-52766, Japanese Unexamined Patent Application Publication No. 2001-76775, and Japanese Unexamined Patent Application Publication No. 2003-7360; 9-arylxanthene compounds described in, for example, Japanese Unexamined Patent Application Publication No. 10-92477, Japanese Unexamined Patent Application Publication No. 11-273754, Japanese Unexamined Patent Application Publication No. 11-273755, and Japanese Unexamined Patent Application Publication No. 2003-31273; triarylmethane compounds described in, for example, Japanese Unexamined Patent Application Publication No. 10-93118 and Japanese Unexamined Patent Application Publication No. 2003-31273; and phthalocyanine compounds and porphyrin compounds described in, for example, Japanese Unexamined Patent Application Publication No. 9-199744, Japanese Unexamined Patent Application Publication No. 10-233238, Japanese Unexamined Patent Application Publication No. 11-204821, Japanese Unexamined Patent Application Publication No. 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008). Among them, metal complex compounds, coumarine compounds, polyene compounds, indoline compounds, and thiophene compounds are preferable, compounds expressed by the following Structural Formula (1), the Structural Formula (2), the following Structural Formula (3), and compounds represented by the following General Formula (3) (available from Mitsubishi Paper Mills Limited) are more preferable. These photosensitization compounds may be used alone or in combination.

Structural Formula (1)

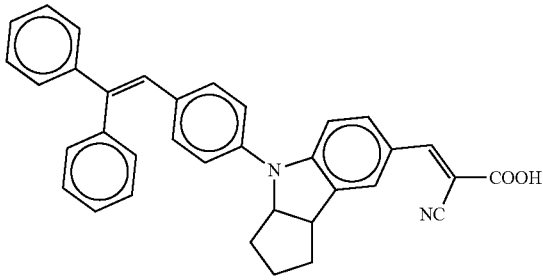

Structural Formula (2)

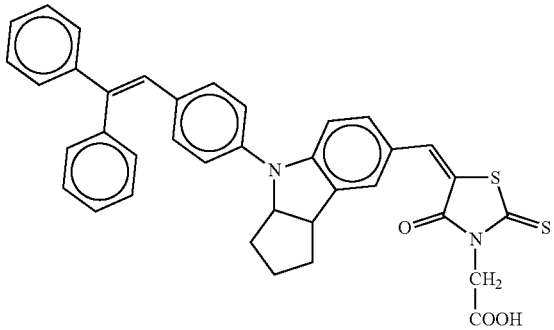

Structural Formula (3)

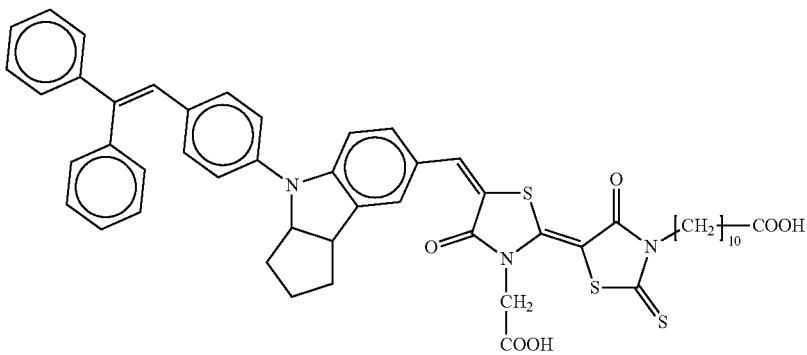

General Formula (3)

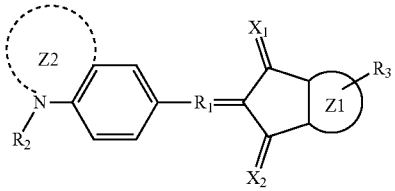

In General Formula (3), $X_1$ and $X_2$ each independently represent an oxygen atom, a sulfur atom, or a selenium atom.

$R_1$ represents a methine group that may have a substituent. Specific examples of the substituent include an aryl group (e.g., a phenyl group and a naphthyl group) and a heterocycle (e.g., a thienyl group and a furyl group).

$R_2$ represents an alkyl group that may have a substituent, an aryl group that may have a substituent, or a heterocyclic group that may have a substituent. Examples of the alkyl group include a methyl group, an ethyl group, a 2-propyl group, and a 2-ethylhexyl group. Examples of the aryl group and the heterocyclic group include the groups exemplified above.

$R_3$ represents an acid group such as carboxylic acid, sulfonic acid, phosphonic acid, boronic acid, or phenols. The number of $R_3$ may be one or more.

Z1 and Z2 each independently represent a substituent that forms a cyclic structure.

Examples of Z1 include condensed hydrocarbon-based compounds (e.g., a benzene ring and a naphthalene ring) and heterocycles (e.g., a thiophene ring and a furan ring) each of which may have a substituent. Specific examples of the substituent include the alkyl groups and the alkoxy groups (e.g., a methoxy group, an ethoxy group, and a 2-isopropoxy group) described above.

Examples of Z2 include the following (A-1) to (A-22).

(A-1)

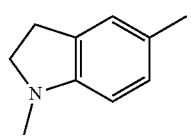

(A-2)

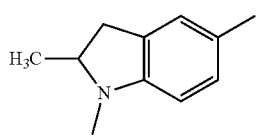

(A-3)

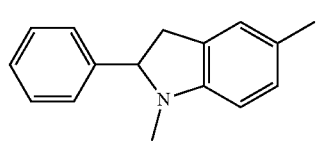

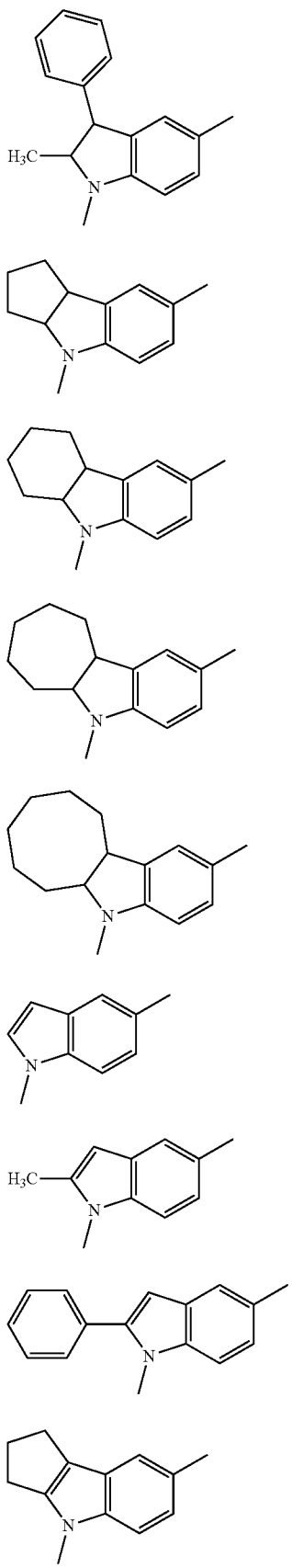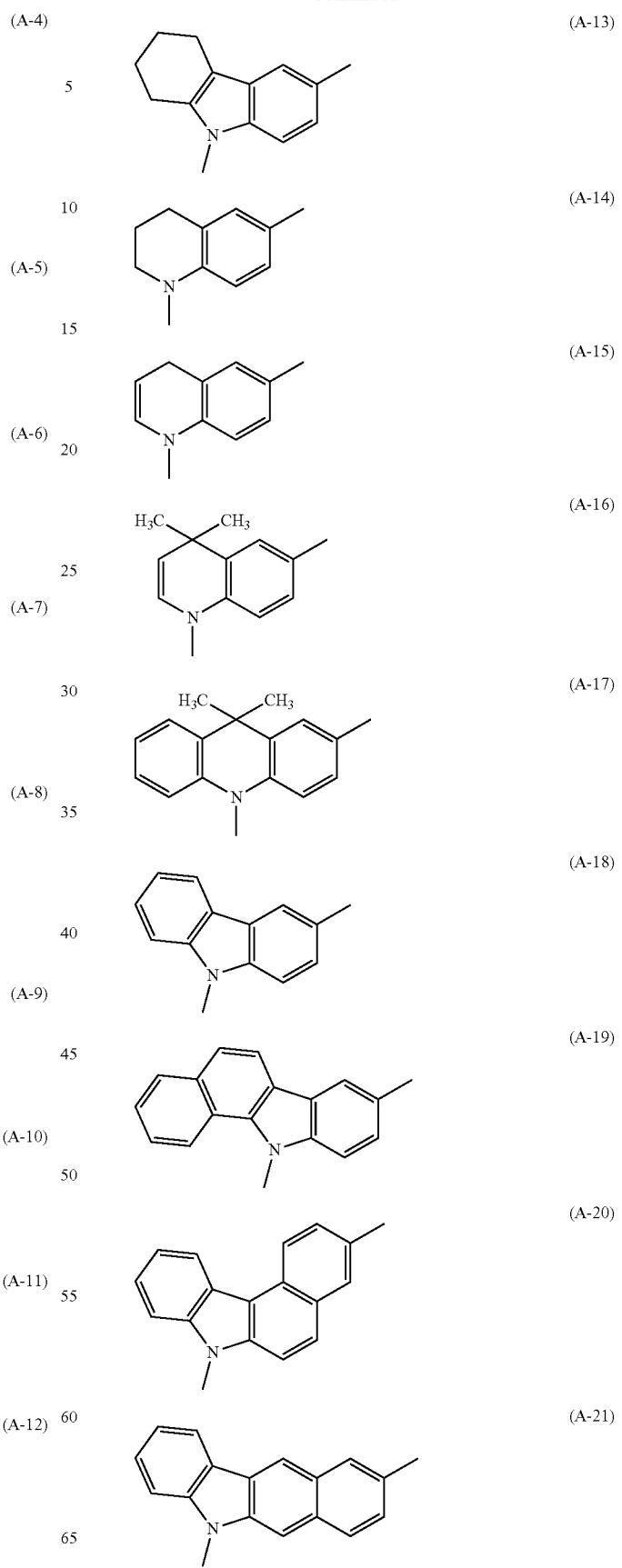

-continued
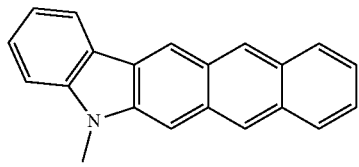
(A-22)
Specific examples of the photosensitization compound including the General Formula (3) include, but are not limited to, the following (B-1) to (B-36).
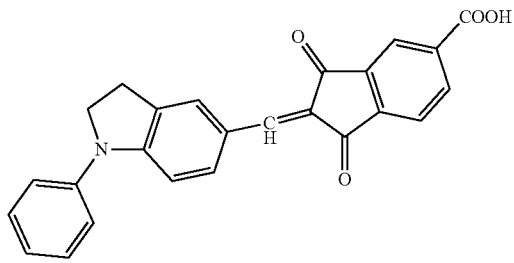
(B-1)
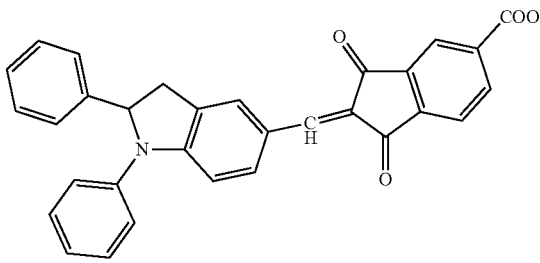
(B-2)
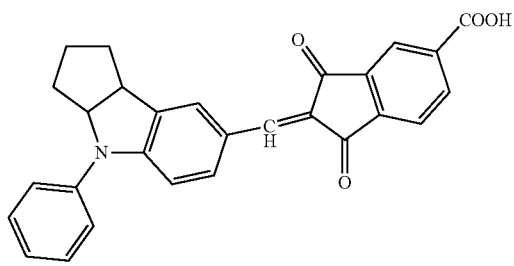
(B-3)
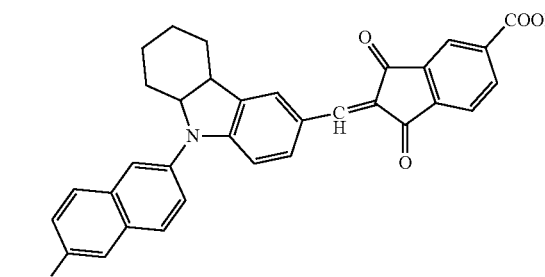
(B-4)
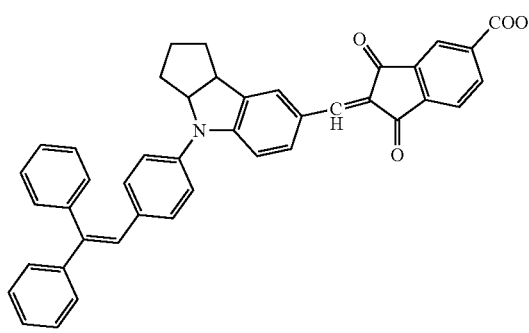
(B-5)
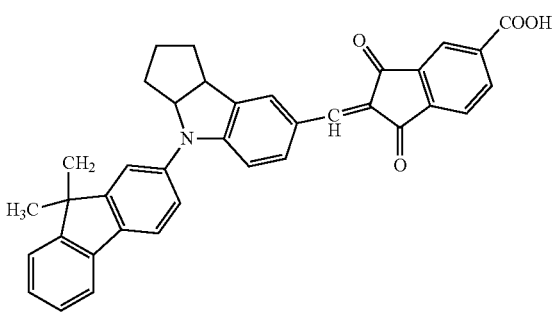
(B-6)
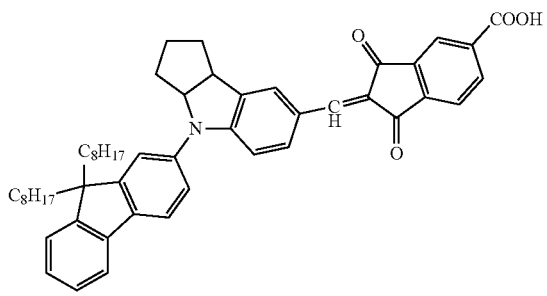
(B-7)
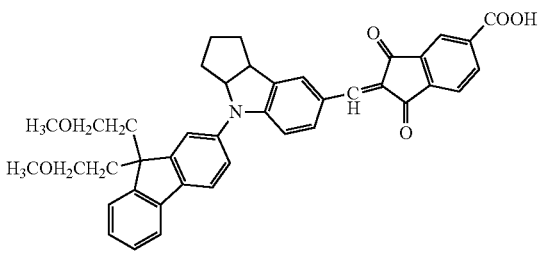
(B-8)

-continued
(B-9)
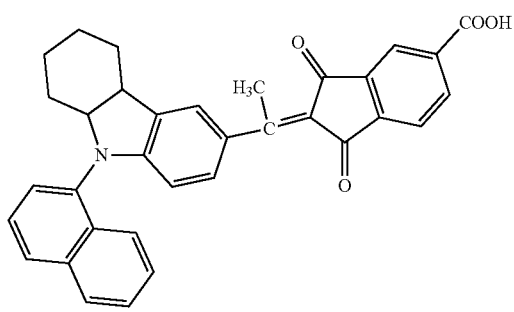
(B-10)
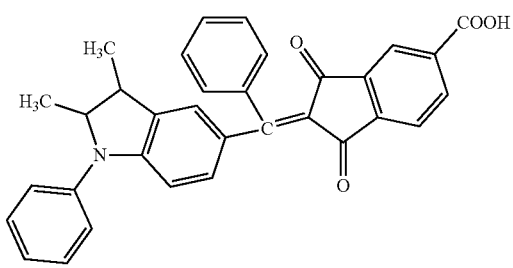
(B-11)
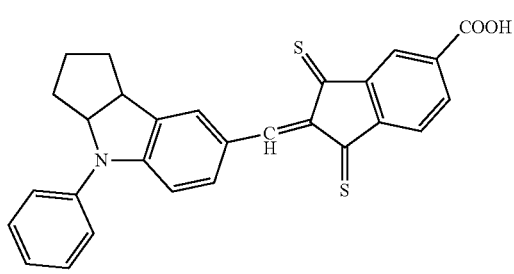
(B-12)
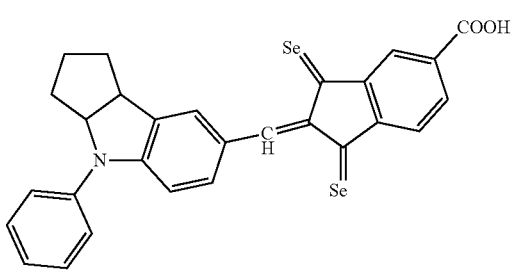
(B-13)
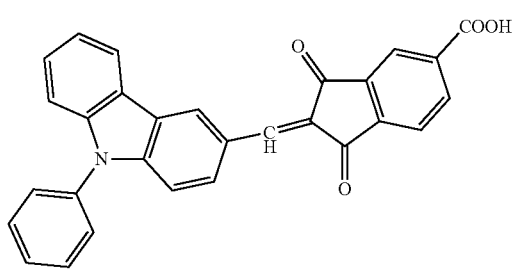
(B-14)
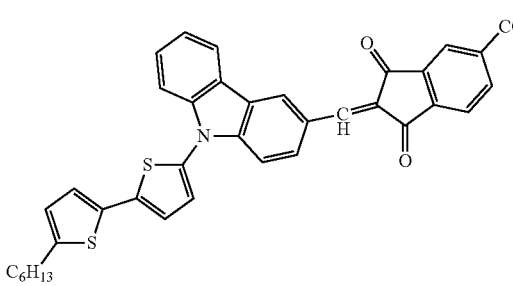
(B-15)
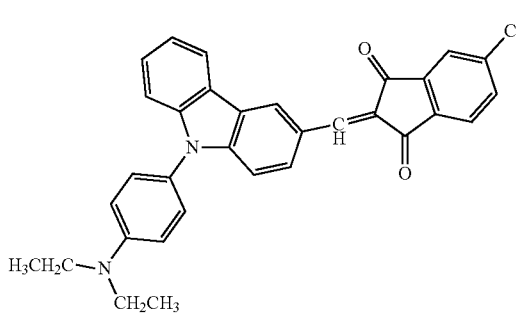
(B-16)
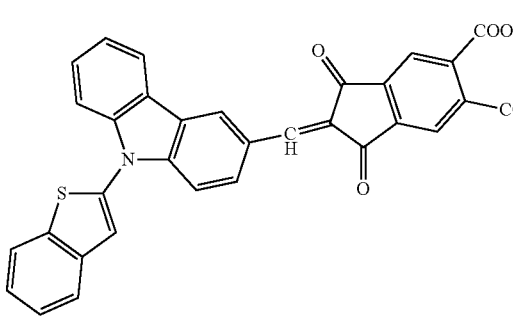
(B-17)
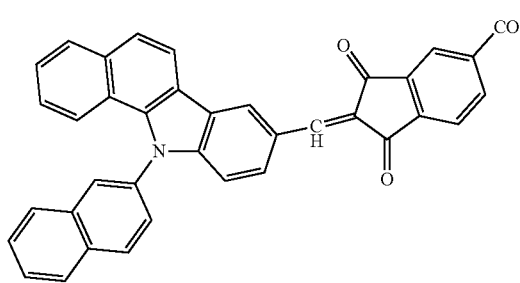
(B-18)
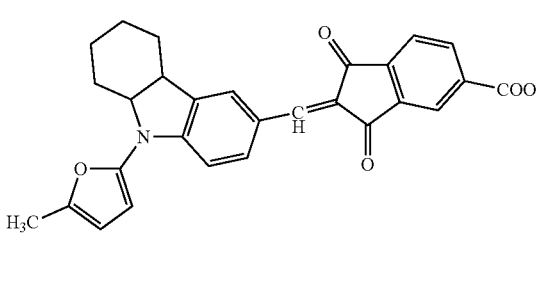

-continued
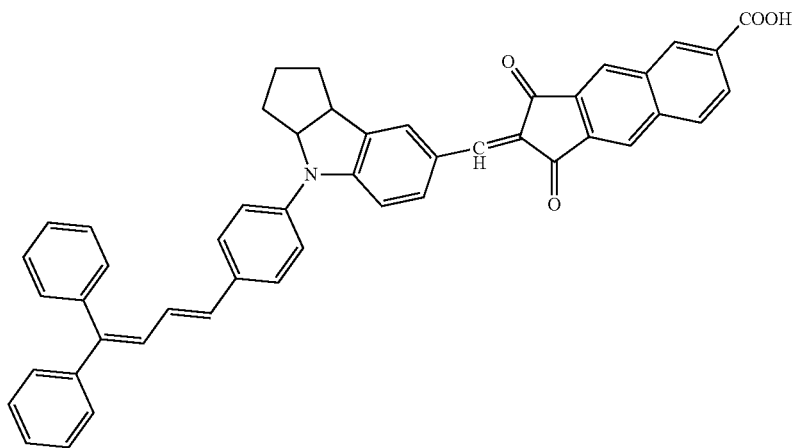
(B-19)
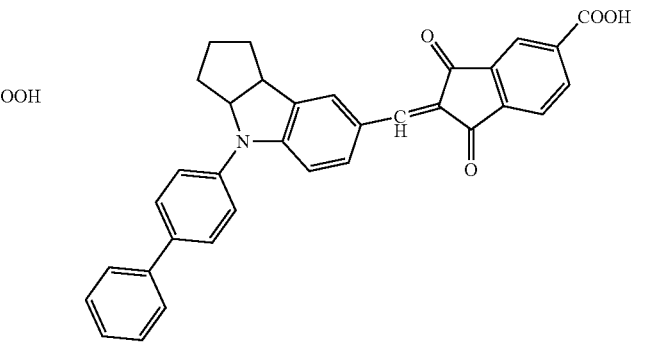
(B-20) (B-21)
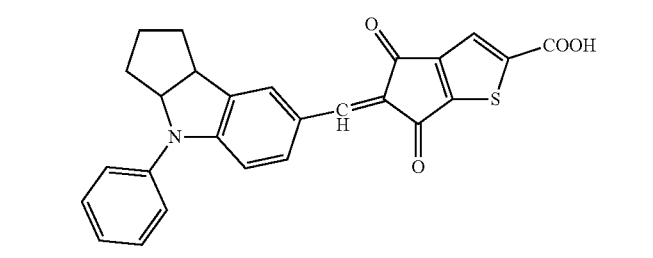
(B-22) (B-23)
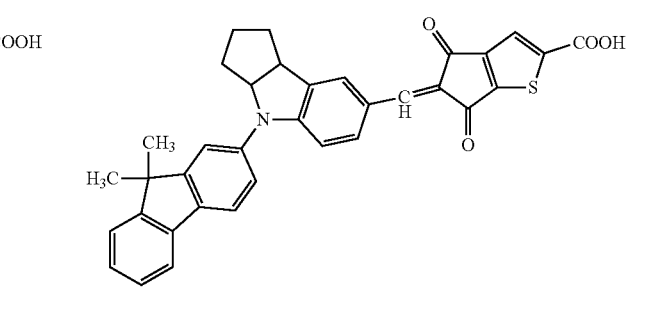
(B-24) (B-25)

-continued
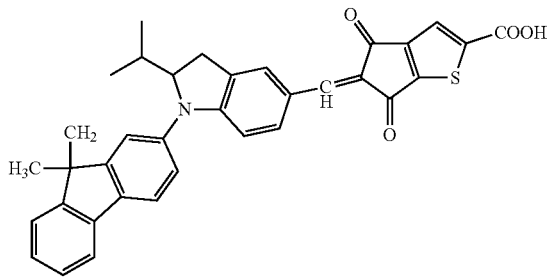
(B-26)
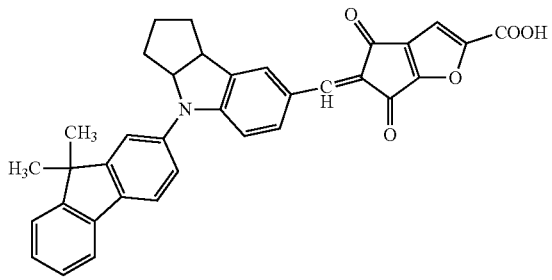
(B-27)
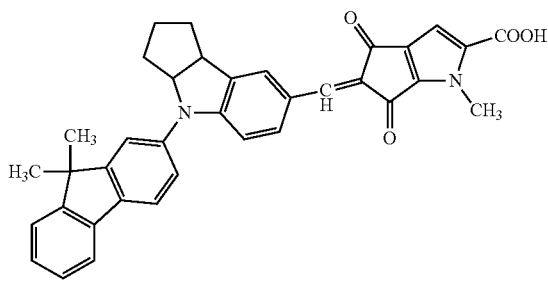
(B-28)
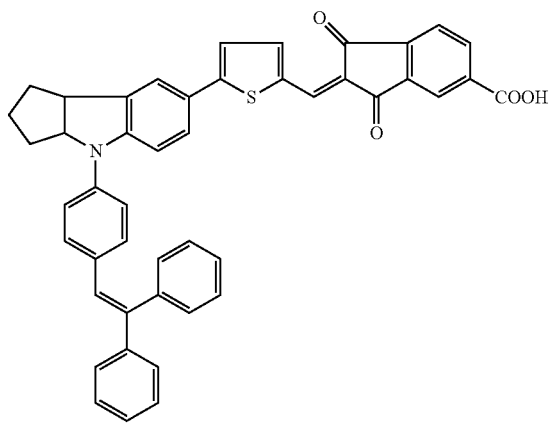
(B-29)
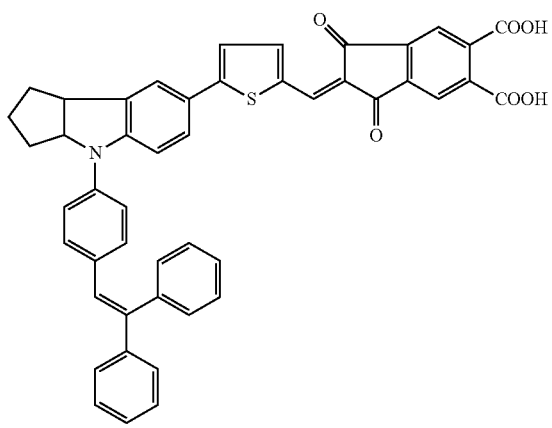
(B-30)
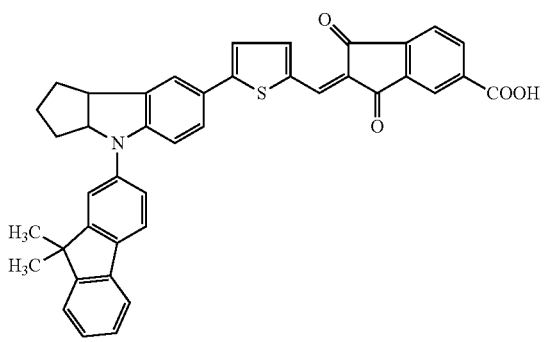
(B-31)
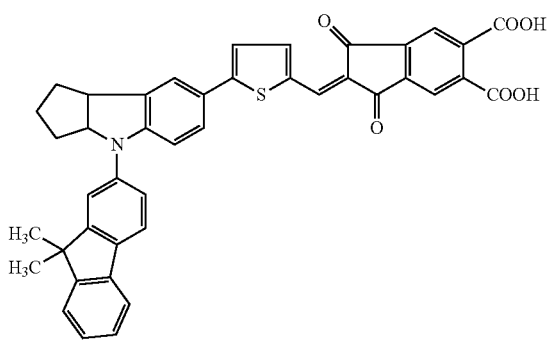
(B-32)
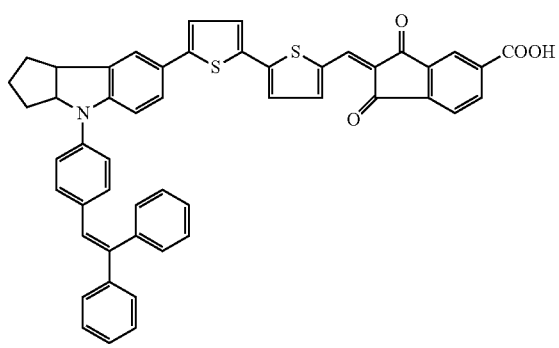
(B-33)

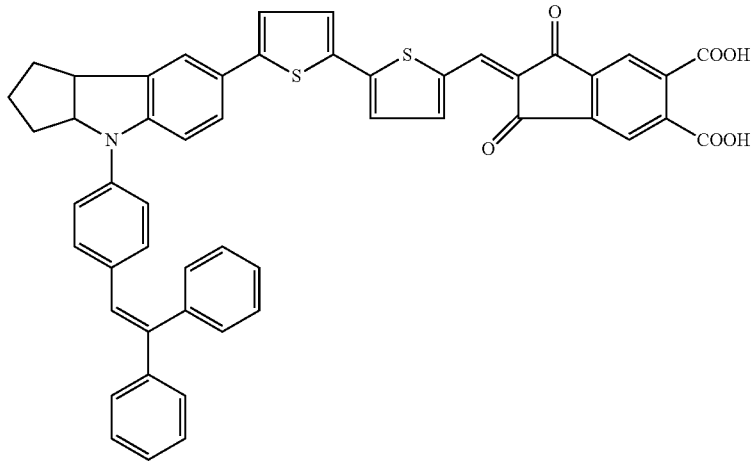

(B-34)

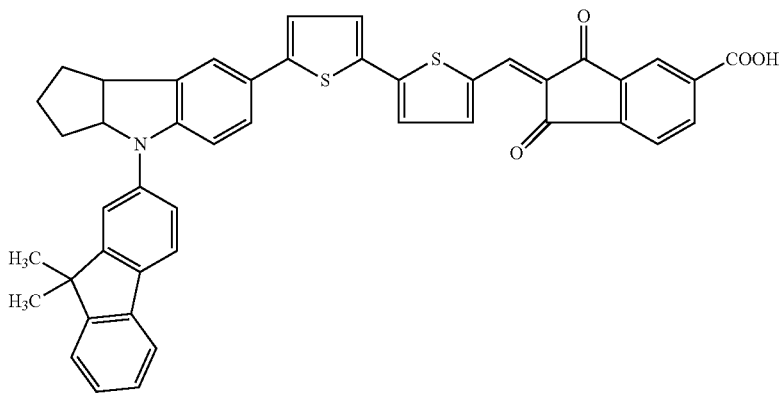

(B-35)

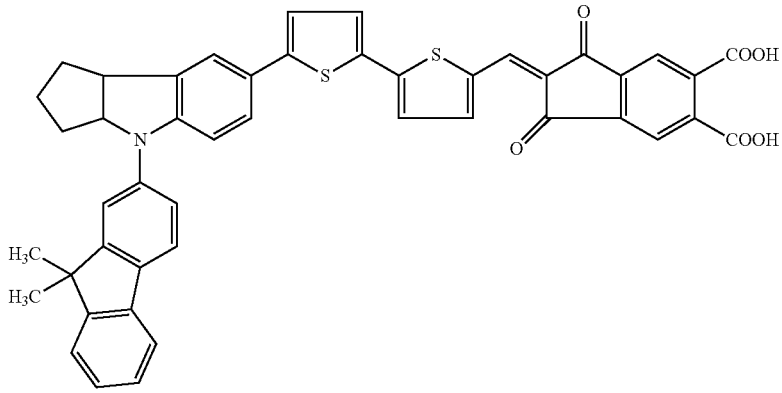

(B-36)

As a method for adsorbing the photosensitization compound on the electron-transporting semiconductor, for example, it is possible to use a method where the electron-transporting layer including the semiconductor material is immersed in a solution of the photosensitization compound or a dispersion liquid of the photosensitization compound, and a method where a solution of the photosensitization compound or a dispersion liquid of the photosensitization compound is coated and adsorbed on the electron-transporting layer.

Examples of the method where the electron-transporting layer on which the semiconductor material is formed is immersed in a solution of the photosensitization compound or a dispersion liquid of the photosensitization compound include the immersion method, the clipping method, the roller method, and the air knife method.

Examples of the method where a solution of the photosensitization compound or a dispersion liquid of the photosensitization compound is coated and adsorbed on the electron-transporting layer include the wire bar coating method, the slide hopper coating method, the extrusion coating method, the curtain coating method, the spin coating method, and the spray coating method.

Moreover, the photosensitization compound may be adsorbed in a supercritical fluid using, for example, carbon dioxide.

When the photosensitization compound is adsorbed, a condensing agent may be used in combination.

The condensing agent may be an agent exhibiting such a catalytic function that a photosensitization compound is physically or chemically bound to a surface of the electron-transporting semiconductor, or may be an agent that stoichiometrically acts and advantageously moves a chemical equilibrium.

Moreover, thiol or a hydroxyl compound may be added thereto as a condensation auxiliary.

Examples of the solvent that dissolves or disperses the photosensitization compound include water, alcohol solvents, ketone solvents, ester solvents, ether solvents, amide solvents, halogenated hydrocarbon solvents, and hydrocarbon solvents.

Examples of the alcohol solvent include methanol, ethanol, and isopropyl alcohol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

Depending on kinds of photosensitization compounds, there is a photosensitization compound that functions more effectively when aggregation between compounds is prevented. Therefore, an aggregation dissociating agent may be used in combination.

The aggregation dissociating agent is not particularly limited and may be appropriately selected depending on a dye to be used. Examples of the aggregation dissociating agent include steroid compounds (e.g., cholic acid and chenodexycholic acid), long-chain alkyl carboxylic acid, and long-chain alkyl phosphonic acid.

An amount of the aggregation dissociating agent added is preferably 0.01 parts by mass or more but 500 parts by mass or less, more preferably 0.1 parts by mass or more but 100 parts by mass or less, relative to 1 part by mass of the photosensitization compound.

By using them, a temperature, at which the photosensitization compound, or the photosensitization compound and the aggregation dissociating agent are adsorbed, is preferably −50° C. or more but 200° C. or less.

The aforementioned adsorption may be performed under standing still or under stirring.

A stirring method is not particularly limited and may be appropriately selected depending on the intended purpose. Examples of the stirring method include a stirrer, a ball mill, a paint conditioner, a sand mill, Attritor, a disperser, and ultrasonic dispersion.

The time required for the adsorption is preferably 5 seconds or more but 1,000 hours or less, more preferably 10 seconds or more but 500 hours or less, still more preferably 1 minute or more but 150 hours or less.

The adsorption is preferably performed in the dark place.

<<Hole-Transporting Layer>>

Examples of a constituent material of the hole-transporting layer include: an electrolytic solution obtained by dissolving redox couples in an organic solvent; a gel electrolyte that is obtained by immersing, in a polymer matrix, liquid obtained by dissolving redox couples in an organic solvent; a molten salt containing redox couples; a solid electrolyte; an inorganic hole-transporting material, and an organic hole-transporting material.

The inorganic hole-transporting material is not particularly limited and may be appropriately selected depending on the intended purpose. Examples of the inorganic hole-transporting material include CuSCN, CuI, CuBr, NiO, $V_2O_5$, and graphene oxide.

Among them, an organic hole-transporting material is preferable. Hereinafter, the organic hole-transporting material will be described as one example, but the organic hole-transporting material is not limited thereto.

The organic hole-transporting material is not particularly limited and may be appropriately selected depending on the intended purpose. Examples of the organic hole-transporting material include: oxadiazole compounds described in, for example, Japanese Examined Patent Publication No. 34-5466; triphenylmethane compounds described in, for example, Japanese Examined Patent Publication No. 45-555; pyrazoline compounds described in, for example, Japanese Examined Patent Publication No. 52-4188; hydrazone compounds described in, for example, Japanese Examined Patent Publication No. 55-42380; oxadiazole compounds described in, for example, Japanese Unexamined Patent Application Publication No. 56-123544; tetraarylbenzidine compounds described in, for example, Japanese Unexamined Patent Application Publication No. 54-58445; and stilbene compounds and spiro-type compounds described in, for example, Japanese Unexamined Patent Application Publication No. 58-65440 or Japanese Unexamined Patent Application Publication No. 60-98437. These may be used alone or in combination. Among them, spiro-type compounds are preferable.

Examples of the spiro-type compound include compounds including the following General Formula (4).

General Formula (4)

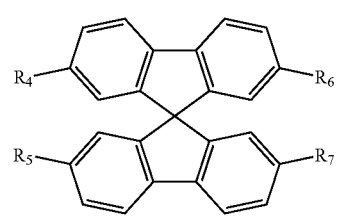

In the General Formula (4), $R_4$ to $R_7$ each independently represent a substituted amino group such as a dimethylamino group, a diphenylamino group, or a naphthyl-4-tolylamino group.

The spiro-type compound is not particularly limited and may be appropriately selected depending on the intended purpose. Examples of the spiro-type compound include, but are not limited to, exemplified compounds (D-1) to (D-20). These may be used alone or in combination.

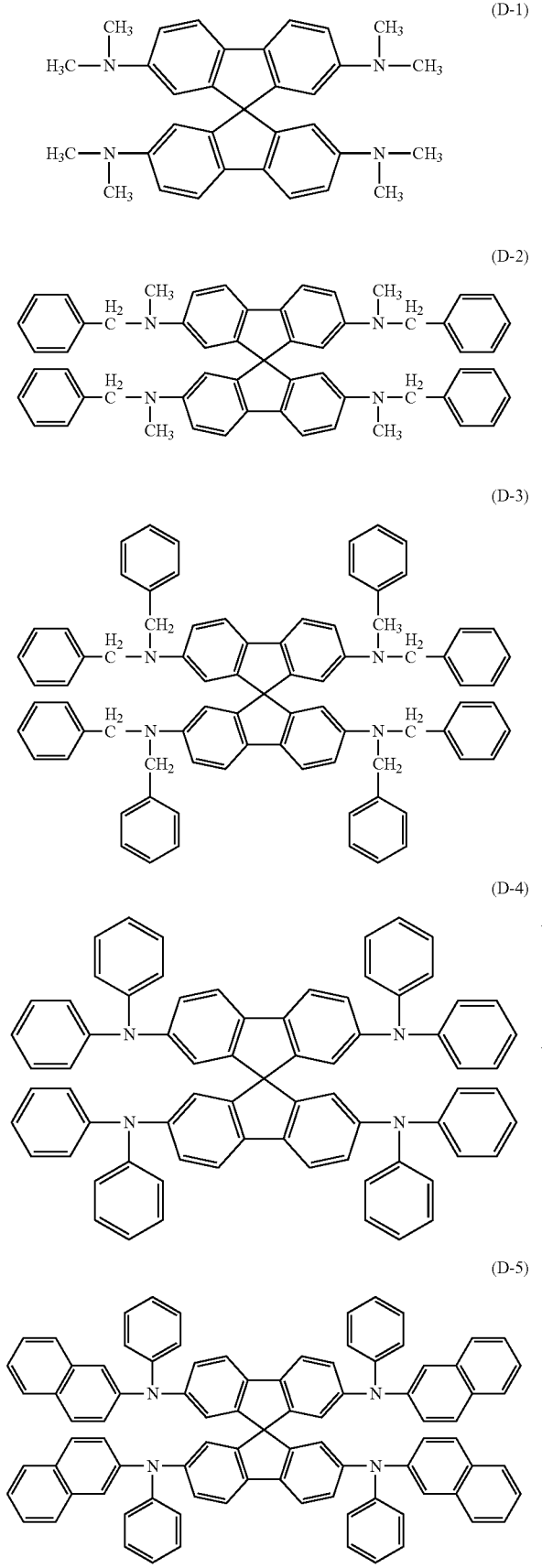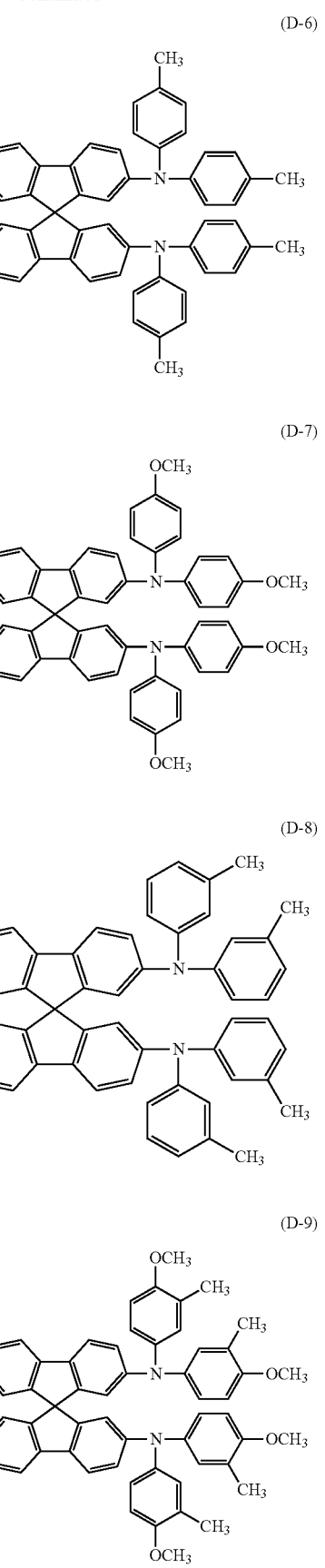

(D-10)
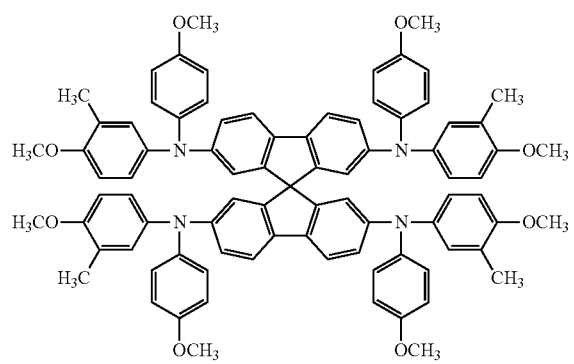
(D-11)
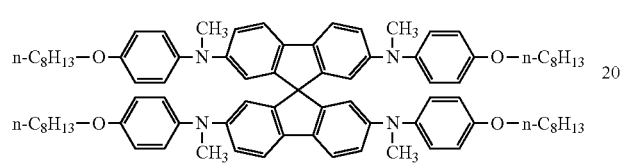
(D-12)
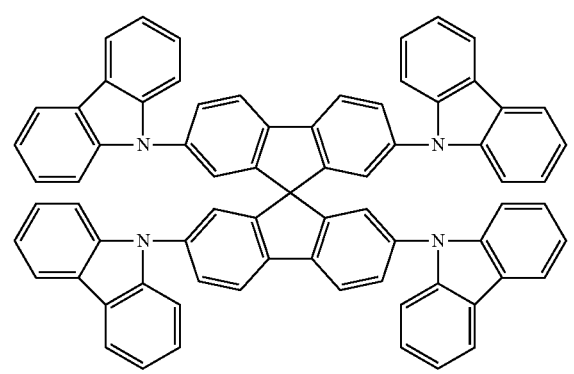
(D-13)
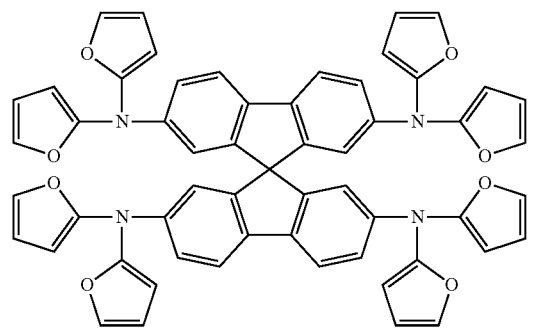
(D-14)
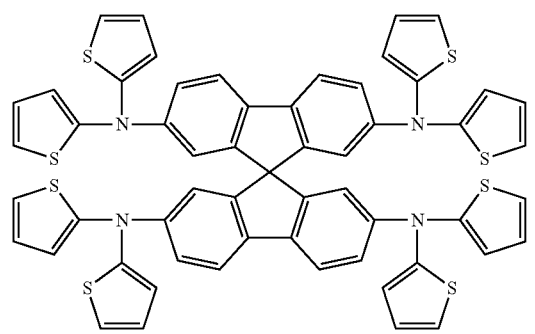
(D-15)
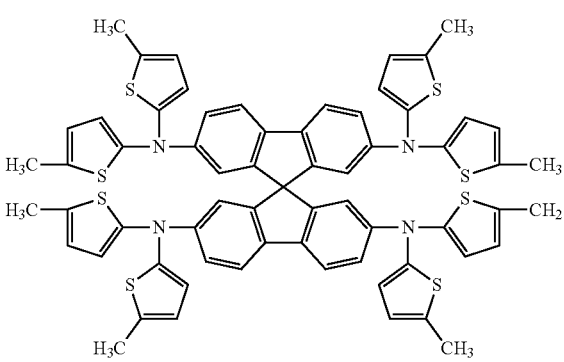
(D-16)
(D-17)
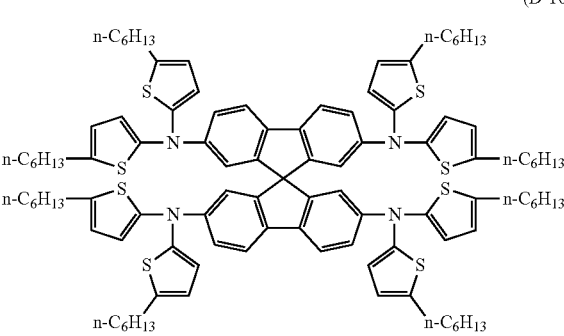
(D-18)
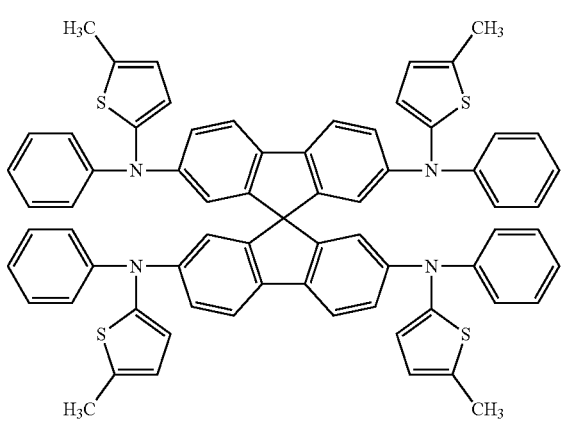

-continued

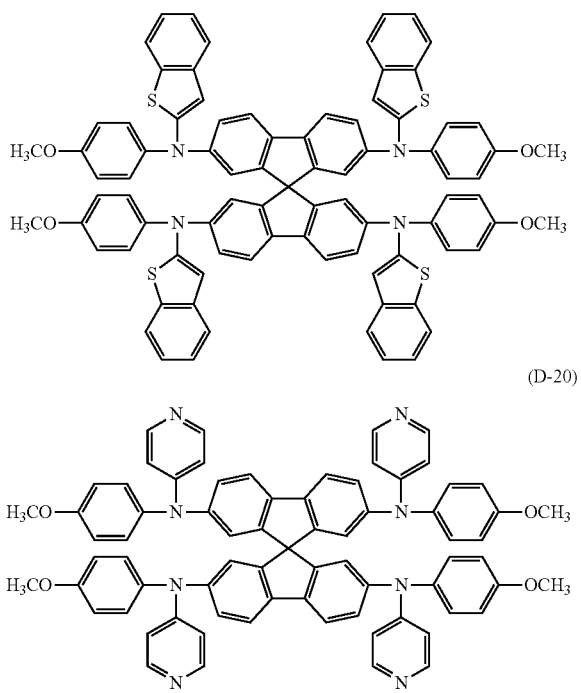
(D-19)

(D-20)

Because two benzidine skeleton molecules are spirally bound in the spiro-type compound, a nearly spherical electron cloud is formed and hopping conductivity between molecules is excellent. Therefore, the spiro-type compounds exhibit excellent photoelectric conversion characteristics. Moreover, the spiro-type compounds are dissolved in various organic solvents because of high solubility. Because the spiro-type compounds are amorphous (amorphous substances that do not have a crystal structure), the spiro-type compounds tend to be densely filled in a porous electron-transporting layer. Because the spiro-type compounds do not absorb light of 450 nm or longer, light absorption of the photosensitization compound can be effectively performed, which is particularly preferable for a solid dye-sensitized solar cell.

<<Basic Compound>>

The hole-transporting layer includes a basic compound.

It is believed that the basic compound exists at a boundary near the electron-transporting layer to prevent the reverse electron transfer (i.e., electron transfer from the electron-transporting layer to the hole-transporting layer) from the electron-transporting layer.

The basic compound is preferably a basic compound represented by the following General Formula (A) or General Formula (B), more preferably a tertiary amine compound represented by the following General Formula (1) and General Formula (2). Inclusion of a basic compound represented by the following General Formula (A) or General Formula (B) in the hole-transporting layer is advantageous because high open circuit voltage and high photoelectric conversion characteristics can be obtained. When the hole-transporting layer includes at least one selected from the group consisting of a tertiary amine compound represented by General Formula (1) and a tertiary amine compound represented by General Formula (2), high photoelectric conversion property even under light of a low illuminance and stability over time can be achieved.

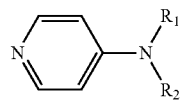
General Formula (A)

(In the General Formula (A), $R_1$ and $R_2$ each independently represent an alkyl group or an aromatic hydrocarbon group and represent an identical or different group, or $R_1$ and $R_2$ are joined with each other to represent a heterocyclic group containing a nitrogen atom.)

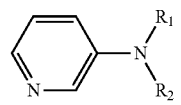
General Formula (B)

(In the General Formula (B), $R_1$ and $R_2$ each independently represent an alkyl group or an aromatic hydrocarbon group and represent an identical or different group, or $R_1$ and $R_2$ are joined with each other to represent a heterocyclic group containing a nitrogen atom.)

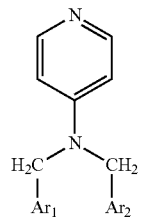
General Formula (1)

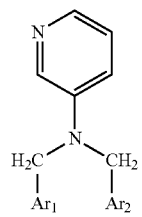
General Formula (2)

Here, in the General Formula (1) and the General Formula (2), $Ar_1$ and $Ar_2$ represent an aryl group that may have a substituent, and the $Ar_1$ and the $Ar_2$ may be identical or different and may be joined with each other.

Specific exemplified compounds of the basic compounds represented by the General Formula (A) and the General Formula (B) are presented below, but the present disclosure is not limited thereto.

TABLE 1

| | |
|---|---|
| 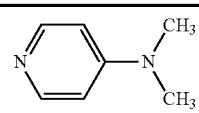 | Compound No. 1 |
| 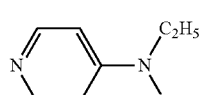 | Compound No. 2 |

TABLE 1-continued
| | |
|---|---|
| 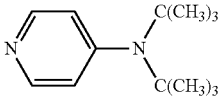 | Compound No. 3 |
| 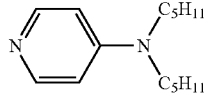 | Compound No. 4 |
| 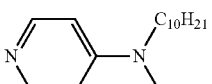 | Compound No. 5 |
| 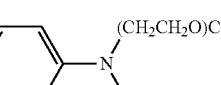 | Compound No. 6 |
| 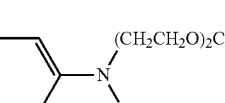 | Compound No. 7 |
| 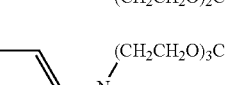 | Compound No. 8 |
| 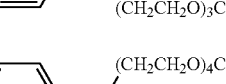 | Compound No. 9 |
| 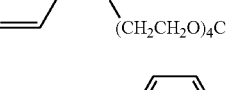 | Compound No. 10 |
| 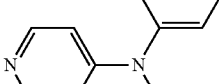 | Compound No. 11 |
| 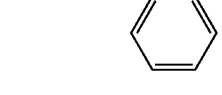 | Compound No. 12 |
| 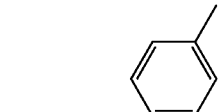 | Compound No. 13 |
TABLE 1-continued
| | |
|---|---|
| 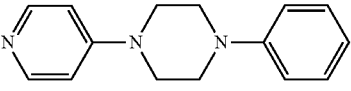 | Compound No. 14 |
| 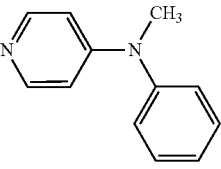 | Compound No. 15 |
| 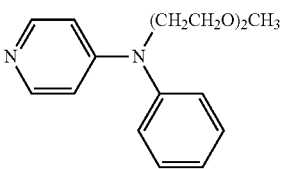 | Compound No. 16 |
| 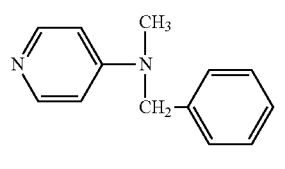 | Compound No. 17 |
| 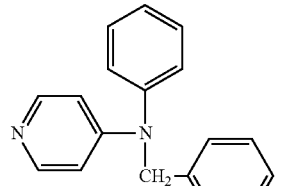 | Compound No. 18 |
| 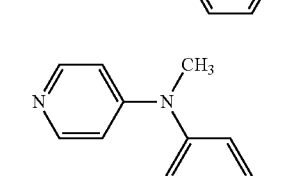 | Compound No. 19 |
| 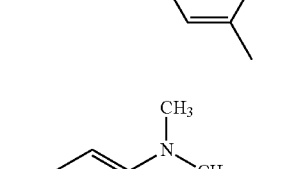 | Compound No. 20 |
| 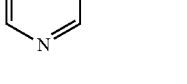 | Compound No. 21 |
| 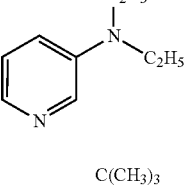 | Compound No. 22 |

TABLE 1-continued
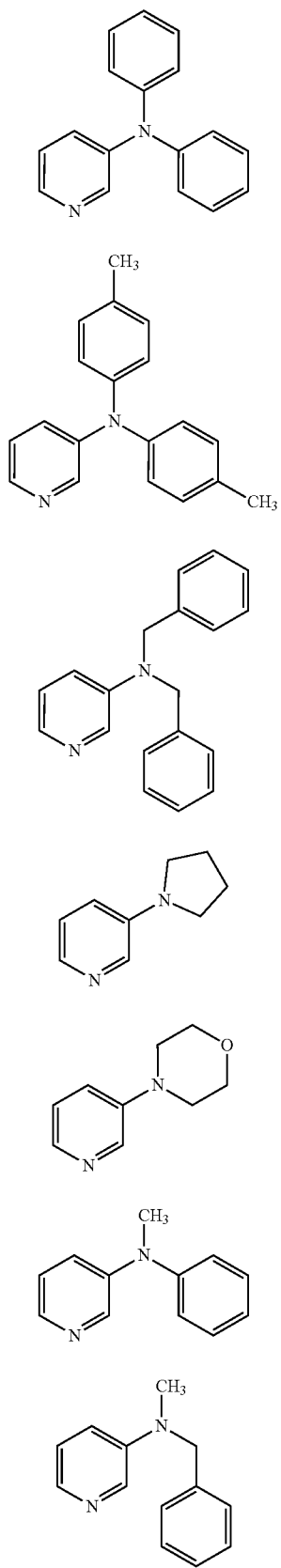
Compound No. 23
Compound No. 24
Compound No. 25
Compound No. 26
Compound No. 27
Compound No. 28
Compound No. 29
TABLE 1-continued
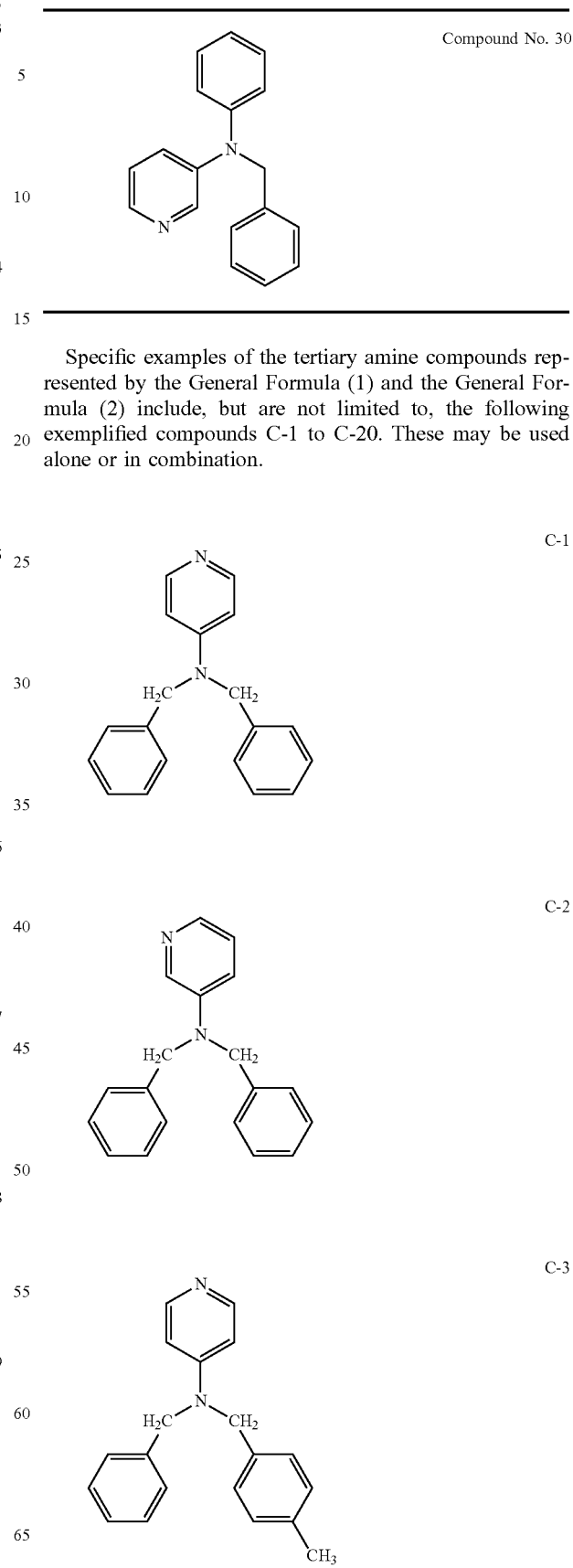
Compound No. 30
Specific examples of the tertiary amine compounds represented by the General Formula (1) and the General Formula (2) include, but are not limited to, the following exemplified compounds C-1 to C-20. These may be used alone or in combination.
C-1
C-2
C-3

-continued
C-4
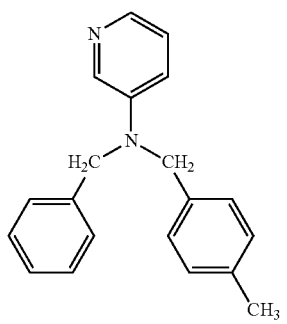
C-5
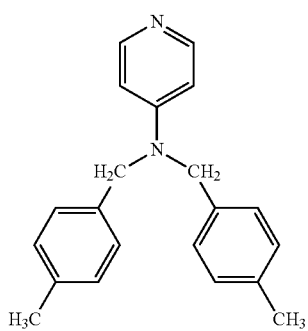
C-6
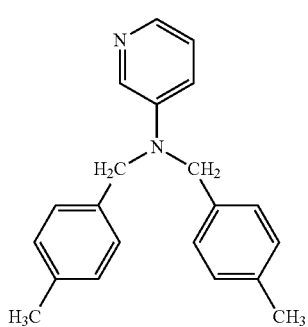
C-7
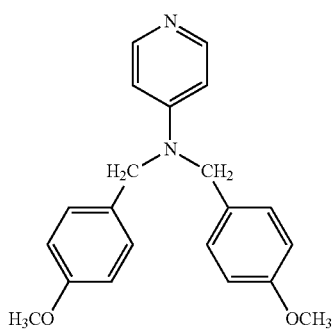
C-8
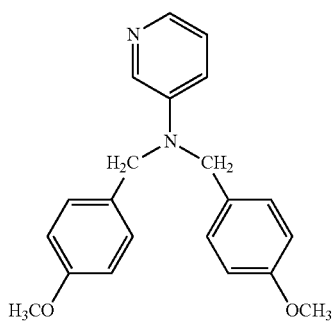
-continued
C-9
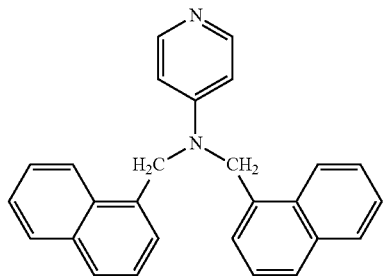
C-10
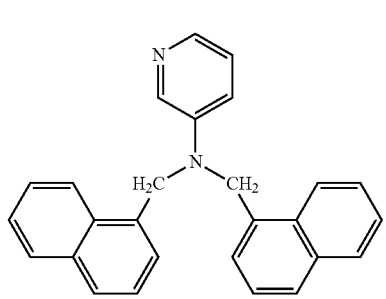
C-11
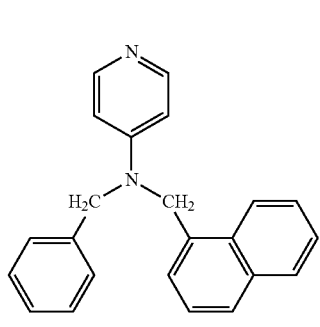
C-12
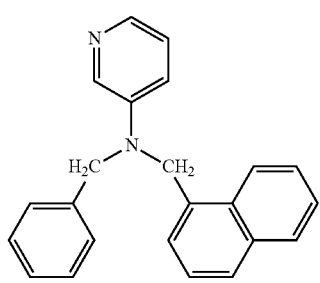
C-13
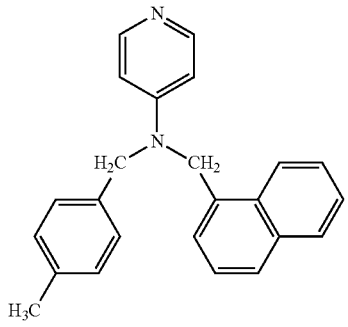

C-14
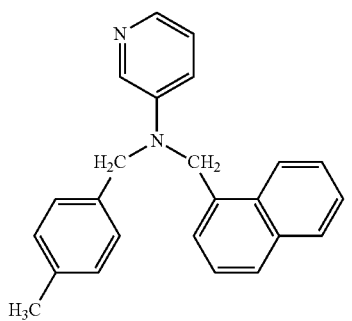

C-15
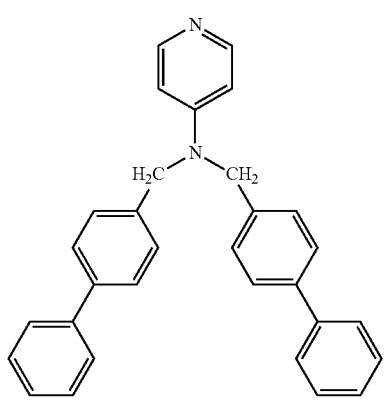

C-16
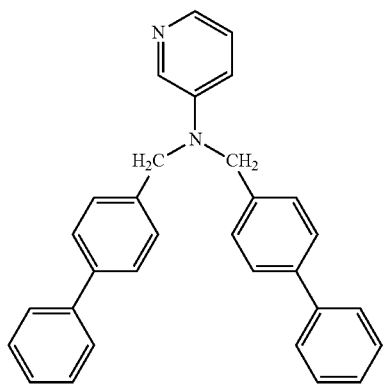

C-17
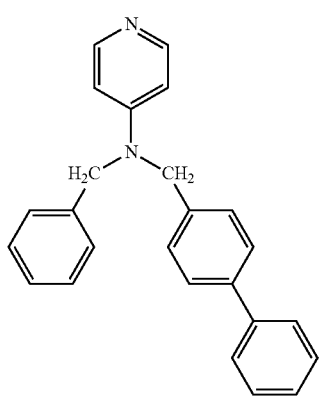

C-18
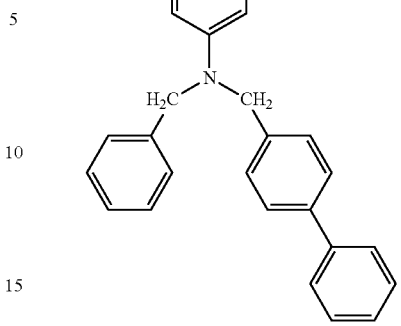

C-19
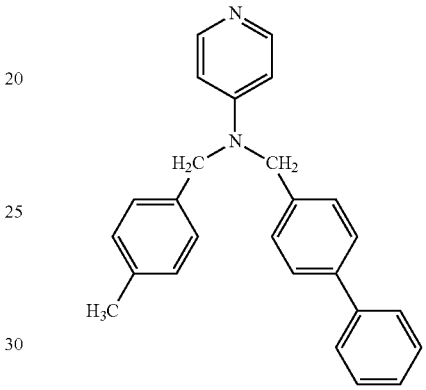

C-20
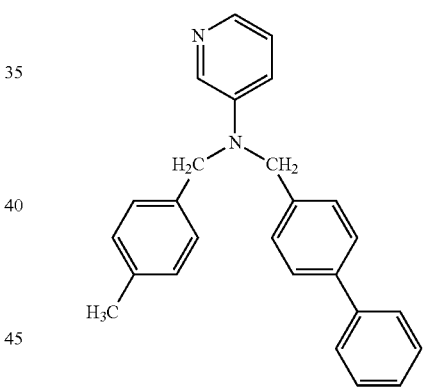

An amount of the basic compound in the hole-transporting layer is preferably 1 part by mass or more but 50 parts by mass or less, more preferably 10 parts by mass or more but 30 parts by mass or less, relative to the total amount of the hole-transporting material. When the amount of the basic compound falls within the preferable range, high open circuit voltage can be maintained, high output can be obtained, and high stability and durability can be obtained even when it is used for a long period of time under various environments.

<<<Oxidizing agent>>>

The hole-transporting layer preferably includes an oxidizing agent. When the hole-transporting layer includes the oxidizing agent, a part of the organic hole-transporting material becomes radical cation. Therefore, conductivity can be improved, and stability or durability of output characteristics can be enhanced.

When the oxidizing agent oxidizes the organic hole-transporting material, good hole conductivity is exhibited, and cancellation (reduction) of the oxidation state influenced by an ambient environment of the photoelectric conversion layer can be prevented, exhibiting good stability over time.

The oxidizing agent is not particularly limited and may be appropriately selected depending on the intended purpose. Examples of the oxidizing agent include tris(4-bromophenyl)aminium hexachloroantimonate, silver hexafluoroantimonate, nitrosonium tetrafluoroborate, silver nitrate, and metal complexes. These may be used alone or in combination. Among them, metal complexes are preferable.

Examples of the metal complex include compositions including, for example, a metal cation, a ligand, and an anion.

The metal cation is not particularly limited and may be appropriately selected depending on the intended purpose. Examples of the metal cation include cations of, for example, chromium, manganese, zinc, iron, cobalt, nickel, copper, molybdenum, ruthenium, rhodium, palladium, silver, tungsten, rhenium, osmium, iridium, vanadium, gold, and platinum. Among them, cations of manganese, zinc, iron, cobalt, nickel, copper, ruthenium, silver, and vanadium are preferable, and cations of cobalt are more preferable. That is, the metal complex is more preferably a cobalt complex.

The ligand preferably includes a 5-membered heterocycle and/or a 6-membered heterocycle including at least one nitrogen, and may include a substituent. Specific examples thereof include, but are not limited to, the following.

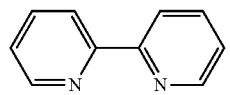
(E-1)

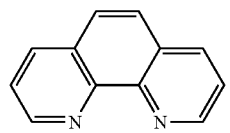
(E-2)

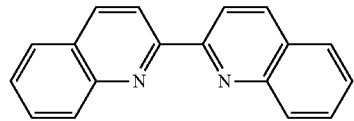
(E-3)

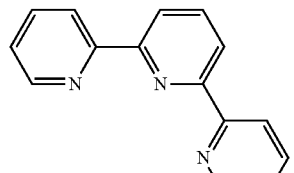
(E-4)

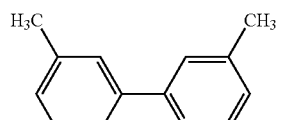
(E-5)

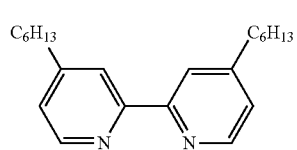
(E-6)

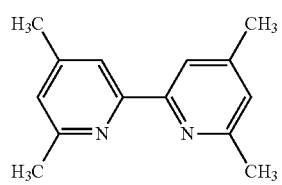
(E-7)

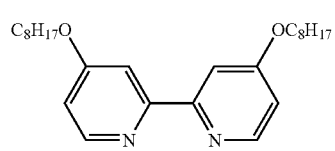
(E-8)

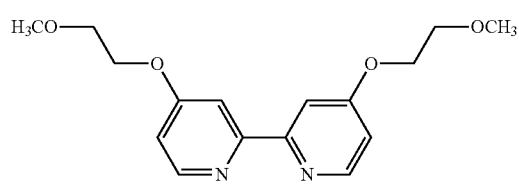
(E-9)

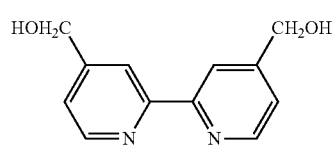
(E-10)

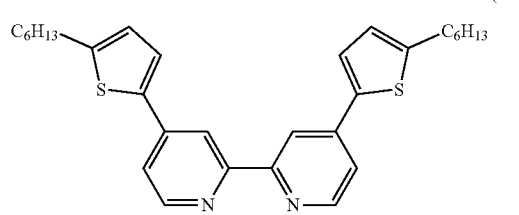
(E-11)

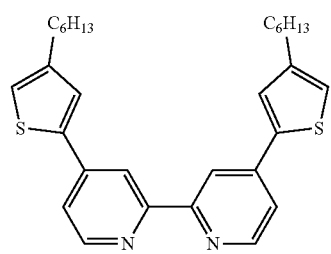
(E-12)

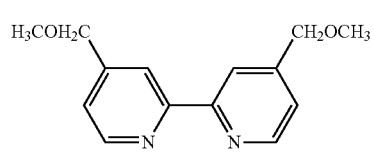
(E-13)

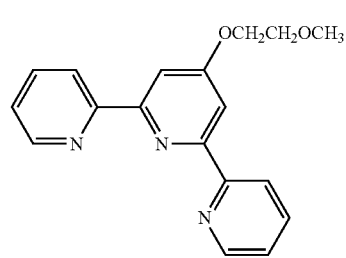
(E-14)

(E-15)
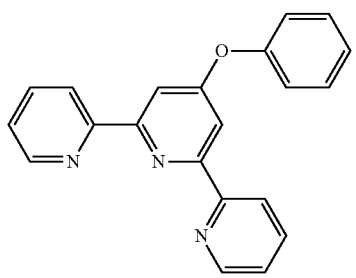
(E-16)
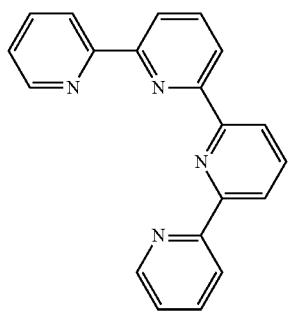
(E-17)
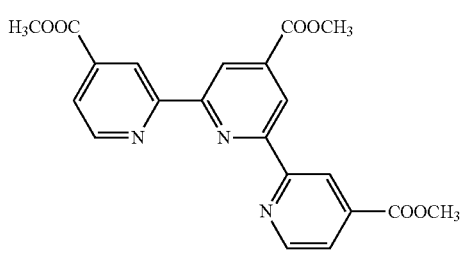
(E-18)
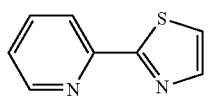
(E-19)
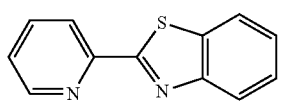
(E-20)
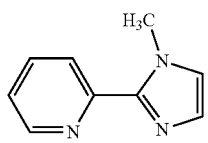
(E-21)
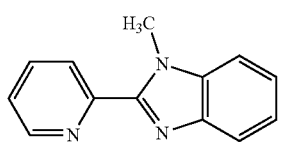
(E-22)
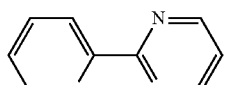
(E-23)
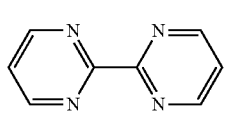
(E-24)
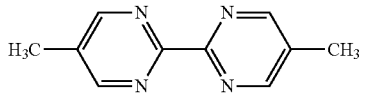
(E-25)
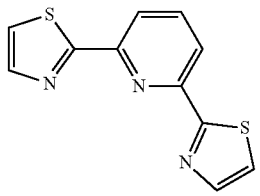
(E-26)
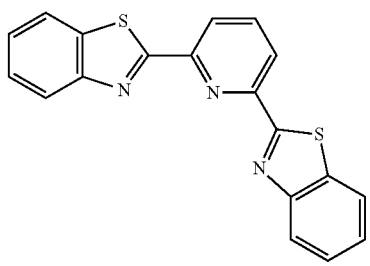
(E-27)
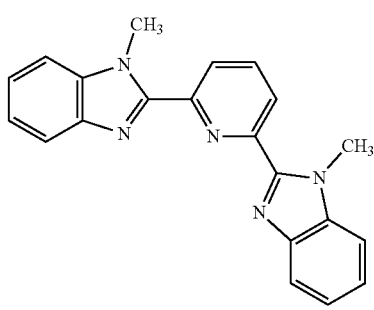
(E-28)
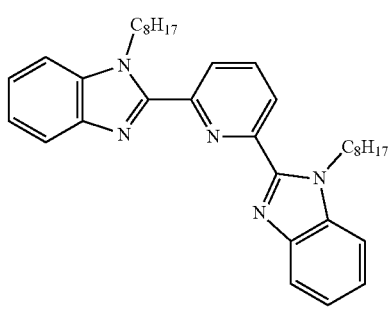
(E-29)
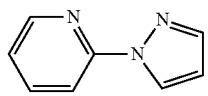
(E-30)
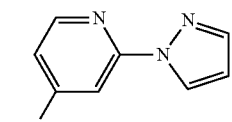
(E-31)
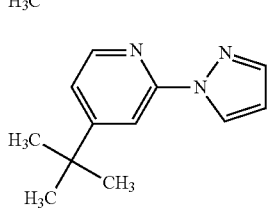

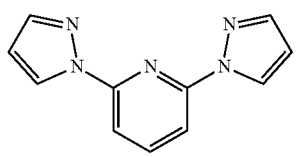

(E-32)

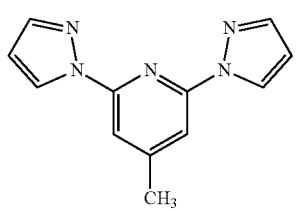

(E-33)

Examples of the anion include a hydride ion (H⁻), a fluoride ion (F⁻), a chloride ion (Cl⁻), a bromide ion (Br⁻), an iodide ion (I⁻), a hydroxide ion (OH⁻), a cyanide ion (CN⁻), a nitric acid ion ($NO_3^-$), a nitrous acid ion ($NO_2^-$), a hypochlorous acid ion (ClO⁻), a chlorous acid ion ($ClO_2^-$), a chloric acid ion ($ClO_3^-$), a perchloric acid ion ($ClO_4^-$), a permanganic acid ion ($MnO_4^-$), an acetic acid ion ($CH_3COO^-$), a hydrogen carbonate ion ($HCO_3^-$), a dihydrogen phosphate ion ($H_2PO_4^-$), a hydrogen sulfate ion ($HSO_4^-$), a hydrogen sulfide ion (HS), a thiocyanic acid ion (SCN⁻), a tetrafluoroboric acid ion ($BF_4^-$), a hexafluorophosphate ion ($PF_6^-$), a tetracyanoborate ion ($B(CN)_4^-$), a dicyanoamine ion ($N(CN)_2^-$), a p-toluenesulfonic acid ion (TsO⁻), a trifluoromethyl sulfonate ion ($CF_3SO_2^-$), a bis(trifluoromethylsulfonyl)amine ion ($N(SO_2CF_3)_2^-$), a tetrahydroxoaluminate ion ($[Al(OH)_4]^-$ or $[Al(OH)_4(H_2O)_2]^-$), a dicyanoargentate(I) ion ($[Ag(CN)_2]^-$), a tetrahydroxochromate(III) ion ($[Cr(OH)_4]^-$), a tetrachloroaurate(III) ion ($[AuCl_4]^-$), an oxide ion ($O^{2-}$), a sulfide ion ($S^{2-}$), a peroxide ion ($O_2^{2-}$), a sulfuric acid ion ($SO_4^{2-}$), a sulfurous acid ion ($SO_3^{2-}$), a thiosulfuric acid ($S_2O_3^{2-}$), a carbonic acid ion ($CO_3^{2-}$), a chromic acid ion ($CrO_4^{2-}$), a dichromic acid ion ($Cr_2O_7^{2-}$), a monohydrogen phosphate ion ($HPO_4^{2-}$), a tetrahydroxozincate(II) ion ($[Zn(OH)_4]^{2-}$), a tetracyanozincate(II) ion ($[Zn(CN)_4]^{2-}$), a tetrachlorocuprate(II) ion ($[CuCl_4]^{2-}$), a phosphoric acid ion ($PO_4^{3-}$), a hexacyanoferrate(III) ion ($[Fe(CN)_6]^{3-}$), a bis(thiosulfate)argentate(I) ion ($[Ag(S_2O_3)_2]^{3-}$), and a hexacyanoferrate(II) ion ($[Fe(CN)_6]^{4-}$). Among them, a tetrafluoroboric acid ion, a hexafluorophosphate ion, a tetracyanoborate ion, a bis(trifluoromethylsulfonyl)amine ion, and a perchloric acid ion are preferable.

The metal complex is particularly preferably a trivalent cobalt complex represented by the following General Formula (5). When the metal complex is a trivalent cobalt complex, the function as the oxidizing agent is excellent, which is advantageous.

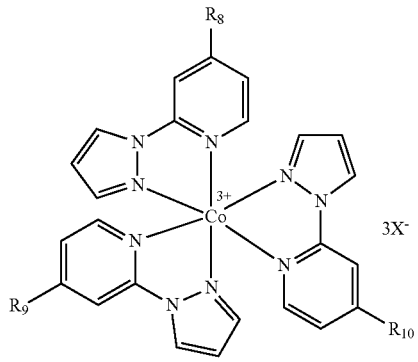

General Formula (5)

In the General Formula (5), $R_8$ to $R_{10}$ each independently represent a hydrogen atom, a methyl group, an ethyl group, a tert-butyl group, or a trifluoromethyl group. X⁻ represents one selected from the group consisting of the above monovalent anions.

Specific examples of the cobalt complex represented by the General Formula (5) are described below. However, the present disclosure is not limited thereto. These may be used alone or in combination.

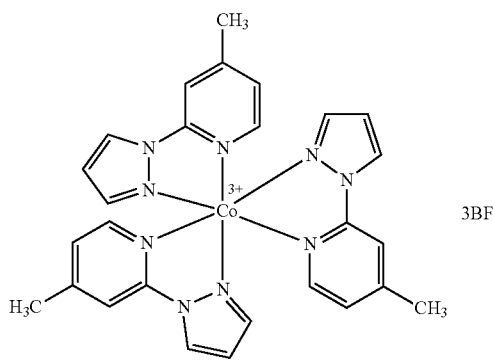

(F-1)

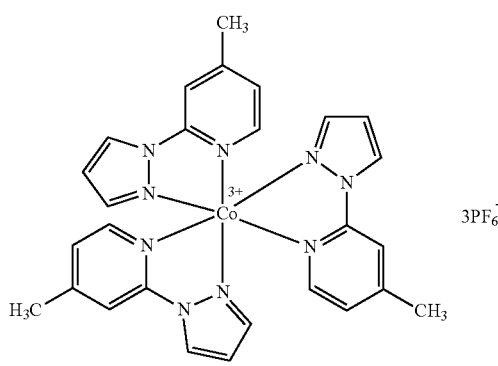

(F-2)

(F-3)
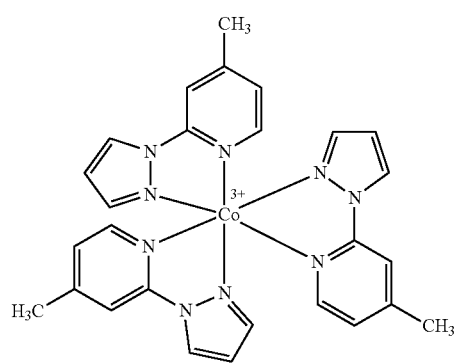
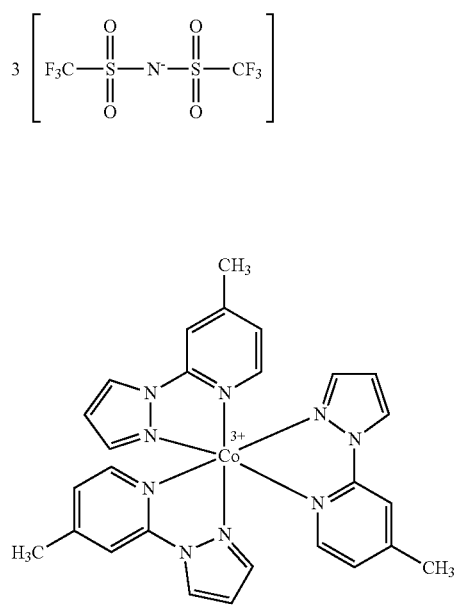
(F-4)
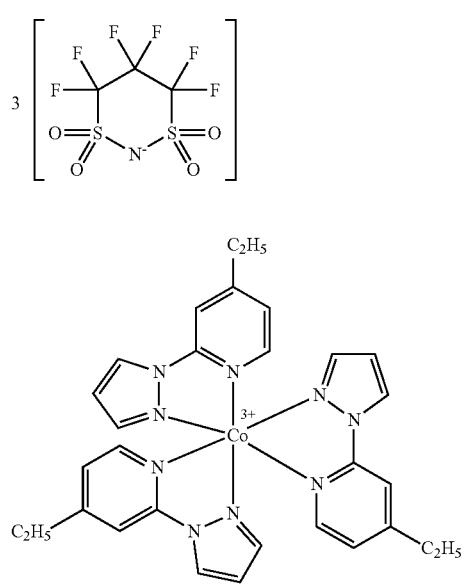
(F-5)
(F-6)
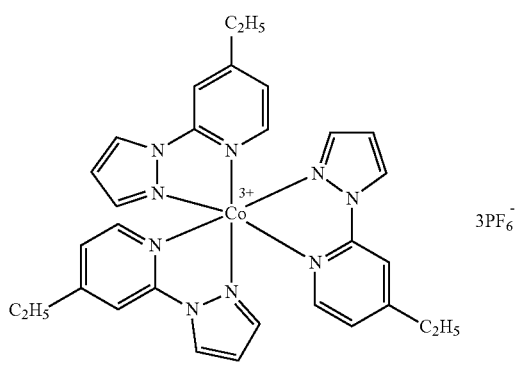
(F-7)
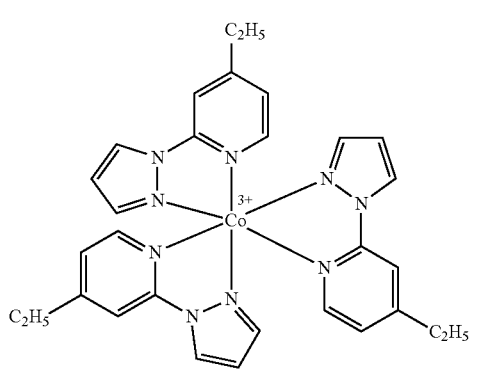
(F-8)
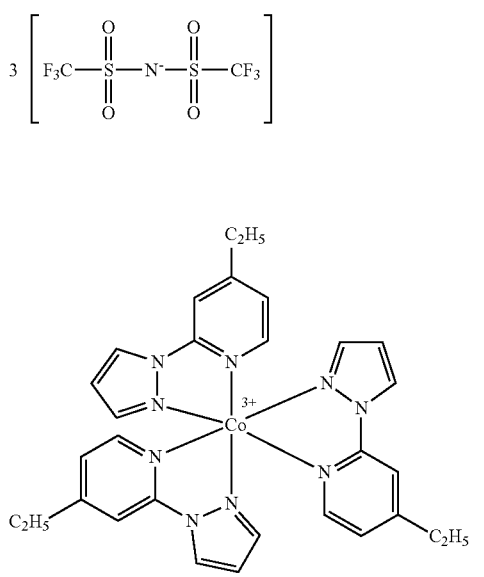
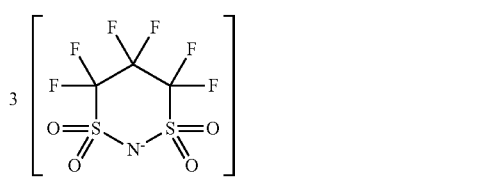

(F-9)
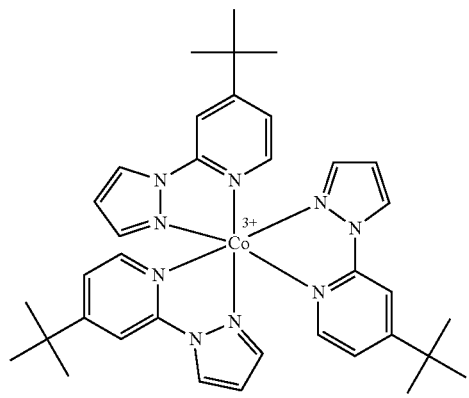
3BF$_4^-$
(F-10)
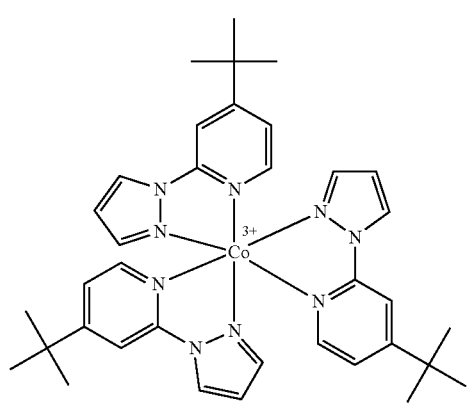
3PF$_6^-$
(F-11)
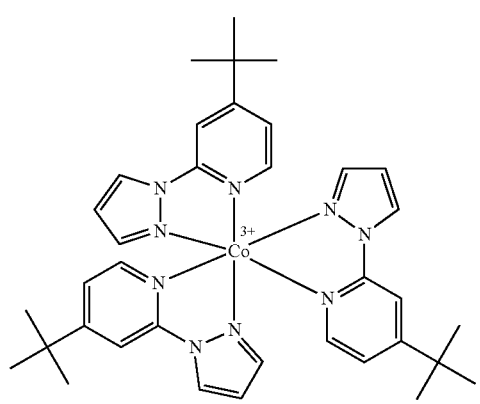
3 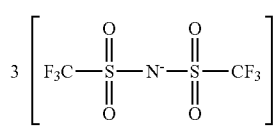
(F-12)
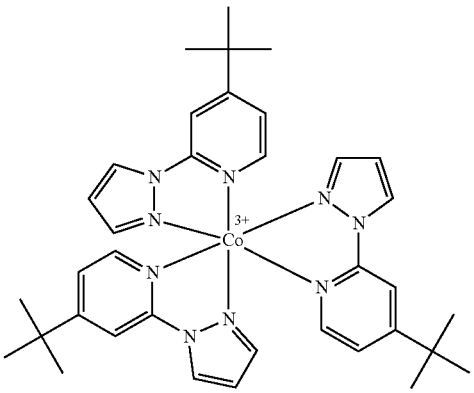
3 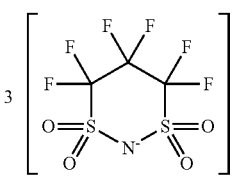
(F-13)
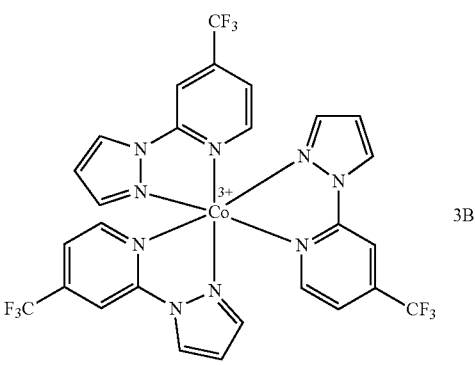
3BF$_4^-$
(F-14)
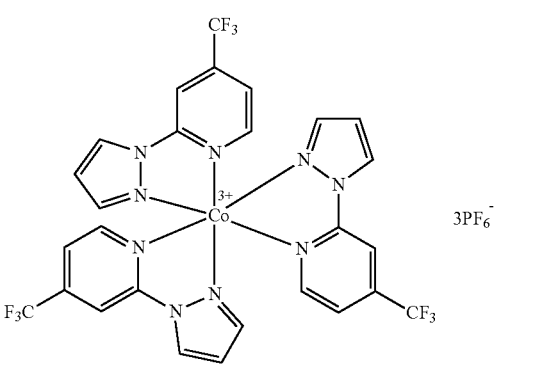
3PF$_6^-$ (F-15)
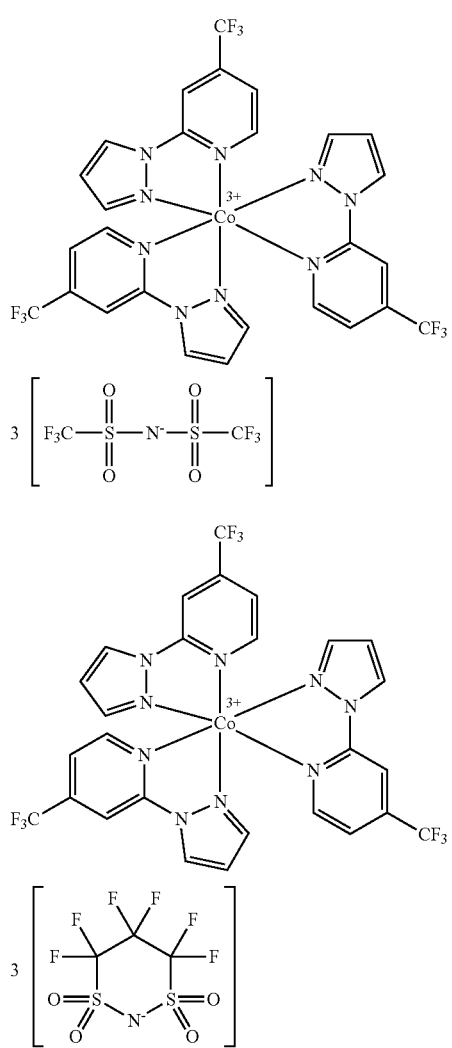

(F-16)

(F-17)

(F-18)

(F-19)
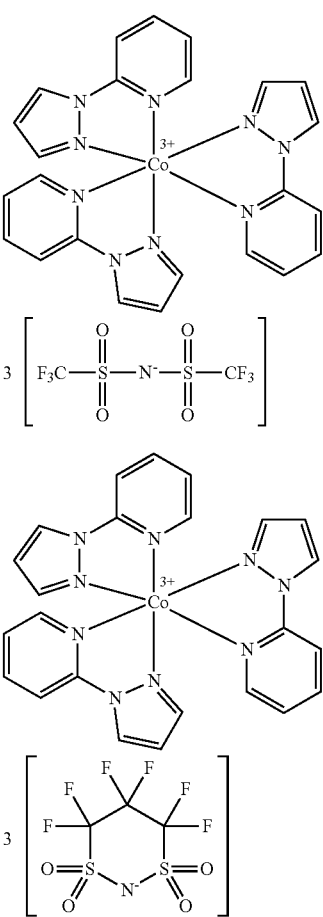

(F-20)

As the metal complex, a trivalent cobalt complex represented by the following General Formula (6) is also effectively used.

General Formula (6)
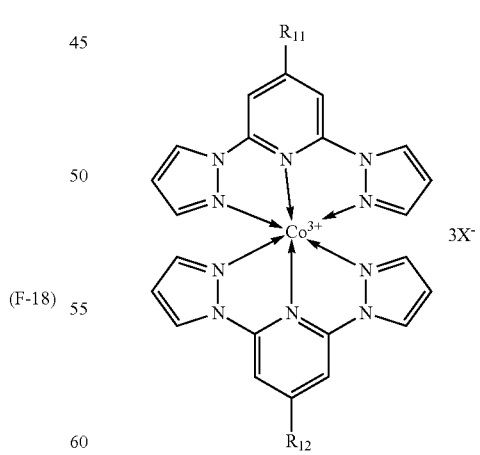

In the General Formula (6), $R_{11}$ and $R_{12}$ each independently represent a hydrogen atom, a methyl group, an ethyl group, a tert-butyl group, or a trifluoromethyl group. $X^-$ represents one selected from the group consisting of the above monovalent anions.

Specific examples of the cobalt complex represented by the General Formula (6) are described below. However, the present disclosure is not limited thereto. These may be used alone or in combination.

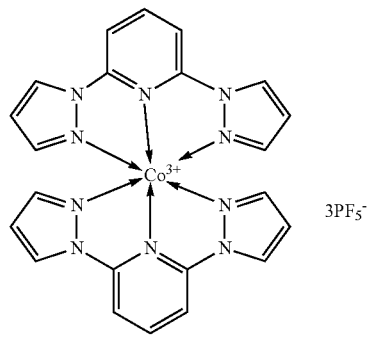
(F-21)

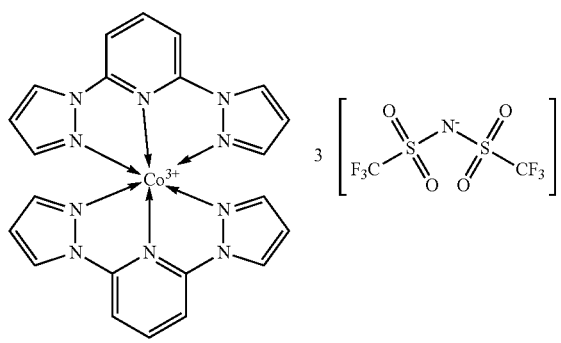
(F-22)

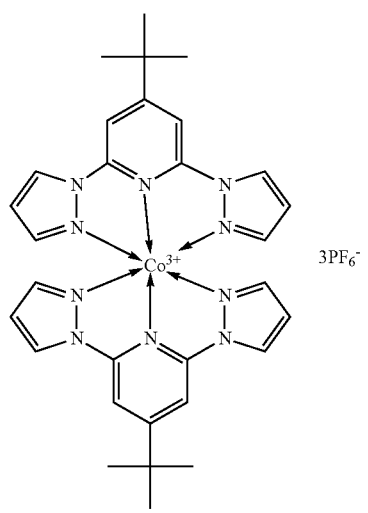
(F-23)

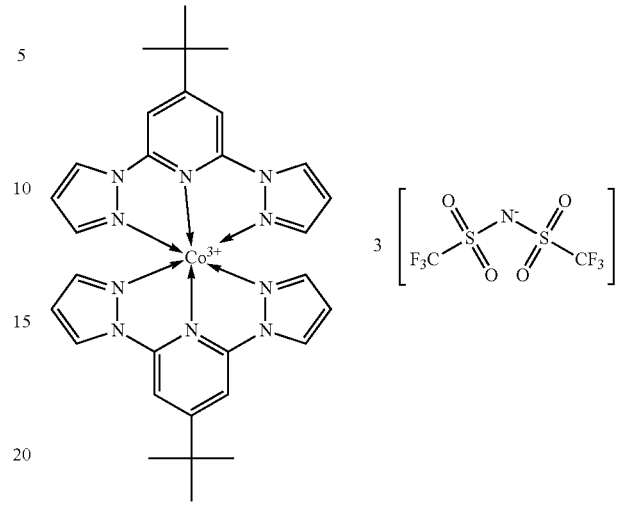
(F-24)

An amount of the oxidizing agent is preferably 0.5 parts by mass or more but 50 parts by mass or less, more preferably 5 parts by mass or more but 30 parts by mass or less, relative to 100 parts by mass of the hole-transporting material. It is not necessary to oxidize all the hole-transporting materials by addition of the oxidizing agent, and it is effective so long as only part of the hole-transporting materials is oxidized.

<<<Alkali Metal Salt>>>

The hole-transporting layer preferably includes an alkali metal salt as an additive. This is advantageous because transfer of charges can be smooth and good photoelectric conversion characteristics can be obtained.

It is believed that cations of the alkali metal salt exist at a boundary near the electron-transporting layer, and anions of the alkali metal salt are doped in the hole-transporting layer.

Examples of the alkali metal salt include: lithium salts such as lithium chloride, lithium bromide, lithium iodide, lithium perchlorate, lithium bis(trifluoromethanesulfonyl)diimide, lithium diisopropylimide, lithium acetate, lithium tetrafluoroborate, lithium pentafluorophosphate, and lithium tetracyanoborate; sodium salts such as sodium chloride, sodium bromide, sodium iodide, sodium perchlorate, sodium bis(trifluoromethanesulfonyl)diimide, sodium acetate, sodium tetrafluoroborate, sodium pentafluorophosphate, and lithium tetracyanoborate; and potassium salts such as potassium chloride, potassium bromide, potassium iodide, and potassium perchlorate. Among them, lithium bis(trifluoromethanesulfonyl)diimide and lithium diisopropylimide are preferable.

An amount of the alkali metal salt is preferably 1 part by mass or more but 50 parts by mass or less, more preferably 5 parts by mass or more but 30 parts by mass or less, relative to 100 parts by mass of the hole-transporting material.

The hole-transporting layer may have a single layer structure formed of a single material or may have a laminate structure including a plurality of compounds. When the hole-transporting layer has a laminate structure, it is preferable to use a polymer material in the hole-transporting layer near the second electrode. Use of the polymer material excellent in a film formation property is advantageous because it is possible to make the surface of the porous electron-transporting layer smoother and to improve the photoelectric conversion characteristics. In addition, the polymer material is not easily permeated into the inside of the porous electron-transporting layer. Therefore, the polymer material has an excellent property of covering the surface of the porous electron-transporting layer, and may achieve an effect of preventing short circuit when electrodes are provided.

The polymer material used in the hole-transporting layer is not particularly limited. Examples of the polymer material include known hole-transporting polymer materials.

Examples of the hole-transporting polymer material include polythiophene compounds, polyphenylene vinylene compounds, polyfluorene compounds, polyphenylene compounds, polyarylamine compounds, and polythiadiazole compounds.

Examples of the polythiophene compound include poly(3-n-hexylthiophene), poly(3-n-octyloxythiophene), poly(9, 9'-dioctyl-fluorene-co-bithiophene), poly(3,3-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene). Examples of the polyphenylene vinylene compound include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylen e-vinylene)].

Examples of the polyfluorene compound include poly(9, 9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyarylamine compound include poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-N,N'-bis(4-octyloxyphenyl)benzidine-N,N'-(1,4-diphenylene)], polyl[N,N-bis(4-octyloxyphenyl)benzidine-N,N'-(1,4-diphenylene)], polyl[N,N'-bis(4-(2-ethylhexyloxy)phenypbenzidine-N,N-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole).

Among them, polythiophene compounds and polyarylamine compounds are preferable in terms of carrier mobility and ionization potential.

Various additives may be added to the hole-transporting material.

Examples of the additive include basic compounds and alkali metal salts such as metal iodides (e.g., iodine, lithium iodide, sodium iodide, potassium iodide, cesium iodide, calcium iodide, copper iodide, iron iodide, and silver iodide), quarternary ammonium salts (e.g., tetraalkylammonium iodide and pyridinium iodide), metal bromides (e.g., lithium bromide, sodium bromide, potassium bromide, cesium bromide, and calcium bromide), bromine salts of quaternary ammonium compounds (e.g., tetraalkylammonium bromide and pyridinium bromide), metal chlorides (e.g., copper chloride and silver chloride), metal acetates (e.g., copper acetate, silver acetate, and palladium acetate), metal sulfates (e.g., copper sulfate and zinc sulfate), metal complexes (e.g., ferrocyanate-ferricyanate and ferrocene-ferricinium ion), sulfur compounds (e.g., sodium polysulfide and alkylthiol-alkyl disulfide), viologen dyes, hydroquinone, ionic liquids described in Inorg. Chem. 35 (1996) 1168 (e.g., 1,2-dimethyl-3-n-propylimidazolium 1-methyl-3-n-hexylimidazolium iodide, 1,2-dimethyl-3-ethylimidazolium trifluoromethanesulfonate, 1-methyl-3-butyllimidazolium nonafluorobutylsulfonate, and 1-methyl-3-ethylimidazolium bis(trifluoromethyl)sulfonyl imide), pyridine, 4-t-butylpyricline, benzimidazole, and derivatives thereof.

An average thickness of the hole-transporting layer is not particularly limited and may be appropriately selected depending on the intended purpose. The hole-transporting layer preferably has such a structure that the hole-transporting layer enters pores of the porous electron-transporting layer. The hole-transporting layer having an average thickness of 0.01 µm or more but 20 µm or less is more preferably disposed on the electron-transporting layer, the hole-transporting layer having an average thickness of 0.1 µm or more but 10 µm or less is still more preferably disposed on the electron-transporting layer, the hole-transporting layer having an average thickness of 0.2 µm or more but 2 µm or less is particularly preferably disposed on the electron-transporting layer.

The hole-transporting layer can be directly formed on the electron-transporting layer including the photosensitization compound. A method for producing the hole-transporting layer is not particularly limited and may be appropriately selected depending on the intended purpose. Examples of the method include a method for forming a thin film under vacuum such as vacuum deposition and the wet film formation method. Among them, particularly, the wet film formation method is preferable, a method for performing coating on the electron-transporting layer is preferable in terms of production cost.

When the wet film formation method is used, the coating method is not particularly limited and can be performed according to the methods known in the art. Examples thereof include the dip method, the spray method, the wire bar method, the spin-coating method, the roller coating method, the blade coating method, and the gravure coating method. Examples of the wet printing method include various methods such as relief printing, offset printing, gravure printing, intaglio printing, rubber plate printing, and screen printing.

The film may be formed in a supercritical fluid or a subcritical fluid having lower temperature and pressure than a critical point.

The supercritical fluid is not particularly limited and may be appropriately selected depending on the intended purpose, so long as it exists as a non-condensable high-density fluid in a temperature and pressure region exceeding the limit (critical point) at which gas and liquid can coexist, does not condense even when compressed, and is fluid in a state of being equal to or more than the critical temperature and the critical pressure. The supercritical fluid is preferably a supercritical fluid having a low critical temperature.

Examples of the supercritical fluid include carbon monoxide, carbon dioxide, ammonia, nitrogen, water, alcohol solvents, hydrocarbon solvents, halogen solvents, and ether solvents.

Examples of the alcohol solvent include methanol, ethanol, and n-butanol.

Examples of the hydrocarbon solvent include ethane, propane, 2,3-dimethylbutane, benzene, and toluene.

Examples of the halogen solvent include methylene chloride and chlorotrifluoromethane.

Examples of the ether solvent include dimethyl ether.

These may be used alone or in combination.

Among them, since carbon dioxide has a critical pressure of 7.3 MPa and a critical temperature of 31° C., it can easily generate a supercritical state, has incombustibility, and is easily handled, which is particularly preferable.

The subcritical fluid is not particularly limited and may be appropriately selected depending on the intended purpose so long as it exists as high-pressure liquid in a temperature and pressure region near the critical point.

The aforementioned compounds exemplified as the supercritical fluid can be suitably used as the subcritical fluid.

A critical temperature and a critical pressure of the supercritical fluid are not particularly limited and may be appropriately selected depending on the intended purpose. The critical temperature thereof is preferably −273° C. or more but 300° C. or less, particularly preferably 0° C. or more but 200° C. or less.

In addition to the supercritical fluid and the subcritical fluid, an organic solvent or an entrainer may be used in combination. The solubility in the supercritical fluid can be more easily adjusted by addition of the organic solvent or the entrainer.

The organic solvent is not particularly limited and may be appropriately selected depending on the intended purpose. Examples thereof include ketone solvents, ester solvents, ether solvents, amide solvents, halogenated hydrocarbon solvents, and hydrocarbon solvents.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane.

Examples of the amide solvent include N,N-dimethylformamide, N,N-dimethylacetamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

A press treatment may be performed after the organic hole-transporting material is provided on the electron-transporting layer containing the electron-transporting material to which the photosensitization compound has been adsorbed. It is believed that the press treatment allows the organic hole-transporting material to further adhere to the electron-transporting layer that is a porous electrode, resulting in improvement of efficiency.

The press treatment is not particularly limited and may be appropriately selected depending on the intended purpose. Examples of the press treatment include: a press molding method using a plate represented by an IR tablet molding device; and a roll press method using a roller.

The pressure of the press treatment is preferably 10 kgf/cm$^2$ or more, more preferably 30 kgf/cm$^2$ or more.

The time of the press treatment is not particularly limited and may be appropriately selected depending on the intended purpose. The time thereof is preferably 1 hour or shorter. Moreover, heat may be applied at the time of the press treatment.

At the time of the press treatment, a release agent may be disposed between a pressing machine and electrodes.

Examples the release agent include fluororesins, such as polyethylene tetrafluoride, polychloroethylene trifluoride, ethylene tetrafluoride-propylene hexafluoride copolymers, perfluoroalkoxy fluoride resins, polyvinylidene fluoride, ethylene-ethylene tetrafluoride copolymers, ethylene-chloroethylene trifluoride copolymers, and polyvinyl fluoride. These may be used alone or in combination.

A metal oxide may be disposed between the organic hole-transporting material and the second electrode after the press treatment but before disposition of the second electrode.

Examples of the metal oxide include molybdenum oxide, tungsten oxide, vanadium oxide, and nickel oxide. These may be used alone or in combination. Among them, molybdenum oxide is preferable.

A method for disposing the metal oxide on the hole-transporting layer is not particularly limited and may be appropriately selected depending on the intended purpose. Examples of the method include a method where a thin film is formed in vacuum (e.g., sputtering and vacuum vapor deposition), and the wet film formation method.

The wet film formation method is preferably a method where a paste obtained by dispersing powder or sol of the metal oxide is prepared and is coated on the hole-transporting layer.

In the case where the wet film formation method is used, a coating method is not particularly limited and may be appropriately selected depending on the intended purpose. Examples of the coating method include the clip method, the spraying method, the wire bar method, the spin coating method, the roller coating method, the blade coating method, and the gravure coating method. Examples of the wet printing method include relief printing, offset printing, gravure printing, intaglio printing, rubber plate printing, and screen printing.

An average thickness of the metal oxide coated is preferably 0.1 nm or more but 50 nm or less, more preferably 1 nm or more but 10 nm or less.

<Second Electrode>

The second electrode can be formed on the hole-transporting layer or on a metal oxide on the hole-transporting layer.

The same as the first electrode can be generally used for the second electrode. In such a configuration that strength or airtightness is sufficiently maintained, a support is not always necessary.

A material of the second electrode is not particularly limited and may be appropriately selected depending on the intended purpose. Examples of the material of the second electrode include metals, carbon compounds, conductive metal oxides, and conductive polymers.

Examples of the metal include platinum, gold, silver, copper, and aluminum.

Examples of the carbon compound include graphite, fullerene, carbon nanotube, and graphene.

Examples of the conductive metal oxide include ITO, FTO, and ATO.

Examples of the conductive polymer include polythiophene and polyaniline.

These may be used alone or in combination.

The second electrode can be appropriately formed on the hole-transporting layer by methods such as the coating method, the lamination method, the deposition method, the CVD method, and the pasting method, depending on kinds of materials to be used and kinds of the hole-transporting layer.

In the photoelectric conversion element, it is preferable that at least one of the first electrode and the second electrode be substantially transparent. Preferably, a side of the first electrode is transparent, and a method for receiving incident light from the side of the first electrode is used. In this case, a material that reflects light is preferably used at a side of the second electrode, and glass, plastic, or a metal thin film on which a metal or a conductive oxide is deposited is preferably used. In addition, provision of an anti-reflection layer at a side where the incident light is to be received is an effective means.

<Third Electrode>

A shape and size of the third electrode are not particularly limited and may be appropriately selected depending on the intended purpose.

The third electrode is produced, for example, at the same time when the first electrode is produced.

Therefore, the third electrode has the same material, structure, and thickness as those of the first electrode.

<Sealing Part>

It is preferable to include a sealing part configured to shield at least the photoelectric conversion layer from an external environment.

The sealing part is sandwiched by a pair of substrates, at least the electron-transporting layer and the hole-transporting layer may be shielded from an external environment, and the sealing part of the photoelectric conversion element may include a hollow section.

A position of the sealing part is not particularly limited and may be appropriately selected depending on the intended purpose, so long as the sealing member is disposed at a position at which at least the electron-transporting layer and the hole-transporting layer are shielded from an external environment. For example, the sealing member may be provided on the whole surface so as to cover the electron-transporting layer, the hole-transporting layer, and the second electrode. Alternatively, a substrate may be provided above a second electrode, and the sealing member may be provided at external edges of the substrate so as to attach the sealing member to at least one of the first substrate, the first electrode, and the hole blocking layer.

In such a configuration that a substrate is provided and the sealing member is provided at external edges of the substrate as described in the latter, a hollow section can be provided inside the photoelectric conversion element or the photoelectric conversion module. The hollow section can control oxygen and humidity, and is effective in improving output or durability.

The sealing member is not particularly limited and may be appropriately selected depending on the intended purpose, so long as it inhibits entry of water vapor of the air. Examples of the sealing member include low melting point fritted glass, ultraviolet ray curable resins such as epoxy resins and acrylic resins, and thermosetting resins. These may be used alone or in combination. In addition to the aforementioned constitution materials, a drying agent may be mixed to further inhibit entry of water vapor.

An epoxy resin is preferably used as the sealing member.

In the case where the epoxy resin is used as the sealing member and the hole-transporting layer includes at least one selected from the group consisting of a tertiary amine compound represented by the General Formula (1) and a tertiary amine compound represented by the General Formula (2), even when the photoelectric conversion element is stored under high temperature and high humidity conditions, it can maintain high output obtained before the storage.

In addition, because flexibility of a cured product and adhesiveness to the substrate can be favorably maintained, good mechanical durability can also be obtained.

The epoxy resin is not particularly limited and may be appropriately selected depending on the intended purpose, so long as it is a resin obtained by curing a monomer or an oligomer including an epoxy group in a molecule thereof. Examples of the epoxy resin include water-dispersing epoxy resins, non-solvent epoxy resins, solid-type epoxy resins, thermosetting epoxy resins, curing agent-mixed epoxy resins, and ultraviolet ray-curable epoxy resins Among them, thermosetting epoxy resins and ultraviolet ray-curable epoxy resins are preferable, ultraviolet ray-curable epoxy resins are more preferable. Note that, ultraviolet ray-curable epoxy resins may be heated.

Examples of the epoxy resin include bisphenol A-based epoxy resins, bisphenol F-based epoxy resins, novolac-based epoxy resins, alicyclic epoxy resins, long-chain aliphatic epoxy resins, glycidyl amine-based epoxy resins, glycidyl ether-based epoxy resins, and glycidyl ester-based epoxy resins. These may be used alone or in combination.

The epoxy resin may include a curing agent and various additives if necessary.

Examples of the curing agent include amine-based curing agents, acid anhydride-based curing agents, polyamide-based curing agents, and other curing agents.

Examples of the amine-based curing agent include: aliphatic polyamine such as diethylenetriamine and triethylenetetramine; and aromatic polyamine such as metaphenylenediamine, diaminodiphenylmethane, and diaminodiphenylsulfone.

Examples of the acid anhydride-based curing agent include phthalic anhydride, tetrahydrophthalic anhydride, hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. These may be used alone or in combination.

Examples of the additive include fillers, spacers, polymerization initiators, drying agents (moisture absorbents), curing accelerators, coupling agents, flexibilizers, colorants, flame retardant auxiliaries, antioxidants, and organic solvents. These may be used alone or in combination. Among them, fillers, gap agents, curing accelerators, polymerization initiators, and drying agents (moisture absorbents) are preferable, and fillers and polymerization initiators are particularly preferable.

—Filler—

The filler is effective in preventing entry of moisture or oxygen under an external environment. In addition, the filler can obtain effects such as a decrease in volumetric shrinkage at the time of curing, a decrease in an amount of gas generated at the time of curing or heating, improvement of mechanical strength, and control of thermal conductivity or fluidity, and is considerably effective in maintaining a stable output under various environments in the present disclosure.

Regarding the output characteristics or the durability of the photoelectric conversion element, not only an influence by moisture or oxygen entering into the photoelectric conversion element from an external environment but also an influence by gas generated at the time of heating and curing the sealing member cannot be ignored. Particularly, an influence by the gas generated at the time of heating greatly affects the output characteristics when the photoelectric conversion element is stored under a high temperature environment.

In this case, when the filler, the gap agent, and the drying agent are included in the sealing member, they can prevent entry of moisture or oxygen, and can decrease an amount of the sealing member used, which makes it possible to obtain an effect of decreasing generation of gas. This is effective not only at the time of curing but also when the photoelectric conversion element is stored under a high temperature environment.

The filler is not particularly limited and known products may be used. Preferable examples of the filler include inorganic fillers such as crystalline or amorphous silica, talc, alumina, aluminum nitride, silicon nitride, calcium silicate, and calcium carbonate. These may be used alone or in combination.

An average primary particle diameter of the filler is preferably 0.1 μm or more but 10 μm or less, more preferably 1 μm or more but 5 μm or less. The average primary particle diameter of the filler satisfying 0.1 μm or more but 10 μm or less is effective, because an effect of preventing entry of moisture or oxygen can be sufficiently achieved, the viscosity becomes appropriate, adhesiveness to a substrate or a defoaming property is improved, and control of the width of the sealing part and workability are achieved.

It is preferable that the filler be uniformly disposed in the sealing part. This makes it possible to sufficiently obtain an effect of inhibiting entry of moisture or oxygen. When a gap agent or a spacer is used, a layer in which the density of the filler is low may be formed near its boundary. In this case, an effect of inhibiting entry of moisture or oxygen can be sufficiently obtained by lengthening, in the width direction of the sealing part, a distance of the layer in which the density of the filler is low. The density of the filler can be measured by, for example, a scanning electron microscope (SEM).

An amount of the filler is preferably 10 parts by mass or more but 90 parts by mass or less, more preferably 20 parts by mass or more but 70 parts by mass or less, relative to the total amount of the sealing member. When the amount of the filler is 10 parts by mass or more but 90 parts by mass or less, an effect of preventing entry of moisture or oxygen can be sufficiently obtained, the viscosity becomes appropriate, and adhesiveness and workability are good.

—Gap Agent—

The gap agent is called a gap controlling agent or a spacer agent, and can control gap of the sealing part. For example, when a sealing member is provided on a first substrate or a first electrode and a second substrate is provided thereon for sealing, a gap of the sealing part is matched with a size of the gap agent because the gap agent is mixed in an epoxy resin. As a result, it is possible to easily control the gap of the sealing part.

As the gap agent, known materials in the art can be used so long as it has a particulate shape and a uniform particle diameter, and has high solvent resistance and high heat resistance. Those having a high affinity with the epoxy resin and having a spherical particulate shape are preferable.

Specific examples thereof include glass beads, silica particles, and organic resin particles. These may be used alone or in combination.

A particle diameter of the gap agent can be selected depending on a gap of the sealing part to be set. The particle diameter of the gap agent is preferably 1 μm or more but 100 μm or less, more preferably 5 μm or more but 50 μm or less.

As another method for controlling gap of the sealing part, a spacer may be disposed.

The spacer may be disposed at any place so long as it is positioned at a peripheral part of the photoelectric conversion layer. For example, the spacer may be disposed, for example, on the first substrate, on the first electrode, on the hole blocking layer, on the deletion layer, on the second electrode, or on the second substrate. The spacer may be disposed on a combination of the foregoing.

The spacer may be disposed outside the sealing part or may be incorporated inside the sealing part.

A material of the spacer is not particularly limited and may be appropriately selected depending on the intended purpose so long as it inhibits entry of water vapor of the air. Examples of the material include glass materials, metal materials, metal oxide materials, ultraviolet ray curable resins such as an epoxy resin or an acrylic resin, and thermosetting resins. These may be used alone or in combination.

—Polymerization Initiator—

The polymerization initiator is a material that is added for the purpose of initiating polymerization using heat or light. Examples of the polymerization initiator include thermal polymerization initiators and photopolymerization initiators.

The thermal polymerization initiator is a compound that generates active species such as radicals or cations through heating. Specific examples of the thermal polymerization initiator include azo compounds such as 2,2'-azobisbutyronitrile (AIBN) and peroxides such as benzoyl peroxide (BPO).

Examples of the thermal cationic polymerization initiator include benzenesulfonic acid esters and alkyl sulfonium salts.

As the photopolymerization initiator, a photocationic polymerization initiator is preferably used in the case of the epoxy resin. When the photocationic polymerization initiator is mixed with the epoxy resin and light is emitted, the photocationic polymerization initiator is decomposed to generate strong acid, and the acid induces polymerization of the epoxy resin. Then, curing reaction proceeds. The photocationic polymerization initiator has such effects that volumetric shrinkage during curing is low, oxygen inhibition does not occur, and storage stability is high.

Examples of the photocationic polymerization initiator include aromatic diazonium salts, aromatic iodonium salts, aromatic sulfonium salts, metallocene compounds, and silanol-aluminum complexes. Moreover, a photoacid generator having a function of generating an acid upon irradiation of light can also be used.

The photoacid generator functions as an acid for initiating cationic polymerization. Examples of the photoacid generator include onium salts such as ionic sulfonium salt-based onium salts and ionic iodonium salt-based onium salts including a cation part and an anionic part. These may be used alone or in combination.

An amount of the polymerization initiator is preferably 0.5 parts by mass or more but 10 parts by mass or less, more preferably 1 part by mass or more but 5 parts by mass or less relative to the total amount of the sealing member. The amount of the polymerization initiator satisfying 0.5 parts by mass or more but 10 parts by mass or less allows curing to proceed appropriately, can decrease the remaining uncured products, and can prevent the amount of generated gas from being excessive, which is effective.

—Drying Agent—

The drying agent is also called a moisture absorbent and is a material having a function of physically or chemically adsorbing or absorbing moisture. Inclusion of the drying agent in the sealing member is effective because moisture resistance may be further improved and influence of the outgas can be decreased in some cases.

The drying agent is preferably particulate. Examples of the drying agent include inorganic water-absorbing materials such as calcium oxide, barium oxide, magnesium oxide, magnesium sulfate, sodium sulfate, calcium chloride, silica gel, molecular sieve, and zeolite. These may be used alone or in combination. Among them, zeolite is preferable because zeolite absorbs a large amount of moisture.

—Curing Accelerator—

The curing accelerator is also called a curing catalyst and is used for the purpose of accelerating a curing speed. The curing accelerator is mainly used for a thermosetting epoxy resin.

Examples of the curing accelerator include: tertiary amine or tertiary amine salts such as DBU (1,8-diazabicyclo(5,4,0)-undecene-7) and DBN (1,5-diazabicyclo(4,3,0)-nonene-5); imidazole-based compounds such as 1-cyanoethyl-2-ethyl-4-methylimidazole and 2-ethyl-4-methylimidazole; and phosphine or phosphonium salts such as triphenylphosphine and tetraphenylphosphonium-tetraphenyl borate.

These may be used alone or in combination.

—Coupling Agent—

The coupling agent has an effect of enhancing a bonding force between molecules, and examples of the coupling agent include silane coupling agents. Specific examples thereof include: silane coupling agents such as 3-glycidoxypropyltrimethoxysilane, 3-glycidoxypropylmethyldimethoxysilane, 2-(3,4-epoxycyclohexy)ethyltrimethoxysilane, N-phenyl-γ-aminopropyltrimethoxysilane, N-(2-aminoethyl)3-aminopropylmethyldimethoxysilane, N-(2-aminoethyl)3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl)3-aminopropyltrimethoxysilane hydrochloride, and 3-methacryloxypropyltrimethoxysilane. These may be used alone or in combination.

As the sealing member, epoxy resin compositions that are commercially available as sealing materials, seal materials, or adhesives have been known, and can be effectively used in the present disclosure. Among them, there are epoxy resin compositions that are developed and are commercially available to be used in solar cells or organic EL elements, and can be particularly effectively used in the present disclosure.

Examples of the commercially available products include product names: TB3118, TB3114, TB3124, and TB3125F (all of which are available from ThreeBond), World Rock 5910, World Rock 5920, and World Rock 8723 (all of which are available from Kyoritsu Chemical & Co., Ltd.), and WB90US(P) (available from MORESCO).

The epoxy resin compositions are disclosed in, for example, Japanese Patent No. 4918975, Japanese Patent No. 5812275, Japanese Patent No. 5835664, Japanese Patent No. 5930248, and Japanese Unexamined Patent Application Publication No. 2012-136614, and these epoxy resin compositions may also be used.

In the present disclosure, a sheet-shaped sealing material may also be effectively used.

The sheet-shaped sealing material is a sheet on which an epoxy resin layer has been formed on the sheet in advance. As the sheet, for example, glass or a film having high gas barrier properties may be used, and the sheet-shaped sealing material corresponds to a substrate in the present disclosure. When the sheet-shaped sealing material is pasted on the second electrode of the photoelectric conversion element or the photoelectric conversion module, followed by curing, the sealing member and the substrate can be formed at one time. Depending on formation patterns of the epoxy resin layer formed on the sheet, a hollow section can be provided in the photoelectric conversion element, which is effective.

Preferably, the hollow section includes particularly oxygen. Inclusion of oxygen makes it possible to stably maintain a function of transporting holes of the hole-transporting layer for a long period of time, and to improve durability of the photoelectric conversion element or the photoelectric conversion module. An oxygen concentration of the hollow section inside the photoelectric conversion element disposed through sealing can achieve effects so long as oxygen is included. The oxygen concentration is preferably 1.0% by volume or more but 21.0% by volume or less, more preferably 3.0% by volume or more but 15.0% by volume or less.

The oxygen concentration of the hollow section can be controlled by performing the sealing in a glove box in which the oxygen concentration has been set. The oxygen concentration can be set by a method using a gas cylinder having a specific oxygen concentration or by a method using a nitrogen gas generator. The oxygen concentration in a glove box is measured using a commercially available oxygen concentration meter or oxygen monitor.

The oxygen concentration inside the hollow section formed through the sealing can be measured through, for example, an atmospheric pressure ionization mass spectrometer (API-MS). Specifically, the photoelectric conversion element or photoelectric conversion module is placed in a chamber filled with inert gas, and the sealed part is opened in the chamber. Then, the gas in the chamber is subjected to quantitative analysis through API-MS, and all the components in the gas contained in the hollow section are quantified. A ratio of oxygen to a total of the all components can be calculated to determine an oxygen concentration.

Gas other than oxygen is preferably inert gas. Examples of the inert gas include nitrogen and argon.

When the sealing is performed, the oxygen concentration and the dew point in a glove box are preferably controlled, and such a control is effective in improving the output and the durability.

The dew point is defined as a temperature at which condensation starts when water vapor-containing gas is cooled.

The dew point is preferably 0° C. or less, more preferably −20° C. or less. The lower limit thereof is preferably −50° C. or more.

Moreover, a passivation layer may be disposed between the second electrode and the sealing member. The passivation layer is not particularly limited and may be appropriately selected depending on the intended purpose. For example, aluminum oxide, silicon nitride, and silicon oxide are preferable.

A method for forming the sealing member is not particularly limited and may be appropriately selected depending on the intended purpose. Examples of the method include the dispensing method, the wire bar method, the spin-coating method, the roller coating method, the blade coating method, the gravure coating method, the relief printing, the offset printing, the intaglio printing, the rubber plate printing, and the screen printing.

<Method for Producing Photoelectric Conversion Element>

A method for producing a photoelectric conversion element is not particularly limited and may be appropriately selected depending on the intended purpose.

One example of a method for producing a photoelectric conversion element will be described with reference to FIG. 5A to FIG. 5F. Here, a method for producing the photoelectric conversion element presented in FIG. 1D will be described by focusing on a method for producing the shape of the edge part of the photoelectric conversion element.

On a substrate 1, a place where a division part is to be formed is provided. Then, a laminated plate, on which a first electrode 2, a hole blocking layer 3, and a third electrode 12 have been formed, is provided (FIG. 5C).

The division part may be produced through pattern film formation by protecting, with a resist or a mask, the place where the division part is to be formed when a film of the first electrode 2 and a film of the hole blocking layer 3 are formed.

When the laminated plate on which the hole blocking layer 3 has been also stacked is used to form the division part later, the division part can be formed in the following manner.

Figure 5A:
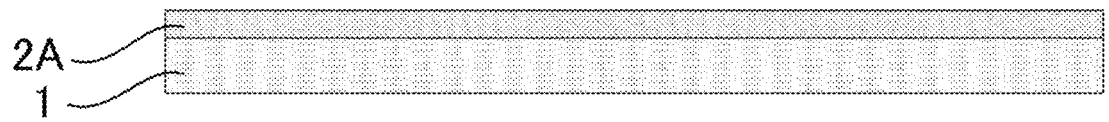
FIG. 5A is a view for explaining one example of a method for producing a photoelectric conversion element (part 1)

First, a laminated plate on which a precursor 2A of a first electrode has been formed is provided on the substrate 1 (FIG. 5A). Note that, a material of the precursor 2A of the first electrode is the same as the material of the first electrode 2.

Figure 5B:
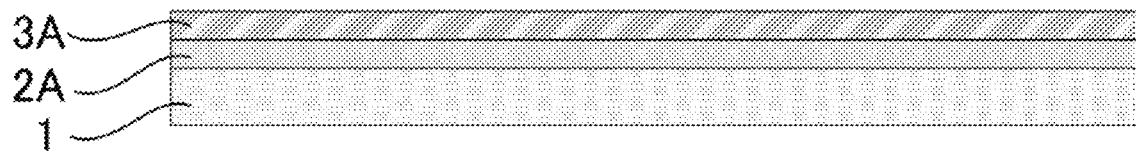
FIG. 5B is a view for explaining one example of a method for producing a photoelectric conversion element (part 2)
Figure 5C:
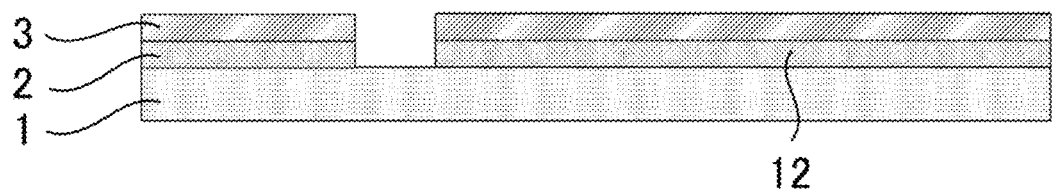
FIG. 5C is a view for explaining one example of a method for producing a photoelectric conversion element (part 3)

Next, on the precursor 2A of the first electrode, a precursor 3A of a hole blocking layer is formed (FIG. 5B). Note that, a material of the precursor 3A of the hole blocking layer is the same as the material of the hole blocking layer 3.

Then, the precursor 2A of the first electrode and the precursor 3A of the hole blocking layer are partially removed from a side of the substrate 1 to produce a division part (FIG. 5C).

A method for forming the division part is not particularly limited and may be appropriately selected depending on the intended purpose. Examples of the method include the sand blasting method, the water blasting method, the polishing method, the chemical etching method, and the laser processing method is preferable.

When the precursor 2A of the first electrode and the precursor 3A of the hole blocking layer in the place where the division part is to be formed are removed, the first electrode 2 and the hole blocking layer 3 are formed in a place where a photoelectric conversion part is to be formed. Moreover, in a place where an electrode contact part is to be formed, the third electrode 12 is formed.

Figure 5D:
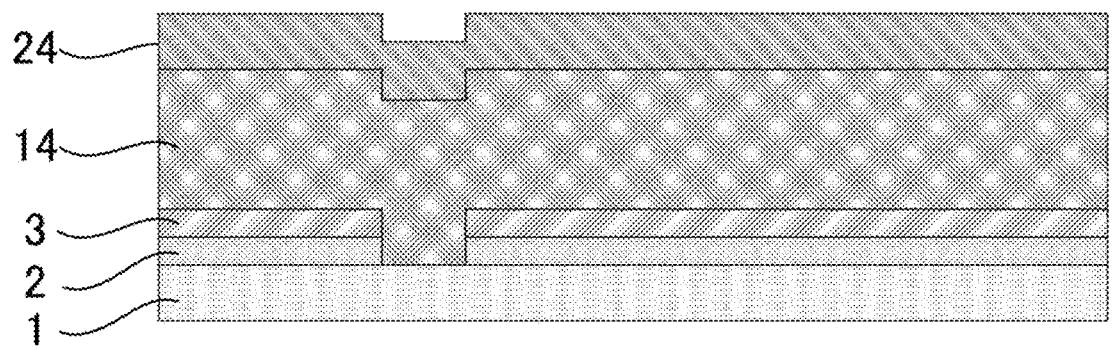
FIG. 5D is a view for explaining one example of a method for producing a photoelectric conversion element (part 4)

An electron-transporting layer 14 and a hole-transporting layer 24 are formed in all of the place where the photoelectric conversion part is to be formed, the place where the division part is to be formed, and the place where the electrode contact part is to be formed (FIG. 5D).

Figure 5E:
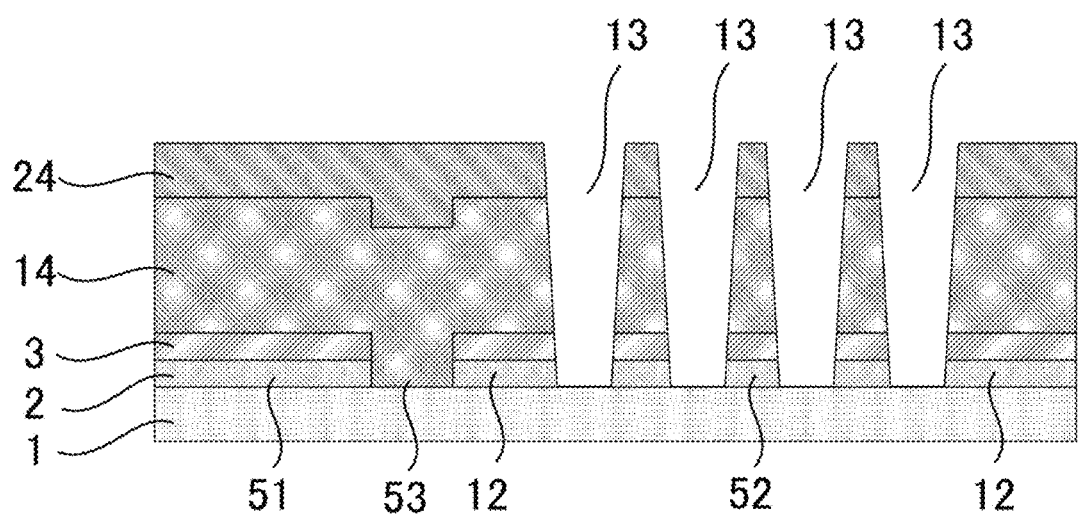
FIG. 5E is a view for explaining one example of a method for producing a photoelectric conversion element (part 5)

Then, in the place where the electrode contact part is to be formed, a plurality of through holes 13, which reach the surface of the substrate 1 from the hole-transporting layer 24, are formed (FIG. 5E). A method for forming the through holes 13 is not particularly limited and may be appropriately selected depending on the intended purpose. Examples of the method include the sand blasting method, the water blasting method, the polishing method, the chemical etching method, and the laser processing method. Among them, the laser processing method is preferable. This makes it possible to form fine holes without using, for example, sand, etching, and a resist and to cleanly perform processing with good reproducibility.

Figure 5F:
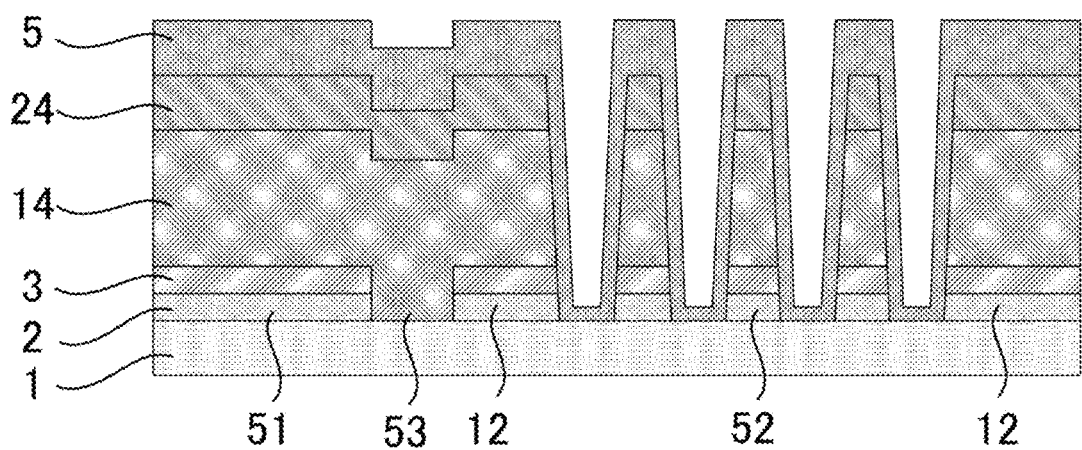
FIG. 5F is a view for explaining one example of a method for producing a photoelectric conversion element (part 6)

Then, a second electrode 5 is formed on the hole-transporting layer 24 and the through holes 13 in all of the place where the photoelectric conversion part is to be formed, the place where the division part is to be formed, and the place where the electrode contact part is to be formed (FIG. 5F).

As described above, the photoelectric conversion element presented in FIG. 1D can be obtained.

<Electronic Device>

An electronic device according to the present disclosure includes the photoelectric conversion element and/or the photoelectric conversion module of the present disclosure, and a device configured to be driven by electric power generated through photoelectric conversion of the photoelectric conversion element and/or the photoelectric conversion module, and further includes other devices if necessary.

<Power Supply Module>

A power supply module according to the present disclosure includes the photoelectric conversion element and/or the photoelectric conversion module of the present disclosure and a power supply IC, and further includes other devices if necessary.

A specific embodiment of an electronic device including the photoelectric conversion element and/or the photoelectric conversion module of the present disclosure, and a device configured to be driven by electric power obtained through power generation of the photoelectric conversion element and/or the photoelectric conversion module will be described.

Figure 6:
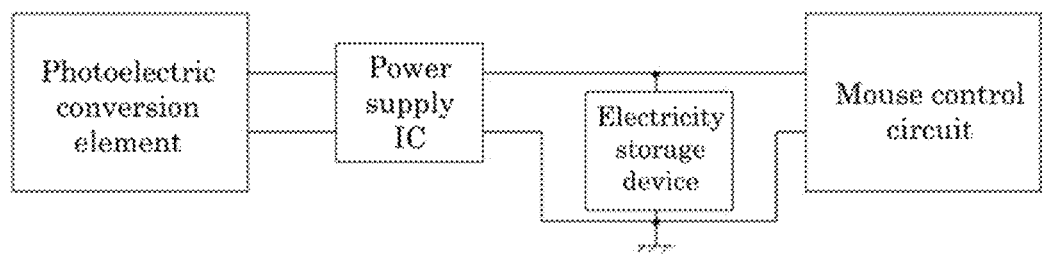
FIG. 6 is a schematic view presenting one example where a mouse is used as an electronic device.

FIG. 6 presents one example where a mouse is used as the electronic device.

As presented in FIG. 6, a photoelectric conversion element and/or a photoelectric conversion module, a power supply IC, and an electricity storage device are combined and the supplied electric power is allowed to pass to a power supply of a control circuit of a mouse. As a result, the electricity storage device is charged when the mouse is not used, and the mouse can be driven by the electric power, and therefore such a mouse that does not require wiring or replacement of a cell can be obtained. Because a cell is not required, a weight thereof can be decreased, which is effective.

Figure 7:
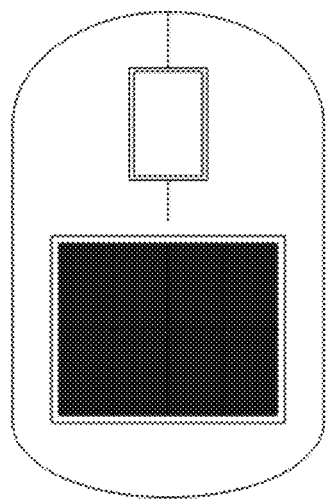
FIG. 7 is a schematic view presenting one example where a photoelectric conversion element is mounted in a mouse.

FIG. 7 presents a schematic view where a photoelectric conversion element is mounted in a mouse. A photoelectric conversion element, a power supply IC, and an electricity storage device are mounted inside a mouse, but an upper part of the photoelectric conversion element is covered with a transparent housing so that the photoelectric conversion element receives light. Moreover, the whole housing of the mouse can be formed by a transparent resin. The arrangement of the photoelectric conversion element is not limited to the above. For example, the photoelectric conversion element may be arranged in a position with which light is irradiated even when the mouse is covered with a hand, and such arrangement may be preferable.

Another embodiment of an electronic device including the photoelectric conversion element anchor the photoelectric conversion module of the present disclosure, and a device configured to be driven by electric power obtained through power generation of the photoelectric conversion element and/or the photoelectric conversion module will be described.

Figure 8:
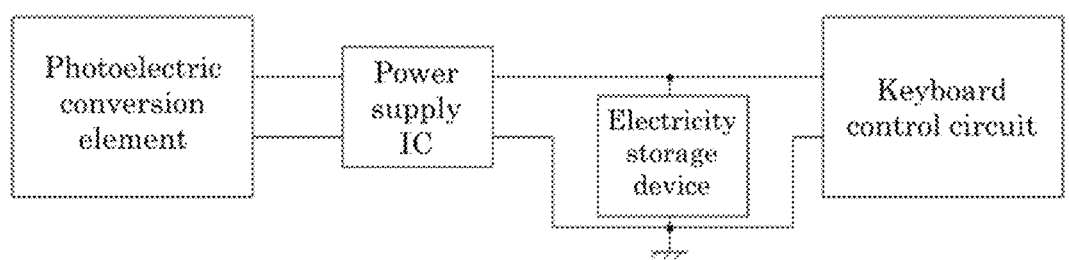
FIG. 8 is a schematic view presenting one example where a keyboard used in a personal computer is used as an electronic device.

FIG. 8 presents one example where a keyboard used in a personal computer is used as the electronic device.

As presented in FIG. 8, a photoelectric conversion element, a power supply IC, and an electricity storage device are combined, and the supplied electric power is allowed to pass to a power supply of a control circuit of a keyboard. As a result, the electricity storage device is charged when the keyboard is not used, and the keyboard can be driven by the electric power. Therefore, such a keyboard that does not require wiring or replacement of a cell can be obtained. Because a cell is not required, a weight thereof can be decreased, which is effective.

Figure 9:
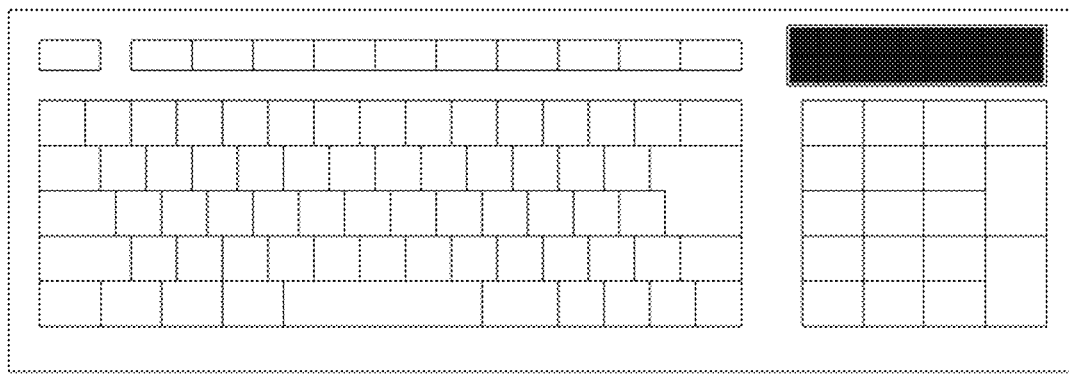
FIG. 9 is a schematic view presenting one example where a photoelectric conversion element is mounted in a keyboard.

FIG. 9 presents a schematic view in which a photoelectric conversion element is mounted in a keyboard. A photoelectric conversion element, a power supply IC, and an electricity storage device are mounted inside the keyboard, but an upper part of the photoelectric conversion element is covered with a transparent housing so that the photoelectric conversion element receives light. The whole housing of the keyboard can be formed by a transparent resin. The arrangement of the photoelectric conversion element is not limited to the above.

Figure 10:
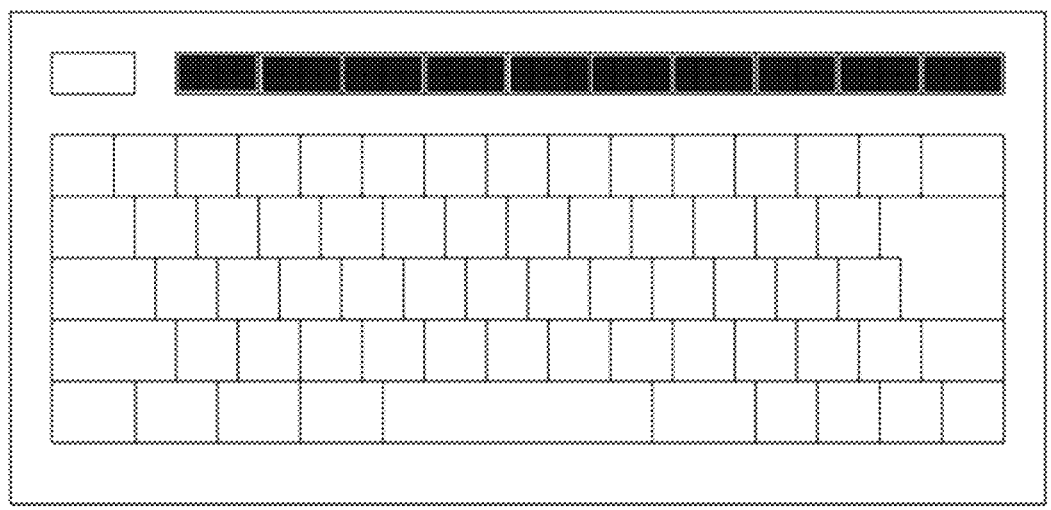
FIG. 10 is a schematic view presenting one example where a small photoelectric conversion element is mounted in some keys of a keyboard.

In the case of a small keyboard in which a space for incorporating the photoelectric conversion element is small, a small photoelectric conversion element may be embedded in some keys as presented in FIG. 10, and such arrangement is effective.

Another embodiment of an electronic device including the photoelectric conversion element and/or the photoelectric conversion module of the present disclosure, and a device configured to be driven by electric power obtained through power generation of the photoelectric conversion element and/or the photoelectric conversion module will be described.

Figure 11:
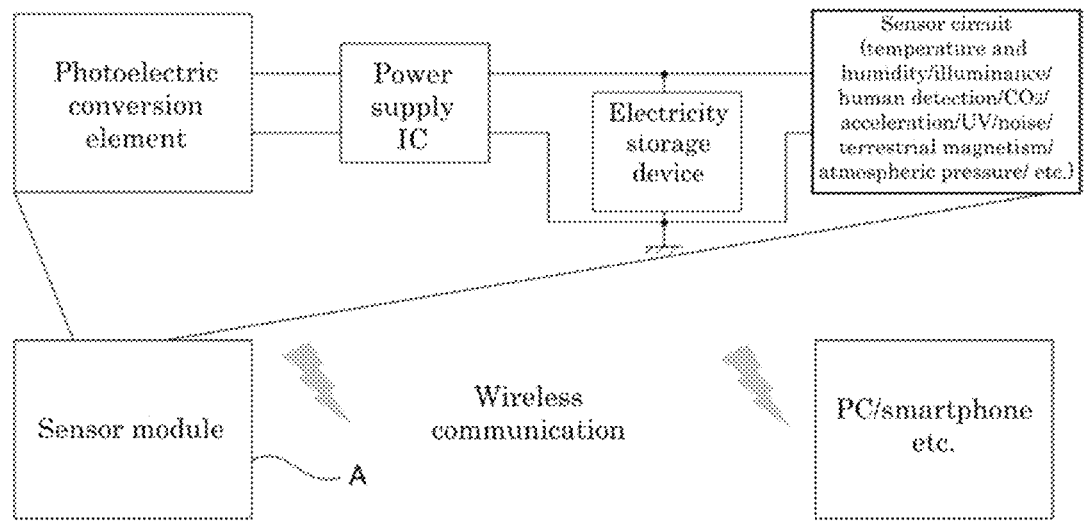
FIG. 11 is a schematic view presenting one example where a sensor is used as an electronic device.

FIG. 11 presents one example where a sensor is used as the electronic device.

As presented in FIG. 11, a photoelectric conversion element, a power supply IC, and an electricity storage device are combined, and the supplied electric power is allowed to pass to a power supply of a sensor circuit. As a result, a sensor module can be constituted without requiring connection to an external power supply and without requiring replacement of a cell. A sensing target is, for example, temperature and humidity, illuminance, human detection, $CO_2$, acceleration, UV, noise, terrestrial magnetism, and atmospheric pressure, and such an electronic device can be applied to various sensors, which is effective. As presented in A in FIG. 11, the sensor module is configured to sense a target to be measured on a regular basis and to transmit the read data to a personal computer (PC) or a smartphone through wireless communication.

It is expected that use of sensors is significantly increased as the internet of things (IoT) society approaches. Replacing batteries of numerous sensors one by one is time consuming and is not realistic. Moreover, the fact that a sensor is installed at a position such as a ceiling and a wall where a cell is not easily replaced also makes workability bad. Moreover, supplying electric power by the photoelectric conversion element is also a significantly large advantage. In addition, the photoelectric conversion element of the present disclosure has advantages that a high output can be obtained even with light of low illuminance and a high degree of freedom in installation can be achieved because dependence of light incident angle for the output is small.

Next, another embodiment of an electronic device including the photoelectric conversion element and/or the photoelectric conversion module of the present disclosure and a device configured to be driven by electric power obtained through power generation of the photoelectric conversion element and/or the photoelectric conversion module will be described.

Figure 12:
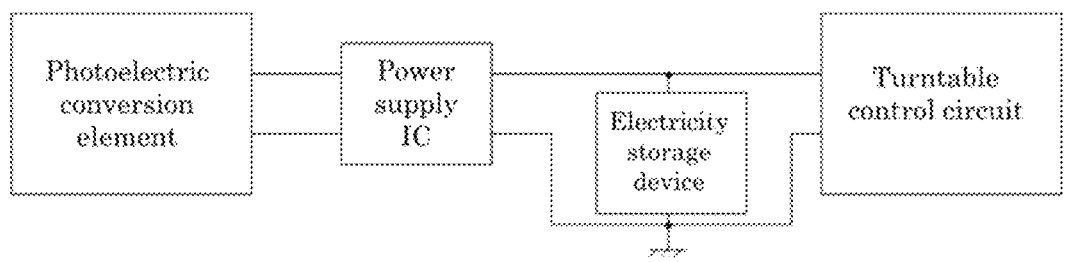
FIG. 12 is a schematic view presenting one example where a turntable is used as an electronic device.

FIG. 12 presents one example in which a turntable is used as the electronic device.

As presented in FIG. 12, the photoelectric conversion element, a power supply IC, and an electricity storage device are combined, and the supplied electric power is allowed to pass to a power supply of a turntable control circuit. As a result, a turntable can be constituted without requiring connection to an external power supply and without requiring replacement of a cell.

The turntable is used, for example, in a display case in which products are displayed. Wiring of a power supply degrades appearance of the display, and moreover displayed products need to be removed at the time of replacing a cell, which is time-consuming. Use of the photoelectric conversion element of the present disclosure is effective because the aforementioned problems can be solved.

<Use>

As described above, the electronic device including the photoelectric conversion element and/or the photoelectric conversion module of the present disclosure and the device configured to be driven by electric power obtained through power generation of the photoelectric conversion element and/or the photoelectric conversion module, and the power supply module have been described above. However, the embodiments described are only part of applicable embodiments, and use of the photoelectric conversion element or the photoelectric conversion module of the present disclosure is not limited to the above-described uses.

The photoelectric conversion element and/or the photoelectric conversion module can be applied for, for example, a power supply device by combining it with, for example, a circuit board configured to control generated electric current.

Examples of devices using the power supply device include electronic desk calculators, watches, mobile phones, electronic organizers, and electronic paper.

Moreover, a power supply device including the photoelectric conversion element can be used as an auxiliary power supply for prolonging a continuous operating time of a charge-type or dry cell-type electronic equipment.

The photoelectric conversion element and the photoelectric conversion module of the present disclosure can function as a self-sustaining power supply, and electric power generated through photoelectric conversion can be used to drive a device. Because the photoelectric conversion element and the photoelectric conversion module of the present disclosure can generate electricity by irradiation of light, it is not necessary to couple the electronic device to a power supply or to replace a cell. Therefore, the electronic device can be driven in a place where there is no power supply facility, the electronic device can be worn or carried, and the electronic device can be driven without replacement of a cell even in a place where a cell is not easily replaced. Moreover, when a dry cell is used, the electronic device becomes heavy by a weight of the dry cell, or the electronic device becomes large by a size of the dry cell. Therefore, there may be a problem in installing the electronic device on a wall or ceiling, or transporting the electronic device. Because the photoelectric conversion element and the photoelectric conversion module of the present disclosure are light and thin, they can be freely installed, and can be worn and carried, which is advantageous.

As described above, the photoelectric conversion element and the photoelectric conversion module of the present disclosure can be used as a self-sustaining power supply, and can be combined with various electronic devices. For example, the photoelectric conversion element and the photoelectric conversion module of the present disclosure can be used in combination with numerous electronic devices such as a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a human detection sensor), a transmitter (e.g., a beacon and a global positioning system (GPS)), an auxiliary lamp, and a remote controller.

The photoelectric conversion element and the photoelectric conversion module of the present disclosure are widely applied because they can generate electricity particularly with light of low illuminance and can generate electricity indoors and in further darker shade. Moreover, the photoelectric conversion element and the photoelectric conversion module are highly safe because liquid leakage found in the case of a dry cell does not occur and accidental ingestion found in the case of a button cell does not occur. Furthermore, the photoelectric conversion element and the photoelectric conversion module can be used as an auxiliary power supply for the purpose of prolonging a continuous operation time of a charge-type or dry cell-type electronic equipment. As described above, when the photoelectric conversion element and the photoelectric conversion module of the present disclosure are combined with a device configured to be driven by electric power generated through photoelectric conversion of the photoelectric conversion element and the photoelectric conversion module, it is possible to obtain an electronic device that is light and easy to use, has a high degree of freedom in installation, does not require replacement of a cell, is excellent in safety, and is effective in decreasing environmental loads.

Figure 13:
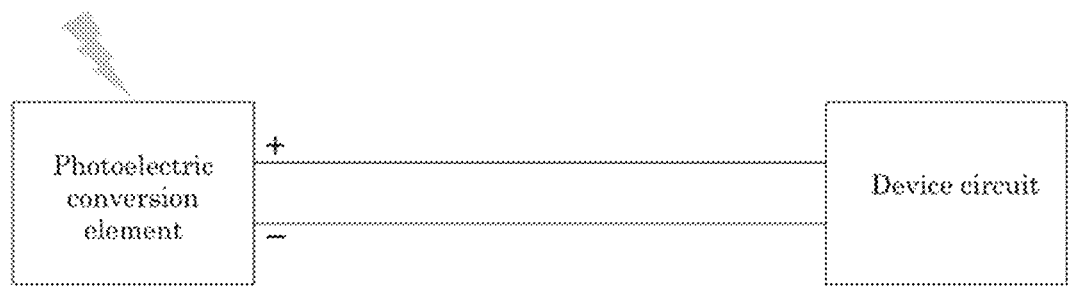
FIG. 13 is a schematic view presenting one example of an electronic device obtained by combining the photoelectric conversion element and/or the photoelectric conversion module of the present disclosure with a device configured to be driven by electric power generated through photoelectric conversion of the photoelectric conversion element and/or the photoelectric conversion module.

FIG. 13 presents a basic configuration diagram of an electronic device obtained by combining the photoelectric conversion element and/or the photoelectric conversion module of the present disclosure with a device configured to be driven by electric power generated through photoelectric conversion of the photoelectric conversion element and/or the photoelectric conversion module. The electronic device can generate electricity when the photoelectric conversion element is irradiated with light, and can extract electric power. A circuit of the device can be driven by the generated electric power.

Figure 14:
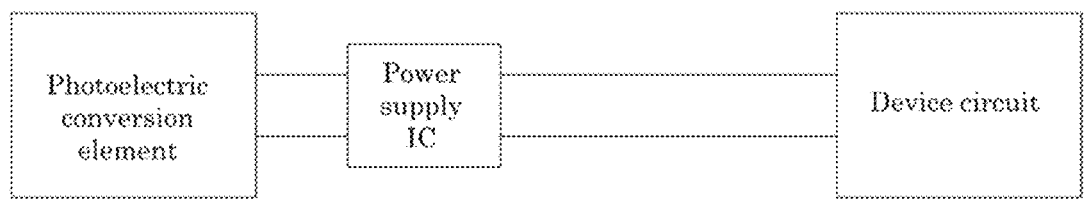
FIG. 14 is a schematic view presenting one example where a power supply IC for a photoelectric conversion element is incorporated between the photoelectric conversion element and the circuit of the device in FIG. 13.

Because the output of the photoelectric conversion element varies depending on circumferential illuminance, the electronic device presented in FIG. 13 may not be stably driven in some cases. In this case, as presented in FIG. 14, a power supply IC for a photoelectric conversion element can be incorporated between the photoelectric conversion element and the circuit of the device in order to supply stable voltage to a side of the circuit, and such arrangement is effective.

Figure 15:
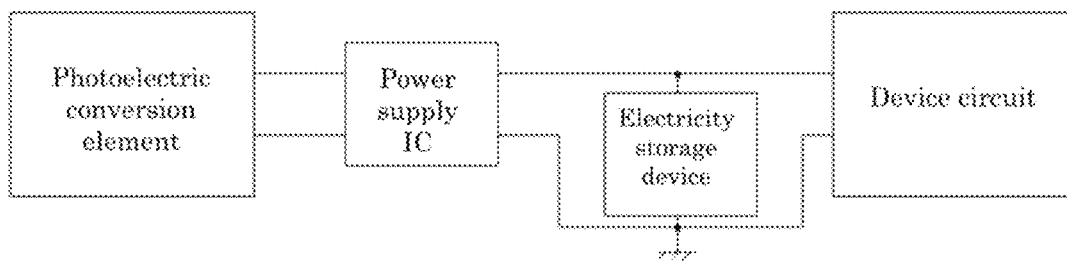
FIG. 15 is a schematic view presenting one example where an electricity storage device is incorporated between the power supply IC and the circuit of the device in FIG. 14.

The photoelectric conversion element can generate electricity so long as light of sufficient illuminance is emitted. However, when illuminance for generating electricity is not enough, desired electric power cannot be obtained, which is a disadvantage of the photoelectric conversion element. In this case, as presented in FIG. 15, when an electricity storage device such as a capacitor is mounted between a power supply IC and a device circuit, excess electric power from the photoelectric conversion element can be stored in the electricity storage device. In addition, the electric power stored in the electricity storage device can be supplied to a device circuit to thereby enable stable operation when the illuminance is too low or even when light is not applied to the photoelectric conversion element.

As described above, the electronic device obtained by combining the photoelectric conversion element and/or the photoelectric conversion module of the present disclosure with the device circuit can be driven even in an environment without a power supply, does not require replacement of a cell, and can be stably driven by combination with a power supply IC or an electricity storage device. Therefore, it is possible to make the most of advantages of the photoelectric conversion element.

Meanwhile, the photoelectric conversion element and/or the photoelectric conversion module of the present disclosure can also be used as a power supply module, and such use is effective. As presented in FIG. 16, for example, when the photoelectric conversion element and/or the photoelectric conversion module of the present disclosure are coupled to a power supply IC for a photoelectric conversion element, it is possible to constitute a DC power supply module capable of supplying electric power generated through photoelectric conversion of the photoelectric conversion element to the power supply IC at a predetermined voltage level.

Figure 17:
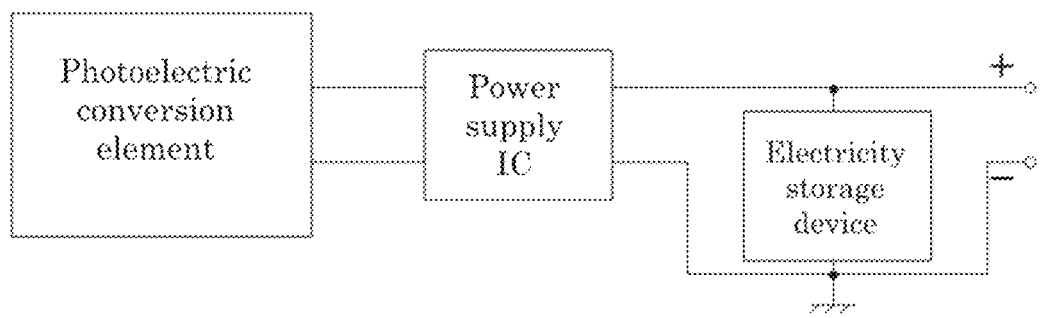
FIG. 17 is a schematic view presenting one example of a power supply module obtained by adding the electricity storage device to the power supply IC in FIG. 16.

Moreover, as presented in FIG. 17, when an electricity storage device is added to a power supply IC, electric power generated by the photoelectric conversion element can be stored in the electricity storage device. Therefore, a power supply module to which electric power can be supplied can be constituted when the illuminance is too low or even when light is not applied to the photoelectric conversion element.

Figure 16:
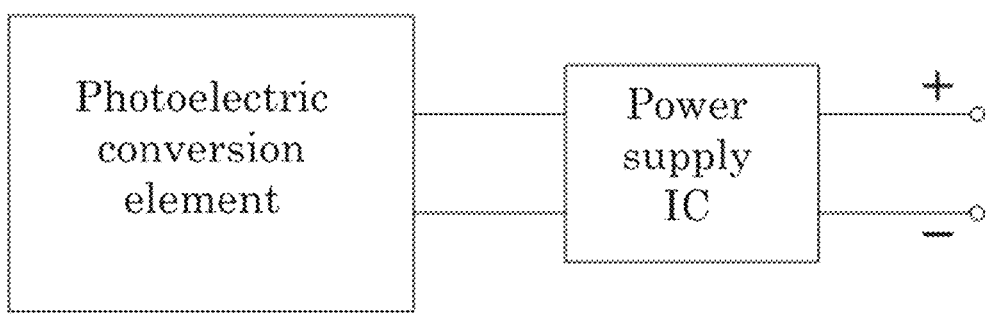
FIG. 16 is a schematic view presenting one example of a power supply module including the photoelectric conversion element and/or the photoelectric conversion module of the present disclosure and a power supply IC.

The power supply modules of the present disclosure presented in FIG. 16 and FIG. 17 can be used as a power supply module without replacement of a cell as in case of primary cells known in the art.

(Photoelectric Conversion Module)

A photoelectric conversion module of the present disclosure includes a plurality of the photoelectric conversion elements of the present disclosure, and includes other members if necessary.

In a first photoelectric conversion element and a second photoelectric conversion element adjacent to each other among the plurality of the photoelectric conversion elements, the third electrode of the first photoelectric conversion element is electrically coupled to the first electrode of the second photoelectric conversion element. For example, the third electrode of the first photoelectric conversion element is integrated with the first electrode of the second photoelectric conversion element.

Generally, in the photoelectric conversion module, one substrate often serves as substrates in a plurality of photoelectric conversion elements.

Examples of the photoelectric conversion module include configurations in which the plurality of the photoelectric conversion elements are coupled in series or in parallel.

The photoelectric conversion module may have a configuration that includes a pair of substrates, the photoelectric conversion element-disposed region between the pair of substrates, and the sealing member sandwiched between the pair of substrates.

The other members are not particularly limited and may be appropriately selected depending on the intended purpose. Examples of the other members include moisture-proofing back sheets and glass plates.

Here, one example of electrical connection between adjacent photoelectric conversion elements in the photoelectric conversion module will be described with reference to FIG. 18A and FIG. 18B.

Figure 18A:
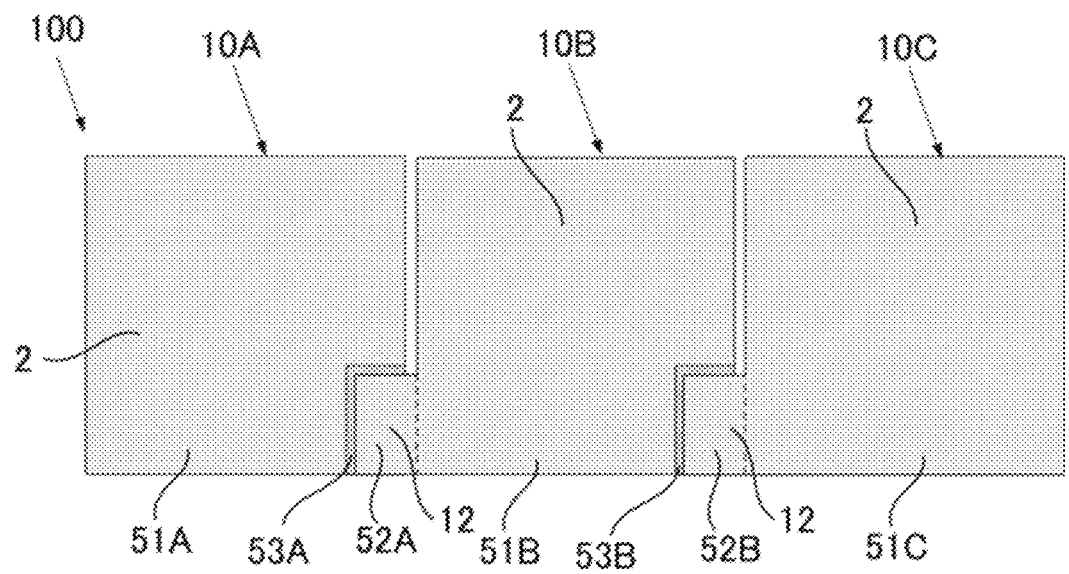
FIG. 18A is a view presenting one example of a photoelectric conversion module (part 1)

FIG. 18A is a view of a photoelectric conversion module 100 as seen from a side of a substrate. For the sake of explanation, the substrate is omitted and a first electrode 2 is illustrated.

Figure 18B:
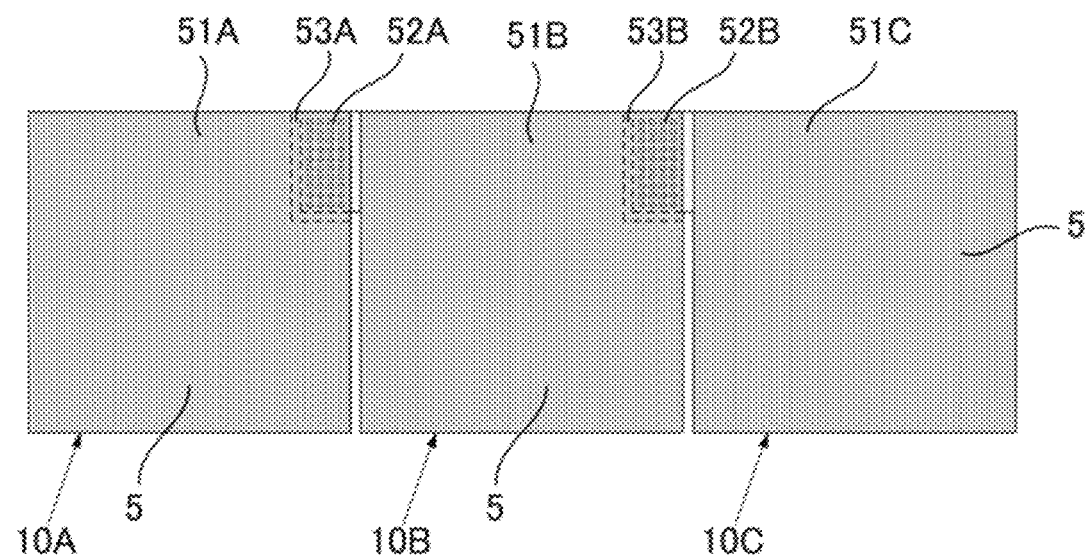
FIG. 18B is a view presenting one example of a photoelectric conversion module (part 2)

FIG. 18B is a view of the photoelectric conversion module 100 as seen from a side of a second electrode 5. FIG. 18B is a view in which the photoelectric conversion module 100 of FIG. 18A is flipped over in the vertical direction.

The photoelectric conversion module 100 includes three photoelectric conversion elements (a first photoelectric conversion element 10A, a second photoelectric conversion element 10B, and a third photoelectric conversion element 10C).

The first photoelectric conversion element 10A includes a photoelectric conversion part 51A, an electrode contact part 52A, and a division part 53A.

The second photoelectric conversion element 10B includes a photoelectric conversion part 51B, an electrode contact part 52B, and a division part 53B.

The third photoelectric conversion element 10C includes a photoelectric conversion part 51C.

A third electrode 12 of the electrode contact part 52A of the first photoelectric conversion element 10A is integrated with the first electrode 2 of the second photoelectric conversion element 10B.

The third electrode 12 of the electrode contact part 52B of the second photoelectric conversion element 10B is integrated with the first electrode 2 of the third photoelectric conversion element 10C.

In the first photoelectric conversion element 10A, the second electrode 5 extends over the photoelectric conversion part 51A, the division part 53A, and the electrode contact part 52A.

In the second photoelectric conversion element 10B, the second electrode 5 extends over the photoelectric conversion part 51B, the division part 53B, and the electrode contact part 52B.

The first electrode 2 and the third electrode 12 of the three photoelectric conversion elements can be produced by patterning, through photolithography, a transparent conductive layer of one substrate on which the transparent conductive layer has been formed. The first electrode 2 and the third electrode 12 can be produced by other methods such as the sand blasting method, the water blasting method, the polishing method, the chemical etching method, the laser processing method. Among them, the laser processing method is preferable. This method makes it possible to integrate the third electrode 12 of the electrode contact part 52A of the first photoelectric conversion element 10A with the first electrode 2 of the second photoelectric conversion element 10B.

The photoelectric conversion layers in the photoelectric conversion module are extended to each other and may be integrated between the photoelectric conversion elements adjacent to each other. Preferably, the electron-transporting layers or the hole-transporting layers are extended to each other and are integrated. More preferably the photoelectric conversion layers are not extended to each other.

When the photoelectric conversion layers, the electron-transporting layers, or the hole-transporting layers are extended to each other and are integrated, a minimum distance between the adjacent photoelectric conversion elements is preferably 10 μm or more, more preferably 30 μm or more, still more preferably 100 μm or more. Here, the minimum distance between the adjacent photoelectric conversion elements is the shortest distance of a distance between first electrodes and a distance between second electrodes in the adjacent photoelectric conversion elements.

When the photoelectric conversion layers are not extended to each other, the minimum distance between the adjacent photoelectric conversion elements is not particularly limited, and the adjacent photoelectric conversion elements may have any distance.

When the aforementioned preferable range is satisfied, an electric resistance between the adjacent photoelectric conversion elements is sufficiently high. Therefore, leakage current flowing between the adjacent photoelectric conversion elements can be suppressed, to obtain high photoelectric conversion characteristics. Suppression of leakage current is advantageous in improving photoelectric conversion characteristics in, particularly, a low illuminance.

Figure 19A:
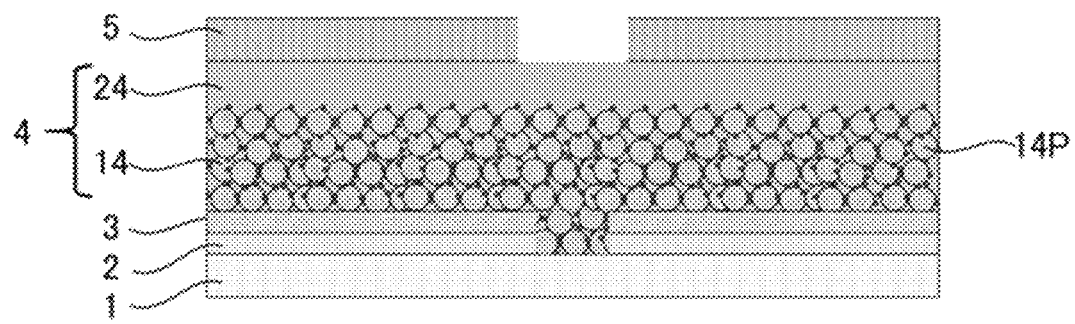
FIG. 19A is a cross-sectional schematic view presenting one example of photoelectric conversion elements adjacent to each other in a photoelectric conversion module.

FIG. 19A is a cross-sectional schematic view presenting one example of photoelectric conversion elements adjacent to each other in a photoelectric conversion module.

Figure 19B:
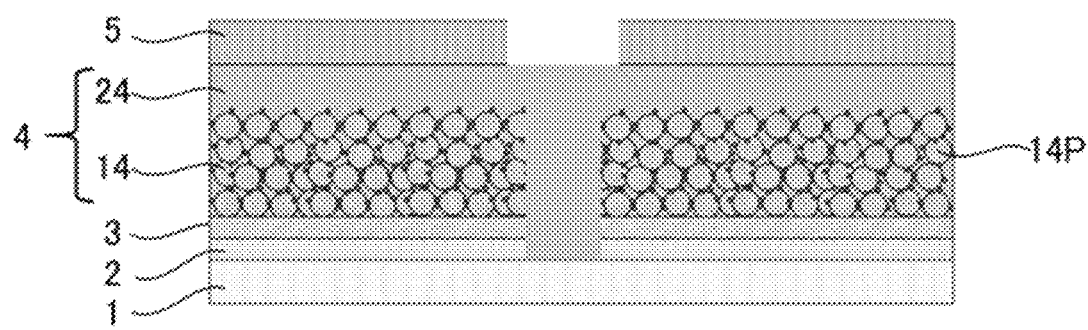
FIG. 19B is a cross-sectional schematic view presenting one example of a photoelectric conversion module where electron-transporting layers and/or hole-transporting layers are not extended to each other between photoelectric conversion elements adjacent to each other.
Figure 19C:
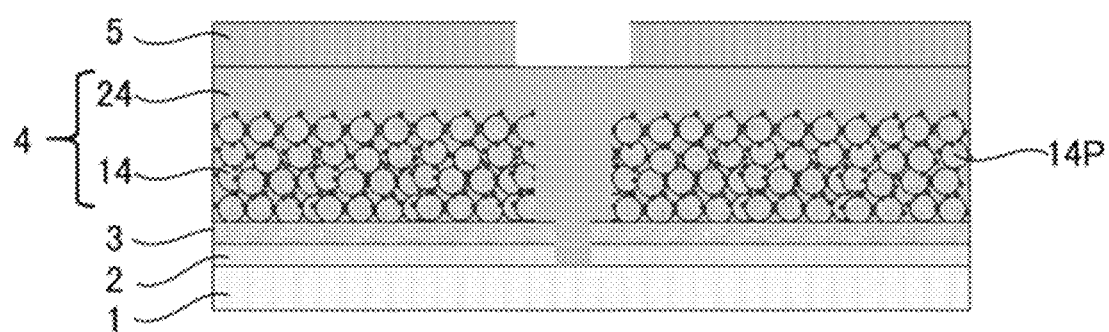
FIG. 19C is a cross-sectional schematic view presenting another example of a photoelectric conversion module where electron-transporting layers and/or hole-transporting layers are not extended to each other between photoelectric conversion elements adjacent to each other.
Figure 19D:
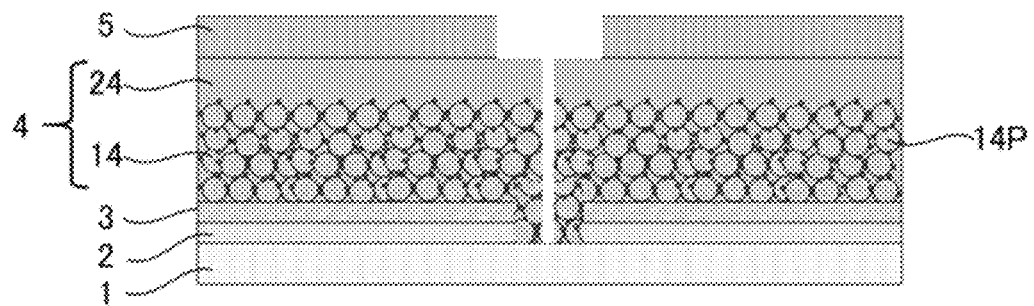
FIG. 19D is a cross-sectional schematic view presenting one example of a photoelectric conversion module where photoelectric conversion layers are not extended to each other between photoelectric conversion elements adjacent to each other.
Figure 19E:
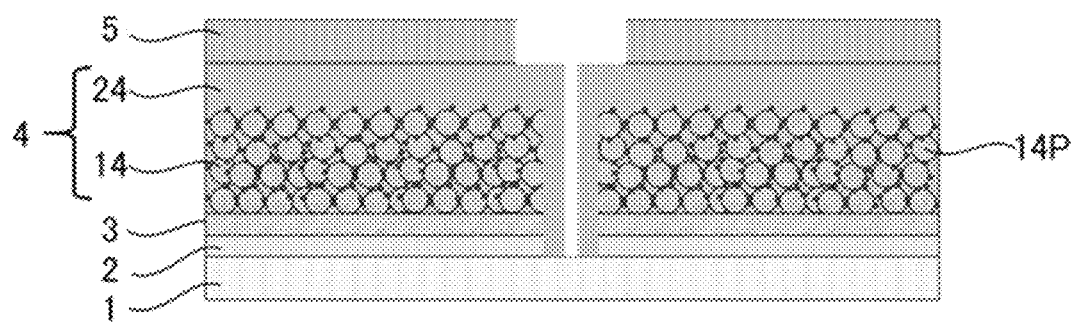
FIG. 19E is a cross-sectional schematic view presenting another example of a photoelectric conversion module where photoelectric conversion layers are not extended to each other between photoelectric conversion elements adjacent to each other.
Figure 19F:
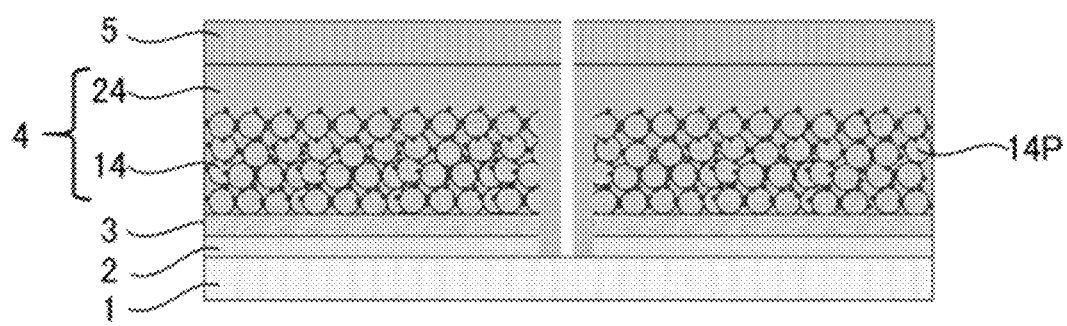
FIG. 19F is a cross-sectional schematic view presenting another example of a photoelectric conversion module where photoelectric conversion layers are not extended to each other between photoelectric conversion elements adjacent to each other.
Figure 19G:
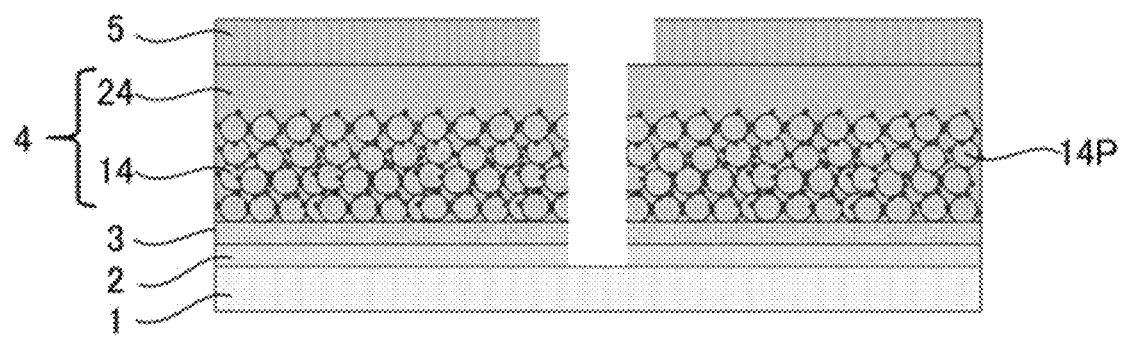
FIG. 19G is a cross-sectional schematic view presenting another example of a photoelectric conversion module where photoelectric conversion layers are not extended to each other between photoelectric conversion elements adjacent to each other.
Figure 19H:
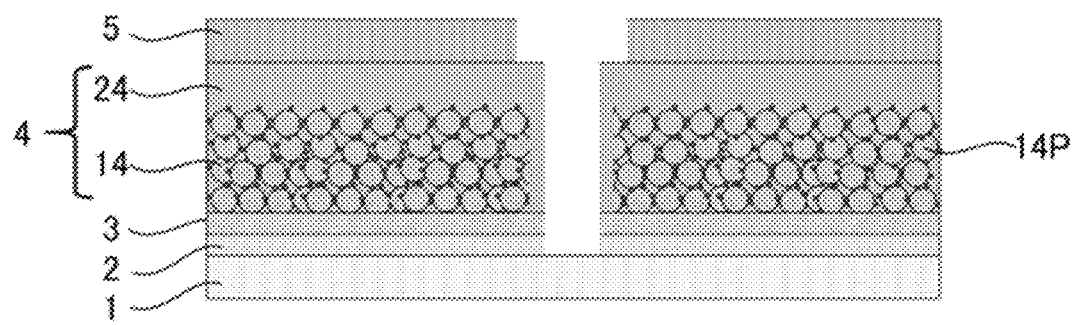
FIG. 19H is a cross-sectional schematic view presenting another example of a photoelectric conversion module where photoelectric conversion layers are not extended to each other between photoelectric conversion elements adjacent to each other.

FIG. 19B and FIG. 19C are a cross-sectional schematic view presenting one example of a photoelectric conversion module where electron-transporting layers and/or hole-transporting layers are not extended to each other between photoelectric conversion elements adjacent to each other.

FIG. 19D to FIG. 19K are each a cross-sectional schematic view presenting one example of a photoelectric conversion module where photoelectric conversion layers are not extended to each other between photoelectric conversion elements adjacent to each other.

EXAMPLES

Hereinafter, the present disclosure will be described by way of Examples and Comparative Examples. Note that, the present disclosure should not be construed as being limited to these exemplified Examples.

Examples 1 to 14

<Production of Photoelectric Conversion Element>

On a glass substrate as a first substrate, indium-doped tin oxide (ITO) and niobium-doped tin oxide (NTO) were sequentially subjected to sputtering for film formation to obtain, as a first electrode, an ITO-coated glass, which was an ITO conductive film. On the ITO-coated glass, a compact layer formed of titanium oxide as a hole blocking layer was formed through reactive sputtering with oxygen gas (average thickness of the ITO conductive film: 250 μm).

Next, the ITO conductive film and the hole blocking layer were partially subjected to impact peeling by irradiation of laser. The position to which laser is applied corresponded to a place where a division part would be formed.

The laser apparatus used was a laser patterning apparatus obtained from SEISHIN TRADING CO., Ltd, and the oscillator was a THG (Third Harmonic Generation) oscillator. The output was 9.0 μJ and the wavelength was 355 nm. Processing patterns could be optionally set by controlling the processing frequency, processing speed, and processing pitch of the laser patterning apparatus. The division part was processed so as to have a length, a long axis, and a short axis described in Table 2-1 and Table 2-2.

Next, titanium oxide (product name: P90, obtained from NIPPON AEROSIL CO., LTD.) (3 g), acetyl acetone (0.2 g), and polyoxyethylene octylphenyl ether (obtained from Wako Pure Chemical Industries, Ltd.) (0.3 g) as a surfactant were subjected to a bead mill treatment for 12 hours together with water (5.5 g) and ethanol (1.0 g) to prepare a titanium oxide dispersion liquid. Polyethylene glycol (product name: polyethylene glycol 20,000, obtained from Wako Pure Chemical Industries, Ltd.) (1.2 g) was added to the prepared titanium oxide dispersion liquid to prepare a paste. The prepared paste was coated on the hole blocking layer (average thickness: 1.5 μm), dried at 50° C., and baked in the air at 500° C. for 30 minutes to form a porous electron-transporting layer.

The glass substrate on which the electron-transporting layer had been formed was immersed in an acetonitrile/t-butanol (volume ratio of 1:1) solution of a photosensitization compound expressed by the following Structural Formula (A) (product name: DN455, obtained from Chemicrea Inc.) (0.2 mM) and chenodeoxycholic acid (CDCA, obtained from Tokyo Chemical Industry Co., Ltd.) (0.4 mM). The resultant was left to stand for 1 hour in the dark to adsorb the photosensitization compound on the surface of the electron-transporting layer.

Structural Formula (A)

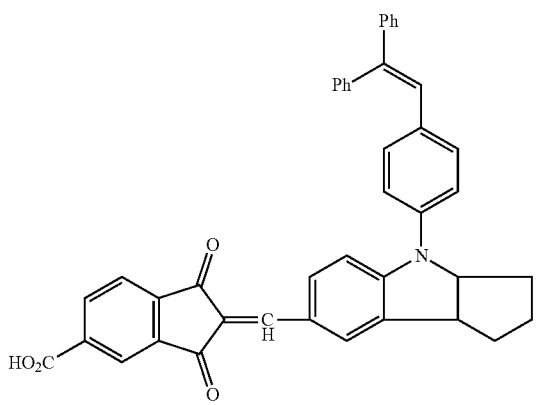

Here, "Ph" represents a phenyl group.

To a chlorobenzene solution (1 mL) of a hole-transporting material expressed by the D-7 (obtained from Merck) (246.5 mg), lithium bis(trifluoromethanesulfonyl)imide (product name: LiTFSI, obtained from Tokyo Chemical Industry Co., Ltd.) (37.0 mg) as an additive and a basic compound expressed by the C-1 (37.5 mg) were added and dissolved to prepare a hole-transporting layer coating liquid.

On the electron-transporting layer to which the photosensitization compound was adsorbed, the hole-transporting layer coating liquid was used to form a hole-transporting layer through spin coating (average thickness: 600 nm).

Next, in order to form an electrode contact part, a plurality of through holes, which reached, from the hole-transporting layer, the surface of the ITO conductive film or the surface of the substrate, were formed. The through holes were formed by irradiation of laser.

In Table 2-1 and Table 2-2, the description of the through holes "to ITO conductive film" means that through holes that reached the surface of the substrate were formed, and the description of the through holes "to hole blocking layer" means that through holes that reached the surface of the ITO conductive film were formed.

The laser apparatus used was a laser patterning apparatus obtained from SEISHIN TRADING CO., Ltd. The dot diameter, processing pitch, and processing distance were as described in Table 2-1 and Table 2-2.

When the dot diameter was 0.05 mm and the pitch was 0.045 mm, dots were overlapped. Therefore, the through holes had such a shape as described in FIG. 3. When the dot diameter was 0.05 mm and the pitch was 0.06 mm, dots were not overlapped. Therefore, a plurality of circular through holes were formed.

In Examples 1 and 2, irradiation of laser was applied on the third electrode and from the division part to the electron-transporting layer and the hole-transporting layer, to perform impact peeling to be removed.

Then, silver was deposited on the hole-transporting layer under vacuum, and a second electrode (average thickness: 100 nm) was formed to produce a photoelectric conversion element.

After formation of the second electrode, an epoxy resin (ultraviolet-ray-curable epoxy resin, product name: WorldRock No. 5910, obtained from Kyoritsu Chemical & Co., Ltd.) as a sealing member was coated using a screen printer (obtained from Micro-tec Co., Ltd.). A structure in the width direction can be adjusted by a printing pattern design of a screen printing plate (obtained from SONOCOM).

Then, nitrogen gas was introduced into a glove box, and the resultant was transferred thereto. A cover glass as a second substrate was placed on the sealing member and the sealing member was cured by irradiation of ultraviolet rays. Then, the power generation region was sealed to produce the respective photoelectric conversion elements of Examples 1 to 14.

The power generation characteristics in the obtained photoelectric conversion elements of Examples 1 to 14 were presented in Table 2-1 and Table 2-2.

The area of through holes S11 and the contact area S1 were observed and measured using a scanning electron microscope (SEM) (obtained from Hitachi High-Technologies Corporation).

<Initial Maximum Output Power (Pmax1), and Linearity (Pmax2/Pmax1)>

Each of the produced photoelectric conversion elements was evaluated for IV characteristics using a solar cell evaluation system (DC voltage-current source/monitor, 6241A, obtained from ADC CORPORATION) under irradiation of white LED adjusted to 200 1x, to determine the initial maximum output power Pmax1 (μW/cm$^2$).

Next, each of the produced photoelectric conversion elements was evaluated for IV characteristics using a solar cell evaluation system (DC voltage-current source/monitor, 6241A, obtained from ADC CORPORATION) under irradiation of white LED adjusted to 20,0001x, to determine the initial maximum output power Pmax2 (μW/cm$^2$).

By dividing the obtained Pmax2 by Pmax1 as the initial value, "linearity" (Pmax2/Pmax1) relative to the 100-fold illuminance was determined.

When the (Pmax2/Pmax1) is from 80% through 120%, a photoelectric conversion element can be said to have a linearity.

TABLE 2-1

|  |  | Ex. 1 | Ex. 2 | Ex. 3 | Ex. 4 | Ex. 5 | Ex. 6 | Ex. 7 |
|---|---|---|---|---|---|---|---|---|
| Form |  | Single cell | Single cell | Single cell | Single cell | Single cell | Single cell | Single cell |
| Second electrode | Long axis (mm) | 77.98 | 26.18 | 26.18 | 26.18 | 77.98 | 13.60 | 77.98 |
|  | Short axis (mm) | 48.40 | 24.60 | 24.60 | 24.60 | 48.40 | 13.28 | 48.40 |
|  | Area ($mm^2$) | 3774.23 | 644.03 | 644.03 | 644.03 | 3774.23 | 180.61 | 3774.23 |
| Third electrode | Long axis (mm) | 2.75 | 1.04 | 1.04 | 1.04 | 2.75 | 0.37 | 2.75 |
|  | Short axis (mm) | 0.51 | 0.37 | 0.37 | 0.37 | 0.51 | 0.37 | 0.51 |
|  | Area ($mm^2$) | 1.40 | 0.38 | 0.38 | 0.38 | 1.40 | 0.14 | 1.40 |
| Division part | Length in long axis direction (mm) | 0.10 | 0.10 | 0.10 | 0.20 | 0.20 | 0.20 | 0.20 |
|  | Length in short axis direction (mm) | 0.10 | 0.10 | 0.10 | 0.20 | 0.20 | 0.20 | 0.20 |
| Photoelectric conversion part S2 | Area ($mm^2$) | 3772.49 | 643.49 | 643.49 | 643.32 | 3772.14 | 180.28 | 3772.14 |
| Electrode contact part | Through holes | To ITO conductive film | To ITO conductive film | To ITO conductive film | To ITO conductive film | To ITO conductive film | To ITO conductive film | To hole blocking layer |
|  | Dot diameter (mm) | 0.05 | 0.05 | 0.05 | 0.05 | 0.05 | 0.05 | 0.05 |
|  | Pitch (mm) | 0.045 | 0.045 | 0.045 | 0.045 | 0.045 | 0.045 | 0.045 |
|  | Long axis dot formation distance (mm) | 2.70 | 0.99 | 0.99 | 0.99 | 2.70 | 0.27 | 2.70 |
|  | Short axis dot formation distance (mm) | 0.41 | 0.27 | 0.27 | 0.27 | 0.41 | 0.27 | 0.41 |
|  | Area of through holes S11 ($mm^2$) | 1.32E−01 | 5.49E−02 | 5.49E−02 | 5.49E−02 | 1.32E−01 | 2.46E−02 | 1.32E−01 |
|  | Area of contact part S1 ($mm^2$) | 1.97E−03 | 8.23E−04 | 8.23E−04 | 8.23E−04 | 1.97E−03 | 3.75E−04 | 1.32E−01 |
| 100 × (S11/S2) |  | 3.51E−03 | 8.53E−03 | 8.53E−03 | 8.53E−03 | 3.51E−03 | 1.37E−02 | 3.51E−03 |
| 100 × (S1/S2) |  | 5.22E−05 | 1.28E−04 | 1.28E−04 | 1.28E−04 | 5.22E−05 | 2.08E−04 | 3.51E−03 |
| Whether photoelectric conversion layer extends |  | Not extend | Not extend | Extend | Extend | Extend | Extend | Extend |
| Power generation capacity | Pmax1 ($\mu W/cm^2$) | 6.00 | 7.19 | 7.79 | 8.63 | 7.20 | 8.62 | 8.76 |
|  | Pmax2 ($\mu W/cm^2$) | 480.38 | 648.90 | 720.90 | 831.98 | 669.95 | 832.26 | 851.00 |
| Linearity | Pmax2/Pmax1 | 80.1 | 90.2 | 92.5 | 96.4 | 93.1 | 96.5 | 97.2 |

In Table 2-1, Table 2-2, Table 3-1, Table 3-2, and Table 4, "E" denotes an exponent of 10. That is, "E-01" denotes "0.1".

In Table 2-1, Table 2-2, Table 3-1, Table 3-2, and Table 4, the unit of values (Pmax2/Pmax1) is "%".

In Table 2-1, Table 2-2, Table 3-1, Table 3-2, and Table 4, the "Extend" in the item: "Whether photoelectric conversion layer extends" means that the photoelectric conversion layer extended in the electrode contact part via the division part, and, in the electrode contact part, the second electrode was in contact with the third electrode that penetrated the photoelectric conversion layer extending in the electrode contact part. The "Not extend" means that the photoelectric conversion layer did not extend in the electrode contact part.

TABLE 2-2

|  |  | Ex. 8 | Ex. 9 | Ex. 10 | Ex. 11 | Ex. 12 | Ex. 13 | Ex. 14 |
|---|---|---|---|---|---|---|---|---|
| Form |  | Single cell | Single cell | Single cell | Single cell | Single cell | Single cell | Single cell |
| Second electrode | Long axis (mm) | 26.18 | 13.60 | 13.60 | 13.60 | 13.60 | 13.60 | 13.60 |
|  | Short axis (mm) | 24.60 | 13.28 | 13.28 | 13.28 | 13.28 | 13.28 | 13.28 |
|  | Area ($mm^2$) | 644.03 | 180.61 | 180.61 | 180.61 | 180.61 | 180.61 | 180.61 |
| Third electrode | Long axis (mm) | 1.04 | 0.37 | 10.12 | 10.12 | 7.12 | 7.12 | 7.12 |
|  | Short axis (mm) | 0.37 | 0.37 | 1.60 | 1.12 | 1.12 | 0.70 | 0.70 |
|  | Area ($mm^2$) | 0.38 | 0.14 | 16.19 | 11.33 | 7.97 | 4.98 | 4.98 |
| Division part | Length in long axis direction (mm) | 0.20 | 0.20 | 0.20 | 0.20 | 0.20 | 0.20 | 0.30 |
|  | Length in short axis direction (mm) | 0.20 | 0.20 | 0.20 | 0.20 | 0.20 | 0.20 | 0.30 |
| Photoelectric conversion part S2 | Area ($mm^2$) | 643.32 | 180.28 | 162.03 | 166.99 | 170.95 | 174.02 | 173.19 |
| Electrode contact part | Through holes | To hole blocking layer | To hole blocking layer | To hole blocking layer | To hole blocking layer | To hole blocking layer | To hole blocking layer | To hole blocking layer |
|  | Dot diameter (mm) | 0.05 | 0.05 | 0.05 | 0.05 | 0.05 | 0.05 | 0.05 |
|  | Pitch (mm) | 0.045 | 0.045 | 0.06 | 0.06 | 0.06 | 0.06 | 0.06 |
|  | Long axis dot formation distance (mm) | 0.99 | 0.27 | 10.02 | 10.02 | 7.02 | 7.02 | 7.02 |
|  | Short axis dot formation distance (mm) | 0.27 | 0.27 | 1.50 | 1.02 | 1.02 | 0.60 | 0.60 |
|  | Area of through holes S11 ($mm^2$) | 5.49E−02 | 2.46E−02 | 8.58 | 5.94 | 4.17 | 2.55 | 2.55 |
|  | Area of contact part S1 ($mm^2$) | 5.49E−02 | 2.46E−02 | 8.58 | 5.94 | 4.17 | 2.55 | 2.55 |

TABLE 2-2-continued

|  | | Ex. 8 | Ex. 9 | Ex. 10 | Ex. 11 | Ex. 12 | Ex. 13 | Ex. 14 |
|---|---|---|---|---|---|---|---|---|
| 100 × (S11/S2) | | 8.53E−03 | 1.37E−02 | 5.29 | 3.56 | 2.44 | 1.46 | 1.47 |
| 100 × (S1/S2) | | 8.53E−03 | 1.37E−02 | 5.29 | 3.56 | 2.44 | 1.46 | 1.47 |
| Whether photoelectric conversion layer extends | | Extend | Extend | Extend | Extend | Extend | Extend | Extend |
| Power generation capacity | Pmax1 ($\mu$W/cm$^2$) | 8.75 | 8.86 | 8.07 | 8.32 | 8.52 | 8.67 | 8.63 |
|  | Pmax2 ($\mu$W/cm$^2$) | 854.91 | 875.77 | 803.40 | 830.45 | 848.44 | 865.44 | 861.30 |
| Linearity | Pmax2/Pmax1 | 97.7 | 98.8 | 99.5 | 99.8 | 99.6 | 99.8 | 99.8 |

Examples 15 to 23

As exemplified in FIG. 18A and FIG. 18B, the ITO conductive film as the first electrode was subjected to laser etching using a laser apparatus, to form a 8-cell series substrate. After formation of the hole-transporting layer, through holes for coupling photoelectric conversion elements in series were formed through laser processing.

At this time, as exemplified in FIG. 19C, the porous titanium oxide layer was subjected to laser etching together with the ITO conductive film. Processing was performed so that an average distance between the adjacent ITO conductive films would be 30 μm.

The laser apparatus used was a laser patterning apparatus obtained from SEISHIN TRADING CO., Ltd. The dot diameter, processing pitch, and processing distance were as described in Table 3-1 and Table 3-2.

Then, photoelectric conversion modules were produced in the same manner as in Examples 4 to 13 except that a patterned mask was used to deposit silver on the hole-transporting layer under vacuum so that a 8-cell series arrangement would be made, to form a second electrode (average thickness: 100 nm). At this time, an average distance between the adjacent silver electrodes was set to be 200 μm.

The (Pmax2/Pmax1) was determined in the same manner as in Example 1. Results are presented in Table 3-1 and Table 3-2.

Example 24

As exemplified in FIG. 19A, a photoelectric conversion module was produced in the same manner as in Example 20 except that the porous titanium oxide layer was not subjected to laser etching and the photoelectric conversion layers between the adjacent photoelectric conversion elements extended to each other.

The (Pmax2/Pmax1) was determined in the same manner as in Example 1. Results are presented in Table 3-2.

Example 25

Figure 19I:
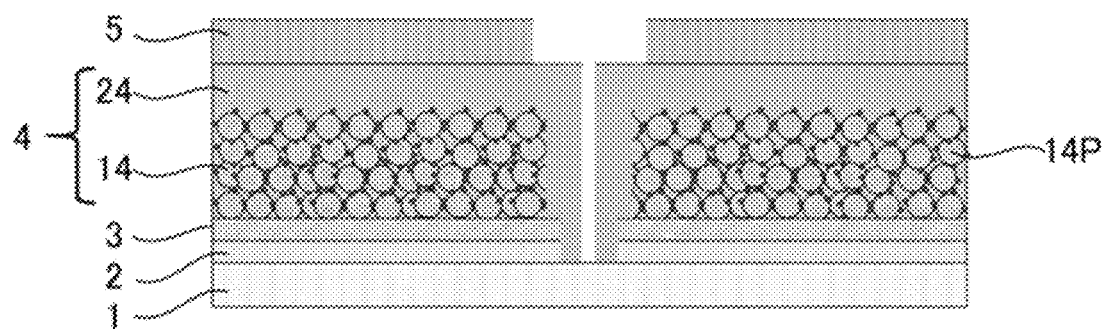
FIG. 19I is a cross-sectional schematic view presenting another example of a photoelectric conversion module where photoelectric conversion layers are not extended to each other between photoelectric conversion elements adjacent to each other.
Figure 19J:
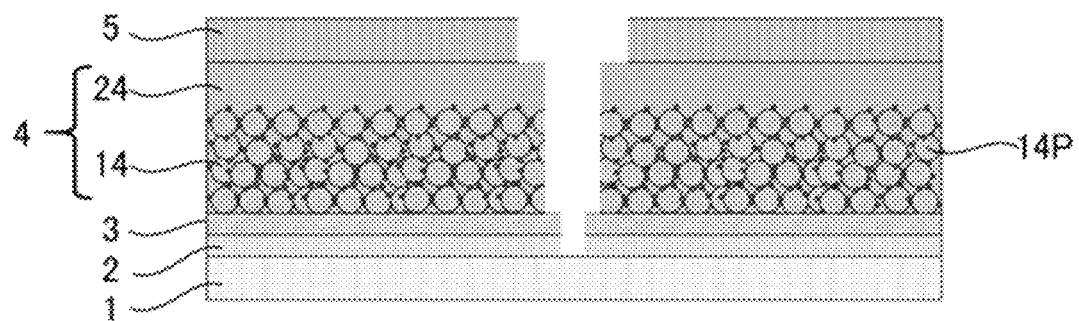
FIG. 19J is a cross-sectional schematic view presenting another example of a photoelectric conversion module where photoelectric conversion layers are not extended to each other between photoelectric conversion elements adjacent to each other.
Figure 19K:
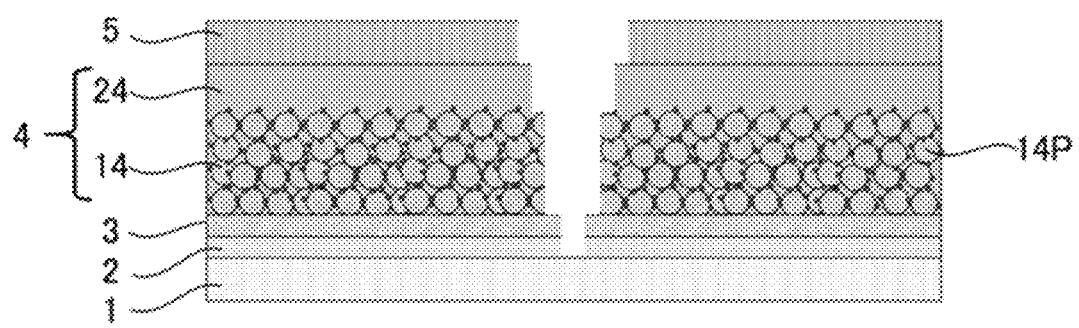
FIG. 19K is a cross-sectional schematic view presenting another example of a photoelectric conversion module where photoelectric conversion layers are not extended to each other between photoelectric conversion elements adjacent to each other.

As exemplified in FIG. 19I, a photoelectric conversion module was produced in the same manner as in Example 20 except that the porous titanium oxide layer was subjected to laser etching together with the ITO conductive film; the hole-transporting layer was subjected to laser etching after formation of the hole-transporting layer; and an average distance of the adjacent ITO conductive films was set to 30 μm.

The (Pmax2/Pmax1) was determined in the same manner as in Example 1. Results are presented in Table 3-2.

TABLE 3-1

|  |  | Ex. 15 | Ex. 16 | Ex. 17 | Ex. 18 | Ex. 19 |
|---|---|---|---|---|---|---|
| Form |  | 8-cell series module | 8-cell series module | 8-cell series module | 8-cell series module | 8-cell series module |
| Second electrode per one cell | Long axis (mm) | 24.10 | 12.20 | 6.70 | 24.10 | 12.20 |
|  | Short axis (mm) | 19.35 | 6.40 | 3.17 | 19.35 | 6.40 |
|  | Area (mm$^2$) | 466.21 | 78.02 | 21.24 | 466.21 | 78.02 |
| Third electrode per one cell | Long axis (mm) | 2.75 | 1.04 | 0.37 | 2.75 | 1.07 |
|  | Short axis (mm) | 0.51 | 0.37 | 0.37 | 0.52 | 0.40 |
|  | Area (mm$^2$) | 1.40 | 0.38 | 0.14 | 1.43 | 0.43 |
| Division part per one cell | Length in long axis direction (mm) | 0.20 | 0.20 | 0.20 | 0.20 | 0.20 |
|  | Length in short axis direction (mm) | 0.20 | 0.20 | 0.20 | 0.20 | 0.20 |
| Photoelectric conversion part per one cell S2 | Area (mm$^2$) | 464.12 | 77.31 | 20.91 | 464.09 | 77.26 |
| Electrode contact part per one cell | Through holes | To ITO conductive film | To ITO conductive film | To ITO conductive film | To ITO conductive film | To ITO conductive film |
|  | Dot diameter (mm) | 0.05 | 0.05 | 0.05 | 0.05 | 0.05 |
|  | Pitch (mm) | 0.045 | 0.045 | 0.045 | 0.06 | 0.06 |
|  | Long axis dot formation distance (mm) | 2.70 | 0.99 | 0.27 | 2.70 | 1.02 |
|  | Short axis dot formation distance (mm) | 0.41 | 0.27 | 0.27 | 0.42 | 0.30 |
|  | Area of through holes S11 (mm$^2$) | 1.23 | 0.32 | 0.10 | 0.72 | 0.21 |
|  | Area of contact part S1 (mm$^2$) | 1.97E−03 | 8.23E−04 | 3.75E−04 | 1.45E−02 | 4.24E−03 |

TABLE 3-1-continued

|  |  | Ex. 15 | Ex. 16 | Ex. 17 | Ex. 18 | Ex. 19 |
|---|---|---|---|---|---|---|
| 100 × (S11/S2) | | 0.26 | 0.42 | 0.47 | 0.16 | 0.27 |
| 100 × (S1/S2) | | 4.25E−04 | 1.06E−03 | 1.79E−03 | 3.11E−03 | 5.49E−03 |
| Whether photoelectric conversion layer extends | | Extend | Extend | Extend | Extend | Extend |
| Power generation capacity per one cell | Pmax1 ($\mu W/cm^2$) | 8.60 | 8.68 | 8.63 | 8.72 | 8.67 |
|  | Pmax2 ($\mu W/cm^2$) | 830.90 | 844.63 | 841.90 | 850.21 | 846.63 |
| Linearity | Pmax2/Pmax1 | 96.6 | 97.3 | 97.6 | 97.5 | 97.6 |

TABLE 3-2

|  |  | Ex. 20 | Ex. 21 | Ex. 22 | Ex. 23 | Ex. 24 | Ex. 25 |
|---|---|---|---|---|---|---|---|
| Form | | 8-cell series module | 8-cell series module | 8-cell series module | 8-cell series module | 8-cell series module | 8-cell series module |
| Second electrode per one cell | Long axis (mm) | 6.70 | 24.10 | 12.20 | 6.70 | 6.70 | 6.70 |
|  | Short axis (mm) | 3.17 | 19.35 | 6.40 | 3.17 | 3.17 | 3.17 |
|  | Area (mm$^2$) | 21.24 | 466.21 | 78.02 | 21.24 | 21.24 | 21.24 |
| Third electrode per one cell | Long axis (mm) | 0.40 | 2.75 | 1.04 | 0.37 | 0.40 | 0.40 |
|  | Short axis (mm) | 0.40 | 0.51 | 0.37 | 0.37 | 0.40 | 0.40 |
|  | Area (mm$^2$) | 0.16 | 1.40 | 0.38 | 0.14 | 0.16 | 0.16 |
| Division part per one cell | Length in long axis direction (mm) | 0.20 | 0.20 | 0.20 | 0.20 | 0.20 | 0.20 |
|  | Length in short axis direction (mm) | 0.20 | 0.20 | 0.20 | 0.20 | 0.20 | 0.20 |
| Photoelectric conversion part per one cell S2 | Area (mm$^2$) | 20.88 | 464.12 | 77.31 | 20.91 | 20.88 | 20.88 |
| Electrode contact part per one cell | Through holes | To ITO conductive film | To hole blocking layer | To hole blocking layer | To hole blocking layer | To ITO conductive film | To ITO conductive film |
|  | Dot diameter (mm) | 0.05 | 0.05 | 0.05 | 0.05 | 0.05 | 0.05 |
|  | Pitch (mm) | 0.06 | 0.045 | 0.045 | 0.045 | 0.06 | 0.06 |
|  | Long axis dot formation distance (mm) | 0.30 | 2.70 | 0.99 | 0.27 | 0.30 | 0.30 |
|  | Short axis dot formation distance (mm) | 0.30 | 0.41 | 0.27 | 0.27 | 0.30 | 0.30 |
|  | Area of through holes S11 (mm$^2$) | 0.07 | 1.23 | 0.32 | 0.10 | 0.07 | 0.07 |
|  | Area of contact part S1 (mm$^2$) | 1.41E−03 | 1.23 | 0.32 | 0.10 | 1.41E−03 | 1.41E−03 |
| 100 × (S11/S2) | | 0.34 | 0.26 | 0.42 | 0.47 | 0.34 | 0.34 |
| 100 × (S1/S2) | | 6.77E−03 | 0.26 | 0.42 | 0.47 | 6.77E−03 | 6.77E−03 |
| Whether photoelectric conversion layer extends | | Extend | Extend | Extend | Extend | Extend | Extend |
| Power generation capacity per one cell | Pmax1 ($\mu W/cm^2$) | 8.61 | 8.96 | 8.92 | 8.86 | 8.02 | 8.91 |
|  | Pmax2 ($\mu W/cm^2$) | 842.21 | 887.92 | 883.82 | 879.14 | 782.75 | 874.07 |
| Linearity | Pmax2/Pmax1 | 97.8 | 99.1 | 99.1 | 99.2 | 97.6 | 98.1 |

Comparative Examples 1 and 2

Photoelectric conversion elements are produced in the same manner as in Example 1 except that the dot diameter, processing pitch, and processing distance were changed to those described in Table 4, and the third electrode area was changed to those described in Table 4.

TABLE 4

|  |  | Comp. Ex. 1 | Comp. Ex. 2 |
|---|---|---|---|
| Form | | Single cell | Single cell |
| Second electrode | Long axis (mm) | 77.98 | 77.98 |
|  | Short axis (mm) | 48.40 | 48.40 |
|  | Area (mm$^2$) | 3774.23 | 3774.23 |
| Third electrode | Long axis (mm) | 0.22 | 0.19 |
|  | Short axis (mm) | 0.22 | 0.19 |
|  | Area (mm$^2$) | 0.05 | 0.04 |

TABLE 4-continued

|  |  | Comp. Ex. 1 | Comp. Ex. 2 |
|---|---|---|---|
| Division part | Length in long axis direction (mm) | 0.10 | 0.10 |
|  | Length in short axis direction (mm) | 0.10 | 0.10 |
| Photoelectric conversion part S2 | Area (mm$^2$) | 3774.13 | 3774.15 |
| Electrode contact part | Through holes | To ITO conductive film | To ITO conductive film |
|  | Dot diameter (mm) | 0.05 | 0.05 |
|  | Pitch (mm) | 0.06 | 0.045 |
|  | Long axis dot formation distance (mm) | 0.12 | 0.09 |
|  | Short axis dot formation distance (mm) | 0.12 | 0.09 |
|  | Area of through holes S11 (mm$^2$) | 1.77E−02 | 9.52E−03 |
|  | Area of contact part S1 (mm$^2$) | 3.53E−04 | 1.51E−04 |
| 100 × (S11/S2) |  | 4.68E−04 | 2.52E−04 |
| 100 × (S1/S2) |  | 9.36E−06 | 4.01E−06 |
| Whether photoelectric conversion layer extends |  | Not extend | Not extend |
| Power generation capacity | Pmax1 (μW/cm$^2$) | 4.80 | 4.80 |
|  | Pmax2 (μW/cm$^2$) | 221.75 | 216.48 |
| Linearity | Pmax2/Pmax1 | 46.2 | 45.1 |

Aspects of the present disclosure are as follows, for example.

<1> A photoelectric conversion element including:
a first electrode;
a hole blocking layer;
a photoelectric conversion layer;
a second electrode;
a third electrode;
a photoelectric conversion part in which the first electrode, the hole blocking layer, the photoelectric conversion layer, and the second electrode are stacked;
an electrode contact part in which the second electrode is in contact with the third electrode; and
a division part dividing the photoelectric conversion part and the electrode contact part,
wherein an area (S1) where the second electrode is in contact with the third electrode in the electrode contact part and an area (S2) of the photoelectric conversion part satisfy expression (1) below:

$$1.0 \times 10^{-5} \leq 100 \times (S1/S2) \qquad \text{expression (1).}$$

<2> The photoelectric conversion element according to <1>, wherein the area (S1) and the area (S2) satisfy expression (1-1) below:

$$1.0 \times 10^{-4} \leq 100 \times (S1/S2) \qquad \text{expression (1-1).}$$

<3> The photoelectric conversion element according to <1> or <2>,
wherein the photoelectric conversion layer extends in the electrode contact part via the division part, and
in the electrode contact part, the second electrode penetrates the photoelectric conversion layer extending in the electrode contact part to be in contact with the third electrode.

<4> The photoelectric conversion element according to any one of <1> to <3>,
wherein the photoelectric conversion layer includes an electron-transporting layer and a hole-transporting layer, and
a width from an edge of a side of the photoelectric conversion part through an edge of a side of the electrode contact part in the division part is 100 times or more as large as an average thickness of the electron-transporting layer.

<5> A photoelectric conversion module including a plurality of photoelectric conversion elements each of which is the photoelectric conversion element according to any one of <1> to <4>,
wherein, in a first photoelectric conversion element and a second photoelectric conversion element that are adjacent to each other among the plurality of photoelectric conversion elements, the third electrode of the first photoelectric conversion element is electrically coupled to the first electrode of the second photoelectric conversion element.

<6> The photoelectric conversion module according to <5>,
wherein the third electrode of the first photoelectric conversion element is integrated with the first electrode of the second photoelectric conversion element.

<7> The photoelectric conversion module according to <5> or <6>,
wherein, between the photoelectric conversion elements adjacent to each other, electron-transporting layers are not extended to each other, hole-transporting layers are not extended to each other, or the electron-transporting layers are not extended to each other and the hole-transporting layers are not extended to each other.

<8> The photoelectric conversion module according to <5> or <6>,
wherein, between the photoelectric conversion elements adjacent to each other, photoelectric conversion layers are not extended to each other.

The photoelectric conversion element according to any one of <1> to <4> and the photoelectric conversion module according to any one of <5> to <8> can solve the conventionally existing problems and can achieve the object of the present disclosure.

What is claimed is:
1. A photoelectric conversion element comprising:
a first electrode;
a hole blocking layer;
a photoelectric conversion layer;
a second electrode;

a third electrode, the first electrode and the third electrode being in a same plane surface and not in contact with each other;

a photoelectric converter in which the first electrode, the hole blocking layer, the photoelectric conversion layer, and the second electrode are stacked;

an electrode contact in which the second electrode is in direct contact with the third electrode; and a divider to divide the photoelectric converter and the electrode contact, wherein a total contact area (S1) where the second electrode is in direct contact with the third electrode in the electrode contact and a total area (S2) of a surface of the photoelectric converter contacting the second electrode satisfy expression (1) below:

$$1.0\times10^{-5} \leq 100\times(S1/S2) \qquad \text{expression (1)}.$$

2. The photoelectric conversion element according to claim 1, wherein the area (S1) and the area (S2) satisfy expression (1-1) below:

$$1.0\times10^{-4} 100\times(S1/S2) \qquad \text{expression (1-1)}.$$

3. The photoelectric conversion element according to claim 1, wherein the photoelectric conversion layer extends into the electrode contact via the divider, and in the electrode contact, the second electrode penetrates the photoelectric conversion layer in the electrode contact to be in contact with the third electrode.

4. The photoelectric conversion element according to claim 1, wherein the photoelectric conversion layer includes an electron-transporting layer and a hole-transporting layer, and a width from an edge of a side of the photoelectric converter to an edge of a side of the electrode contact in the divider is 100 times or more as large as an average thickness of the electron-transporting layer.

5. The photoelectric conversion element according to claim 1, wherein the second electrode is recessed inside in the divider.

6. The photoelectric conversion element according to claim 1, wherein the second electrode is recessed inside in a part where the second electrode is in direct contact with the third electrode in the electrode contact.

7. The photoelectric conversion element according to claim 1, further comprising:

a substrate on a side of the first electrode opposite from the photoelectric conversion layer, wherein the second electrode is in direct contact with the substrate in the electrode contact.

8. A photoelectric conversion module including a plurality of photoelectric conversion elements each of which is the photoelectric conversion element according to claim 1, wherein, in a first photoelectric conversion element and a second photoelectric conversion element that are adjacent to each other among the plurality of photoelectric conversion elements, the third electrode of the first photoelectric conversion element is electrically coupled to the first electrode of the second photoelectric conversion element.

9. The photoelectric conversion module according to claim 8, wherein the third electrode of the first photoelectric conversion element is integrated with the first electrode of the second photoelectric conversion element.

10. The photoelectric conversion module according to claim 8, wherein, between the photoelectric conversion elements adjacent to each other, electron-transporting layers from the adjacent photoelectric conversion elements are not extended to each other, hole-transporting layers from the adjacent photoelectric conversion elements are not extended to each other, or the electron-transporting layers from the adjacent photoelectric conversion elements are not extended to each other and the hole-transporting layers from the adjacent photoelectric conversion elements are not extended to each other.

11. The photoelectric conversion module according to claim 8, wherein, between the photoelectric conversion elements adjacent to each other, photoelectric conversion layers from the adjacent photoelectric conversion elements are not extended to each other.

* * * * *